US008263476B2

(12) United States Patent
Ohnuma

(10) Patent No.: US 8,263,476 B2
(45) Date of Patent: Sep. 11, 2012

(54) MANUFACTURING METHOD OF SOI SUBSTRATE

(75) Inventor: Hideto Ohnuma, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 665 days.

(21) Appl. No.: 12/176,617

(22) Filed: Jul. 21, 2008

(65) Prior Publication Data

US 2009/0029525 A1    Jan. 29, 2009

(30) Foreign Application Priority Data

Jul. 23, 2007   (JP) ................................. 2007-190987

(51) Int. Cl.
*H01L 21/30* (2006.01)
(52) U.S. Cl. .. 438/458; 438/455; 438/149; 257/E21.211
(58) Field of Classification Search .................. 438/458
See application file for complete search history.

(56) References Cited

U.S. PATENT DOCUMENTS

| | | | |
|---|---|---|---|
| 5,374,564 A | 12/1994 | Bruel | |
| 5,854,096 A | 12/1998 | Ohtani et al. | |
| 6,127,702 A | 10/2000 | Yamazaki et al. | |
| 6,140,210 A | 10/2000 | Aga et al. | |
| 6,184,068 B1 | 2/2001 | Ohtani et al. | |
| 6,271,101 B1 | 8/2001 | Fukunaga | |
| 6,287,941 B1 | 9/2001 | Kang et al. | |
| 6,306,729 B1 * | 10/2001 | Sakaguchi et al. | 438/458 |
| 6,326,248 B1 | 12/2001 | Ohtani et al. | |
| 6,326,279 B1 | 12/2001 | Kakizaki et al. | |
| 6,335,231 B1 | 1/2002 | Yamazaki et al. | |
| 6,372,609 B1 | 4/2002 | Aga et al. | |
| 6,380,046 B1 | 4/2002 | Yamazaki | |
| 6,388,652 B1 | 5/2002 | Yamazaki et al. | |
| 6,429,095 B1 | 8/2002 | Sakaguchi et al. | |
| 6,486,008 B1 | 11/2002 | Lee | |
| 6,534,380 B1 | 3/2003 | Yamauchi et al. | |
| 6,589,824 B2 | 7/2003 | Ohtani et al. | |
| 6,602,761 B2 | 8/2003 | Fukunaga | |
| 6,653,209 B1 | 11/2003 | Yamagata | |
| 6,686,623 B2 | 2/2004 | Yamazaki | |
| 6,759,277 B1 | 7/2004 | Flores et al. | |
| 6,778,164 B2 | 8/2004 | Yamazaki et al. | |
| 6,803,264 B2 | 10/2004 | Yamazaki et al. | |
| 6,818,529 B2 | 11/2004 | Bachrach et al. | |

(Continued)

FOREIGN PATENT DOCUMENTS

JP          11-163363        6/1999

(Continued)

*Primary Examiner* — Thanh Nguyen
(74) *Attorney, Agent, or Firm* — Fish & Richardson P.C.

(57) ABSTRACT

A manufacturing method of an SOI substrate with high throughput. A semiconductor layer separated from a semiconductor substrate is transferred to a supporting substrate, thereby manufacturing an SOI substrate. First, the semiconductor substrate serving as a base of the semiconductor layer is prepared. An embrittlement layer is formed in a region at a predetermined depth of the semiconductor substrate, and an insulating layer is formed on a surface of the semiconductor substrate. After bonding the semiconductor substrate and a supporting substrate with the insulating layer interposed therebetween, the semiconductor substrate is selectively irradiated with a laser beam; accordingly, embrittlement of the embrittlement layer progresses. Then, using a physical method or heat treatment, the semiconductor substrate is separated; at that time, the region where the embrittlement has progressed in the embrittlement layer serves as a starting point.

12 Claims, 29 Drawing Sheets

U.S. PATENT DOCUMENTS

| | | |
|---|---|---|
| 6,875,633 B2 | 4/2005 | Fukunaga |
| 6,884,694 B2 | 4/2005 | Park et al. |
| 6,919,237 B2 | 7/2005 | Ohtani et al. |
| 7,119,365 B2 | 10/2006 | Takafuji et al. |
| RE39,484 E | 2/2007 | Bruel |
| 7,176,525 B2 | 2/2007 | Fukunaga |
| 7,199,024 B2 | 4/2007 | Yamazaki |
| 7,253,040 B2 | 8/2007 | Itoga et al. |
| 7,256,776 B2 | 8/2007 | Yamazaki et al. |
| 7,351,300 B2 | 4/2008 | Takayama et al. |
| 7,354,844 B2 | 4/2008 | Endo et al. |
| 7,368,790 B2 | 5/2008 | Forbes |
| 7,470,575 B2 | 12/2008 | Ohtani et al. |
| 7,473,971 B2 | 1/2009 | Yamazaki et al. |
| 7,476,576 B2 | 1/2009 | Yamazaki et al. |
| 7,535,053 B2 | 5/2009 | Yamazaki |
| 7,619,250 B2 | 11/2009 | Takafuji et al. |
| 2004/0104424 A1 | 6/2004 | Yamazaki |
| 2004/0238851 A1 | 12/2004 | Flores et al. |
| 2005/0009252 A1 | 1/2005 | Yamazaki et al. |
| 2005/0032283 A1 | 2/2005 | Itoga et al. |
| 2005/0048738 A1* | 3/2005 | Shaheen et al. ............... 438/458 |
| 2006/0121691 A1* | 6/2006 | Noguchi et al. ............... 438/455 |
| 2006/0267152 A1 | 11/2006 | Forbes |
| 2007/0063281 A1 | 3/2007 | Takafuji et al. |
| 2007/0108510 A1 | 5/2007 | Fukunaga |
| 2007/0173000 A1 | 7/2007 | Yamazaki |
| 2007/0184632 A1 | 8/2007 | Yamazaki et al. |
| 2007/0224839 A1 | 9/2007 | Shimizu |
| 2007/0291022 A1 | 12/2007 | Yamazaki et al. |
| 2008/0087629 A1 | 4/2008 | Shimomura et al. |
| 2009/0042356 A1 | 2/2009 | Takayama et al. |
| 2009/0075460 A1 | 3/2009 | Ohtani et al. |
| 2009/0170286 A1 | 7/2009 | Tsukamoto et al. |
| 2010/0291754 A1 | 11/2010 | Koyama et al. |

FOREIGN PATENT DOCUMENTS

| | | |
|---|---|---|
| JP | 11-163363 A | 6/1999 |
| JP | 2000-124092 | 4/2000 |
| JP | 2003-282885 | 10/2003 |

* cited by examiner

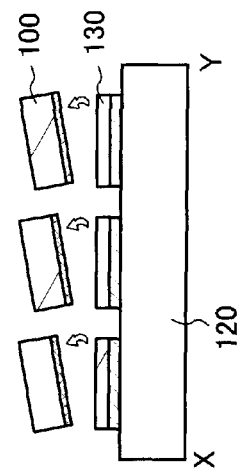
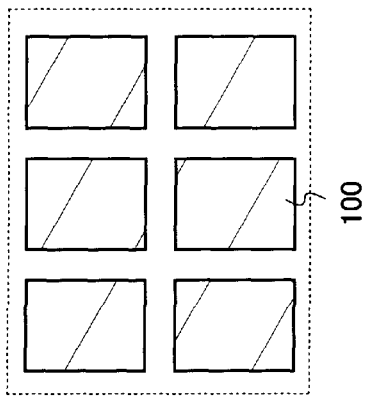
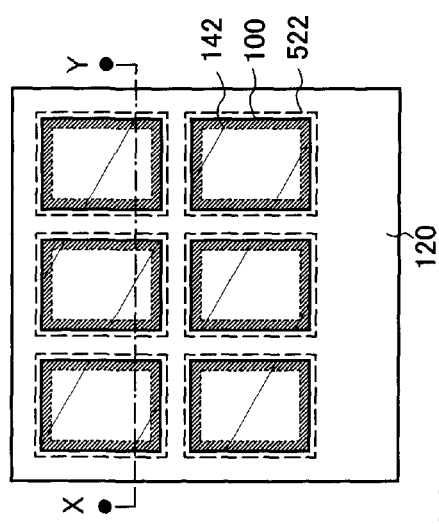
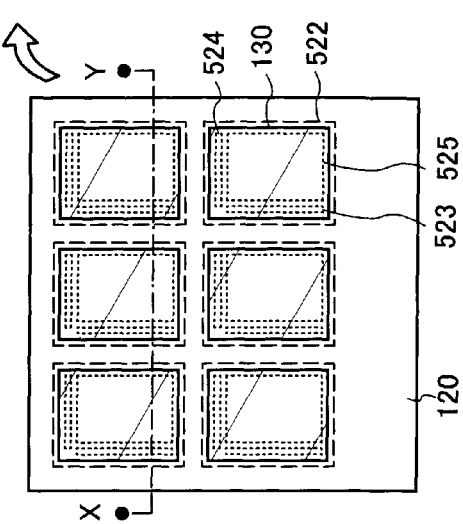

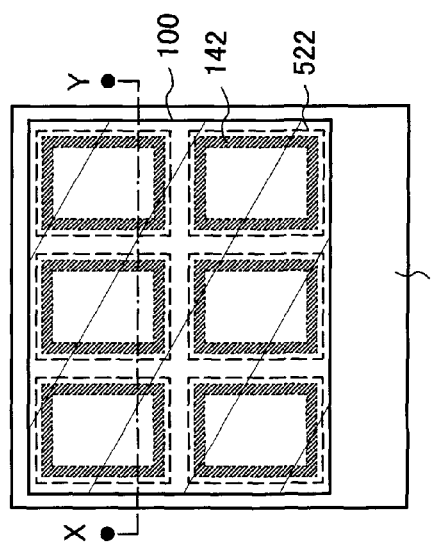

FIG. 29

| Accelerating Voltage | Ratio of Hydrogen Atom (H) (X:Y) | Ratio of Hydrogen Ion Species (X:Y/3) |
|---|---|---|
| 80kV | 1:44.1 | 1:14.7 |
| 60kV | 1:42.5 | 1:14.2 |
| 40kV | 1:43.5 | 1:14.5 |

MANUFACTURING METHOD OF SOI SUBSTRATE

BACKGROUND OF THE INVENTION

1. Field of the Invention

The present invention relates to an SOI (silicon on insulator) substrate and a manufacturing method thereof.

Note that a semiconductor device in this specification refers to all types of devices which can function by utilizing semiconductor characteristics, and electro-optic devices, semiconductor circuits, and electronic devices are all included in the category of the semiconductor device.

2. Description of the Related Art

With development of VLSI technology, lower power consumption and higher speed over the scaling law which can be realized by bulk single-crystalline silicon have been demanded. In order to satisfy these requirements, an SOI structure is receiving attention. This technology allows an active region (channel formation region) of a field effect transistor (FET), which has been formed of bulk single-crystalline silicon, to be formed of a single-crystalline silicon thin film. It is known that a field effect transistor manufactured using an SOI structure has lower parasitic capacitance than a field effect transistor manufactured using a bulk single-crystalline silicon substrate, which is advantageous in increasing speed.

As an SOI substrate, a SIMOX substrate or a bonded substrate is known. A SIMOX substrate is formed in the following manner: oxygen ions are implanted into a single-crystalline silicon substrate and heat treatment is performed at 1300° C. or higher to form a buried oxide film, so that a single-crystalline silicon thin film is formed on the surface and thus an SOI structure is obtained. In the SIMOX substrate, oxygen ion implantation can be controlled precisely and thus a single-crystalline silicon film can be formed with an even thickness; however, oxygen ion implantation takes much time and there are problems in time and cost. Furthermore, since the SOI structure is formed using one base substrate, it has not been possible to use a different kind of substrate from the base substrate as a supporting substrate.

A bonded substrate is formed in the following manner: two single-crystalline silicon substrates are bonded to each other with an insulating layer interposed therebetween and one of the single-crystalline silicon substrates is thinned, so that a single-crystalline silicon thin film is formed to obtain an SOI structure. As a thinning method, a hydrogen ion implantation separation method is known. A hydrogen ion implantation separation method is a method in which hydrogen ions are implanted into one single-crystalline silicon substrate to form a microbubble layer at a predetermined depth from a surface of the silicon substrate, and a thin single-crystalline silicon layer can be bonded to the other single-crystalline silicon substrate with use of the microbubble layer as a separation surface (see Patent Document 1: Japanese Published Patent Application No. 2000-124092).

Recently, there has been an attempt to form a single-crystalline silicon layer over a substrate having an insulating surface such as a glass substrate. For example, one known example of an SOI substrate in which a single-crystalline silicon layer is formed over a glass substrate is disclosed by the present applicant (see Reference 2: Japanese Published Patent Application No. H11-163363).

In the case of utilizing the hydrogen ion implantation separation method, the volume of a microbubble layer formed in a silicon substrate is changed by heat treatment and separation occurs along the microbubble layer, so that an SOI structure can be obtained. However, in order to change the volume of the microbubble layer and separate the silicon substrate along the microbubble layer, heat treatment needs to be performed at approximately 600° C.; accordingly, there has been a problem in reducing throughput in the separation step.

SUMMARY OF THE INVENTION

In view of the above-described problems, an object of the present invention is to provide a manufacturing method of an SOI substrate with high throughput. Further, another object of the present invention is to provide a semiconductor device using the SOI substrate.

A semiconductor layer separated from a semiconductor substrate is transferred to a supporting substrate, thereby manufacturing an SOW substrate. First, the semiconductor substrate serving as a base of the semiconductor layer is prepared. An embrittlement layer is formed in a region at a predetermined depth of the semiconductor substrate, and an insulating layer is formed on a surface of the semiconductor substrate. In addition, a supporting substrate having an insulating surface or a supporting substrate having an insulating property is prepared. After bonding the semiconductor substrate and the supporting substrate with the insulating layer interposed therebetween, the semiconductor substrate is selectively irradiated with a laser beam; accordingly, part of the embrittlement layer absorbs the laser beam, which progresses embrittlement of the embrittlement layer. Then, using a physical method or heat treatment, the semiconductor substrate is separated; at that time, the region where the embrittlement has progressed in the embrittlement layer serves as a starting point (trigger). The semiconductor substrate is separated along the embrittlement layer. Thus, an SOI substrate in which the semiconductor layer is firmly bonded to the supporting substrate is manufactured.

Note that in this specification, "embrittlement" means the state in which many microvoids are formed and the place where the microvoids are formed is made brittle. In addition, "the progression of embrittlement" means that the number of voids formed is increased, the voids become larger, or the voids are bonded to each other, thereby forming a space to partially separate a semiconductor substrate; that is, "the progression of embrittlement" means that an embrittlement layer formed by ion implantation becomes more brittle than what it used to be. Further, "separation" means that a semiconductor substrate is separated into parts. Furthermore, "implantation of ions" means that a semiconductor substrate is irradiated with ions, which are accelerated by an electric field, so that an element in the ions used for the irradiation is contained in the semiconductor substrate.

One feature of the present invention is a manufacturing method of an SOI substrate comprising the steps of: preparing a semiconductor substrate which includes an embrittlement layer in a region at a predetermined depth and on a surface of which an insulating layer is formed; bonding the semiconductor substrate and a supporting substrate with the insulating layer interposed therebetween; selectively irradiating the embrittlement layer with a laser beam from a side surface of the semiconductor substrate; and separating part of the semiconductor substrate along the embrittlement layer by a physical method to form a semiconductor layer over the supporting substrate.

Another feature of the present invention is a manufacturing method of an SOI substrate comprising the steps of: preparing a semiconductor substrate which includes an embrittlement layer in a region at a predetermined depth and on a surface of which an insulating layer is formed; bonding the semiconductor substrate and a supporting substrate with the insulating layer interposed therebetween; irradiating the semiconductor substrate with a laser beam from the supporting substrate direction; and separating part of the semiconductor substrate along the embrittlement layer by a physical method to form a semiconductor layer over the supporting substrate.

In the above structures, the laser beam is preferably transmitted through the supporting substrate and the insulating layer and has such a wavelength as to be absorbed by the semiconductor substrate. Specifically, a laser beam whose transmittance through the supporting substrate and the insulating layer is 30% or greater, preferably 50% or greater, and more preferably 70% or greater, is preferably used for irradiation. For example, irradiation is preferably performed using a laser beam emitted from an XeCl excimer laser or an $Ar^+$ laser, a second harmonic (532 nm) or a third harmonic (355 nm) of a YAG laser (fundamental wave: 1064 nm), a second harmonic (532 nm) or a third harmonic (355 nm) of a $YVO_4$ laser (fundamental wave: 1064 nm), or a second harmonic (527 nm) or a third harmonic (351 nm) of a YLF laser (fundamental wave: 1053 nm).

Note that in this specification, "to be transmitted" means that to be transmitted through the object with a transmittance of 30% or greater, preferably 50% or greater, and more preferably 70% or greater.

Further, as the supporting substrate in the above structures, a substrate having an insulating surface or a substrate having an insulating property and a light-transmitting property with respect to ultraviolet light or visible light is preferably employed. Specifically, a substrate which transmits ultraviolet light or visible light with a transmittance of 30% or greater, preferably 50% or greater, and more preferably 70% or greater is preferably used.

Before separation of the semiconductor substrate by physical means, heat treatment can be performed.

The present invention provides a manufacturing method of an SOI substrate with higher throughput, thereby increasing productivity. Further, productivity of a semiconductor device which uses an SOI substrate can also be increased.

BRIEF DESCRIPTION OF THE DRAWINGS

In the accompanying drawings:

FIGS. 17A to 17D illustrate an example of bonding semiconductor layers to a mother glass for manufacturing a display panel;

FIG. 29 is a list of ratios of fitting parameters (hydrogen atom ratios and hydrogen ion species ratios).

DETAILED DESCRIPTION OF THE INVENTION

Figure 1A:
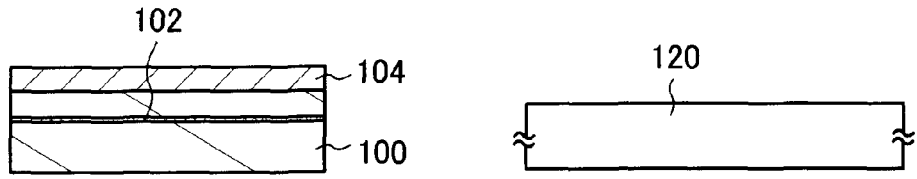
FIGS. 1A to 1E illustrate an example of a manufacturing method of an SOI substrate.

Embodiment modes of the present invention will be described below with reference to the drawings. It is easily understood by those skilled in the art that various changes may be made in forms and details without departing from the spirit and the scope of the invention. Therefore, the present invention should not be interpreted as being limited to the descriptions of the embodiment modes below. In structures of the present invention described below, the same reference numerals are commonly given to the same components or components having similar functions throughout the drawings.

Embodiment Mode 1

An SOI substrate of this embodiment mode is formed by transferring a semiconductor layer separated from a semiconductor substrate, preferably a single-crystalline semiconductor layer separated from a single-crystalline semiconductor substrate, to a supporting substrate. As the supporting substrate, a different kind of substrate from the semiconductor substrate is used. An example of a manufacturing method of an SOI substrate according to this embodiment mode will be described below with reference to the drawings.

A semiconductor substrate 100 which includes an embrittlement layer 102 in a region at a predetermined depth and on a surface of which an insulating layer 104 is formed, and a supporting substrate 120 are prepared (see FIG. 1A).

As the semiconductor substrate 100, a semiconductor substrate such as a silicon substrate or a germanium substrate, or a compound semiconductor substrate such as a gallium arsenide substrate or an indium phosphide substrate is used. It is preferable to use a single-crystalline semiconductor substrate. Alternatively, a polycrystalline semiconductor substrate can be used. A semiconductor substrate to be used may be rectangular or circular.

The insulating layer 104 formed on the semiconductor substrate 100 may have a single layer structure or a stacked structure, but preferably has an uppermost layer (layer to be used as a bonding surface later) which has smoothness, can have a hydrophilic surface, and which has a thickness of 0.2 nm to 500 nm. For example, an oxide film formed by thermal reaction or chemical reaction is preferable since it can ensure surface smoothness. The insulating layer formed satisfying such conditions serves as a bonding layer which bonds the semiconductor substrate 100 to the supporting substrate 120. In this specification, a "bonding layer" is a layer formed on a bonding surface of one substrate (e.g., semiconductor substrate), which is bonded to another substrate (e.g., supporting substrate). For example, a silicon oxide layer formed by a chemical vapor deposition (CVD) method using organic silane as a source gas is preferably used. Examples of organic silane that can be used include silicon-containing compounds such as tetraethoxysilane (TEOS) (chemical formula: $Si(OC_2H_5)_4$), tetramethylsilane (TMS) (chemical formula: $Si(CH_3)_4$), trimethylsilane (chemical formula: $(CH_3)_3SiH$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), tris(dimethylamino)silane (chemical formula: $SiH(N(CH_3)_2)_3$), and the like. Alternatively, a silicon oxide layer formed by a CVD method with use of inorganic silane such as monosilane, disilane, or trisilane as a source gas can also be used as the insulating layer. If the silicon oxide layer is formed by a CVD method using organic silane or inorganic silane as a source gas, it is preferable to mix a gas which provides oxygen. As a gas which provides oxygen, oxygen, nitrous oxide, nitrogen dioxide, or the like can be used. In addition, an inert gas such as argon, helium, or nitrogen or a hydrogen gas may be mixed. In the case of forming a silicon oxide layer by a CVD method, it is preferably formed with a thickness of 10 nm to 500 nm. Alternatively, a silicon oxide layer which is formed by heat treatment in an oxidizing atmosphere, a silicon oxide layer which grows by reaction of oxygen radicals, a chemical oxide which is formed with an oxidizing chemical solution, or an insulating layer having a siloxane (Si—O—Si) bond can be used. Note that an insulating layer which has a siloxane bond in this specification refers to a layer in which a bond of silicon (Si) and oxygen (O) is included and a skeleton structure is formed by the bond of silicon and oxygen. Siloxane has a substituent. An organic group containing at least hydrogen (e.g., an alkyl group or an aromatic hydrocarbon) can be given as a substituent. A fluoro group may be included in the organic group. Note that an insulating layer which has a siloxane bond can be formed by an application method such as a spin coating method.

The insulating layer 104 preferably includes one or more nitrogen-containing insulating layers such as a silicon nitride layer or a silicon nitride oxide layer. The nitrogen-containing insulating layer has an effect of blocking metal impurities such as an alkali metal or an alkaline earth metal. Therefore, in the case where a substrate containing a small amount of metal impurities like a glass substrate is used as the supporting substrate 120, the nitrogen-containing insulating layer is preferably used since it can prevent the metal impurities from diffusing into the semiconductor layer side. Further, in the case where the insulating layer 104 has a stacked structure including a nitrogen-containing insulating layer, it is preferable to form a silicon oxide layer between the semiconductor substrate 100 and the nitrogen-containing insulating layer. Specifically, the insulating layer 104 preferably has a stacked structure in which a silicon oxide layer, a nitrogen-containing insulating layer, and a bonding layer are sequentially formed from the semiconductor substrate 100 side. This is because when the nitrogen-containing insulating layer is formed in direct contact with the semiconductor substrate 100, interface characteristics are deteriorated due to formation of trap levels. The nitrogen-containing insulating layer or the silicon oxide layer may be formed by a CVD method, a sputtering method, or an atomic layer epitaxy (ALE) method. When the insulating layer 104 is formed to have a stacked structure in which the silicon oxide layer, the nitrogen-containing insulating layer, and the bonding layer are formed from the semiconductor substrate 100 side, the semiconductor layer can be prevented from being contaminated with metal impurities and electric characteristics at the interface can be improved.

Note that in this specification, a silicon oxynitride layer means a layer that contains more oxygen than nitrogen and, in the case where measurements are performed using Rutherford backscattering spectrometry (RBS) and hydrogen forward scattering (HFS), includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, a silicon nitride oxide layer means a layer that contains more nitrogen than oxygen and, in the case where measurements are performed using RBS and HFS, includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride layer or the silicon nitride oxide layer is defined as 100 at. %.

The embrittlement layer 102 is formed in a region at a predetermined depth of the semiconductor substrate 100 by irradiating the semiconductor substrate 100 with ions which are accelerated by electric field. The depth of the embrittlement layer 102 formed in the semiconductor substrate 100 can be controlled by the kind of ions used for irradiation, the accelerating voltage of the ions, and the irradiation angle of the ions. The embrittlement layer 102 is formed in a region at a depth close to the average penetration depth of ions from a surface of the semiconductor substrate 100. The depth of the embrittlement layer 102 determines the thickness of a semiconductor layer to be transferred to the supporting substrate later. Therefore, the accelerating voltage and the dose of the ions at the time of the ion irradiation for forming the embrittlement layer 102 are adjusted in consideration of the thickness of a semiconductor layer to be transferred. In forming the embrittlement layer 102, irradiation with the ions are adjusted so that the thickness of the semiconductor layer is preferably 5 nm to 300 nm, and more preferably 10 nm to 200 nm.

Ion irradiation is preferably performed using an ion doping apparatus. In other words, an ion doping method is preferably used which performs irradiation with plural kinds of ions generated by plasma excitation of a source gas without any mass separation being performed. In this embodiment mode, irradiation with ions made up of one or a plurality of same atoms that have a single mass or ions made up of one or a plurality of same atoms that have different masses can be performed. Preferably, irradiation is performed with ions made up of one or a plurality of same atoms that have different masses. Such ion doping may be performed with an accelerating voltage of 10 kV to 100 kV, preferably, 30 kV to 80 kV, at a dose of $1\times10^{16}$ ions/cm$^2$ to $4\times10^{16}$ ions/cm$^2$, and with a beam current density of 2 μA/cm$^2$ or more, preferably, 5 μA/cm$^2$ or more, and more preferably, 10 μA/cm$^2$ or more.

As the ions used for irradiation, ions made up of one or a plurality of same atoms that have different masses, which are generated by plasma excitation of a source gas selected from hydrogen, deuterium, helium, or a halogen element such as fluorine are preferably used. In the case of using hydrogen ions for irradiation, it is preferable that H$^+$ ions, H$_2^+$ ions, and H$_3^+$ ions be contained in the hydrogen ions with a high percentage of H$_3^+$ ions. Thus, efficiency of the ion irradiation can be increased and time for the irradiation can be shortened. Accordingly, a region of the embrittlement layer 102 formed in the semiconductor substrate 100 can be made to contain hydrogen at $1\times10^{20}$ atoms/cm$^3$ (preferably, $1\times10^{21}$ atoms/cm$^3$) or more. In the embrittlement layer 102 which is formed by locally irradiating the semiconductor substrate 100 with hydrogen at a high concentration, the crystal structure is disordered, whereby the embrittlement layer 102 has a porous structure in which microvoids are formed.

Note that the embrittlement layer 102 can be formed in a similar manner even if the semiconductor substrate 100 is irradiated with a specific kind of ion with mass separation being performed. Also in this case, it is preferable to use ions with large mass (e.g., H$_3^+$ ions) for selective irradiation, which has a similar effect to the above.

The embrittlement layer 102 may be formed by irradiation with ions from the insulating layer 104 side after formation of the insulating layer 104 on the semiconductor substrate 100, or by irradiation of the semiconductor substrate 100 with ions before formation of the insulating layer 104. The insulating layer 104 may have a stacked structure, and after forming an insulating layer which can function as a protection layer against ion irradiation, the embrittlement layer 102 may be formed by irradiation with ions and another insulating layer which functions as a bonding layer may be further formed. For example, in the case where the insulating layer 104 has a stacked structure including a silicon oxide layer, a nitrogen-containing insulating layer, and a bonding layer, after formation of the silicon oxide layer and the nitrogen-containing insulating layer over a surface of the semiconductor substrate 100, the embrittlement layer 102 can be formed by irradiation with ions, and further the bonding layer can be formed. With a structure where ions pass through the insulating layer at the time of irradiating the semiconductor substrate 100, surface roughness of the semiconductor substrate 100 can be prevented. Note that in the case where the insulating layer which functions as a bonding layer is formed after formation of the embrittlement layer 102 by irradiation with ions, the insulating layer is preferably formed at a film formation temperature of 350° C. or lower.

As the supporting substrate 120, a substrate having an insulating surface or a substrate having an insulating property and a light-transmitting property with respect to ultraviolet light or visible light is employed. Specifically, a substrate which transmits ultraviolet light or visible light with a transmittance of 30% or greater, preferably 50% or greater, and more preferably 70% or greater is preferably used. For example, a variety of glass substrates used for electronic industry (also called an "alkali-free glass substrate") such as an aluminosilicate glass substrate, an aluminoborosilicate glass substrate, or a barium borosilicate glass substrate; a quartz substrate; a crystallized glass substrate, or a sapphire substrate can be given. It is preferable to employ a glass substrate used for electronic industry since it is inexpensive and reduction in cost can be realized.

Figure 1B:
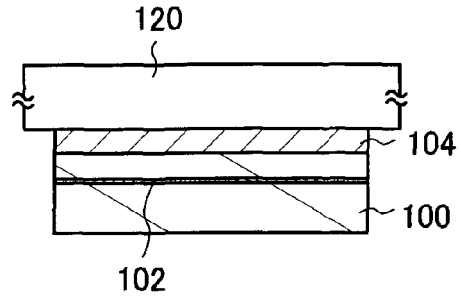

Next, the semiconductor substrate 100 and the supporting substrate 120 are bonded to each other with the insulating layer 104 interposed therebetween (see FIG. 1B).

Surfaces of the semiconductor substrate 100 and the supporting substrate 120 which form a bond are sufficiently cleaned in advance. When the semiconductor substrate 100 and the supporting substrate 120 are made in close contact with each other with the insulating layer 104 interposed therebetween, the semiconductor substrate 100 and the supporting substrate 120 are bonded to each other. Van der Waals force probably acts on the bonding at an early stage and a strong bond can be formed by a hydrogen bond which is formed by pressure bonding of the supporting substrate 120 and the semiconductor substrate 100.

Note that it is preferable that heat treatment or pressure treatment be performed after the supporting substrate 120 and the semiconductor substrate 100 are bonded to each other. Heat treatment or pressure treatment makes it possible to increase the bonding strength. If the heat treatment is performed, the temperature of the heat treatment is set at a temperature that is lower than or equal to the upper temperature limit of the supporting substrate 120 and is a temperature which does not cause change in volume of the embrittlement layer 102 formed in the semiconductor substrate 100, preferably at a temperature higher than or equal to room temperature and lower than 400° C. If the pressure treatment is performed, pressure is applied perpendicular to the bonding surface in consideration of the pressure resistance of the supporting substrate 120 and the semiconductor substrate 100.

In addition, in order to form a favorable bond between the semiconductor substrate 100 and the supporting substrate 120, one or both of the bonding surfaces may be activated before the supporting substrate 120 and the semiconductor substrate 100 are made in close contact with each other. For example, the bonding surface can be activated by irradiation with an atomic beam or an ion beam, specifically, an atomic beam of an inert gas such as argon or an ion beam thereof. Alternatively, the bonding surface can be activated by radical treatment. Such surface activation treatment makes it possible to increase the bonding strength between substrates of different materials. Alternatively, one or both of the bonding surfaces may be cleaned with ozone-containing water, oxygen-containing water, hydrogen-containing water, pure water, or the like. When treatment for making the bonding surface hydrophilic is added in this manner, an OH group of the bonding surface can be increased. As a result, bond by a hydrogen bond can be further strengthened.

Figure 1C:
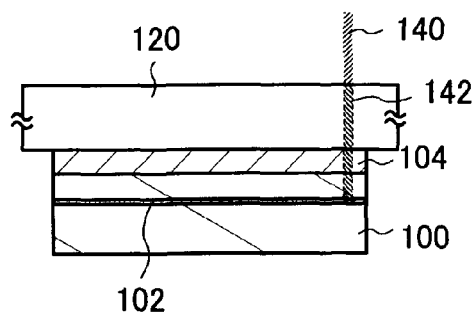

Next, the semiconductor substrate 100 is selectively irradiated with a laser beam 140 from the supporting substrate 120 side (see FIG. 1C).

The laser beam 140 is transmitted through the supporting substrate 120 and the insulating layer 104 and has such a wavelength as to be absorbed by the semiconductor substrate 100. Specifically, it is preferable to use the laser beam 140 which is transmitted through the substrate and the film of from the exposed surface of the supporting substrate 120 to the surface of the semiconductor substrate 100 on the contact side with the insulating layer 104 with a transmittance of 30% or greater, preferably 50% or greater, and more preferably 70% or greater, and which is absorbed by the semiconductor substrate 100. The wavelength of the laser beam 140 is preferably in the range of from a visible region to an ultraviolet region (800 nm or lower), and more preferably in the ultraviolet region (400 nm or lower). As a laser beam used here, for example, a laser beam emitted from an XeCl excimer laser (oscillation wavelength: 308 nm), a second harmonic (532 nm) or a third harmonic (355 nm) of a YAG laser (oscillation wavelength: 1064 nm) which is a solid-state laser, a second harmonic (532 nm) or a third harmonic (355 nm) of a $YVO_4$ laser (oscillation wavelength: 1064 nm), a second harmonic (527 nm) or a third harmonic (351 nm) of a YLF laser (oscillation wavelength: 1053 nm), a laser beam emitted from an $Ar^+$ laser (oscillation wavelength: 364 nm), and the like can be given. Note that the laser used in this embodiment mode is not particularly limited as long as a laser beam with a desired oscillation wavelength (preferably in the range of from a visible region to an ultraviolet region, more preferably in the ultraviolet region) can be obtained from the laser. Further, either a continuous wave laser or a pulsed laser may be used.

Figure 2B:
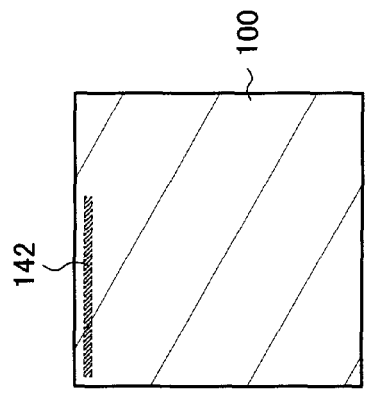
FIGS. 2A to 2D illustrate an example of laser beam irradiation.
Figure 2D:
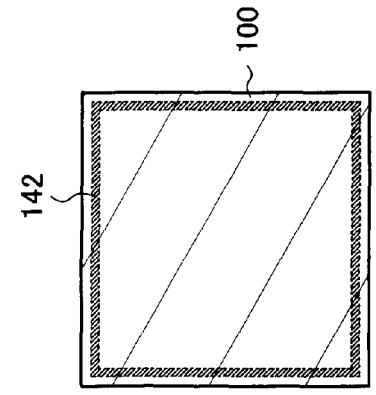
Figure 2A:
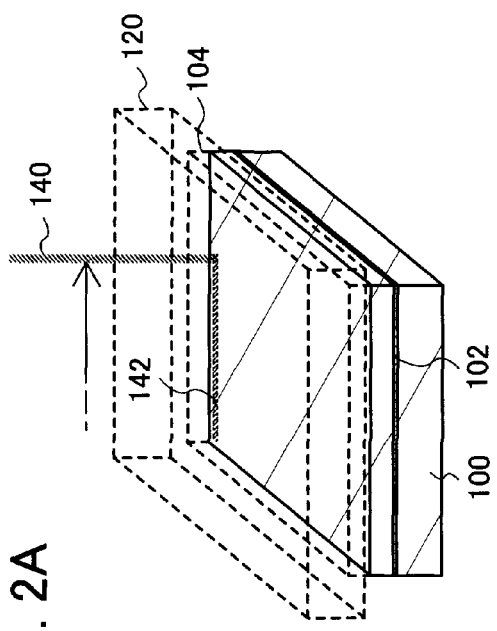
Figure 2C:
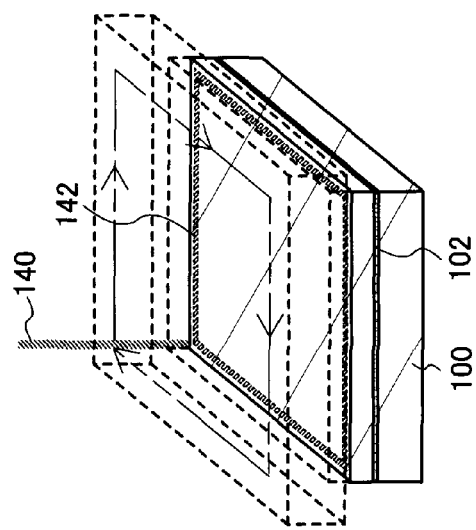

FIGS. 2A to 2D illustrate an example of irradiation with the laser beam 140. FIGS. 2A and 2C are schematic perspective views, and FIGS. 2B and 2D are top views. Note that the insulating layer 104 and the supporting substrate 120 are illustrated by dotted lines in FIGS. 2A to 2D.

In this embodiment mode, it is preferable that a peripheral region of the semiconductor substrate 100 be selectively irradiated with the laser beam 140, and in the case where the semiconductor substrate 100 is rectangular, at least one side of the semiconductor substrate 100 is irradiated. FIGS. 2A to 2D illustrate an example of irradiating the four sides of the semiconductor substrate 100 with the laser beam 140 along a peripheral region. Note that the region which is selectively irradiated with the laser beam 140 is illustrated as an irradiation region 142.

The laser beam 140 is transmitted through the supporting substrate 120 and the insulating layer 104 and is absorbed by the semiconductor substrate 100. Note that irradiation is performed so that the laser beam 140 reaches and is absorbed by at least the embrittlement layer 102. It is necessary to form the embrittlement layer 102 at such a depth in the semiconductor substrate 100 that the laser beam 140 reaches the embrittlement layer 102. Specifically, it is preferable to form the embrittlement layer 102 in the semiconductor substrate 100 at a depth of 300 nm or less from the surface on the ion irradiation side of the semiconductor substrate 100.

The embrittlement layer 102 in the irradiation region 142 and the embrittlement layer 102 at the periphery of the irradiation region 142 are locally heated by absorption of the laser beam 140 to have an increased temperature. Then, hydrogen pressure in voids is increased in the region of the embrittlement layer 102, which has absorbed the laser beam 140, and the embrittlement layer 102 at the periphery of the region which has absorbed the laser beam 140, and embrittlement progresses. That is, embrittlement progresses along the irradiation region 142 in the embrittlement layer 102 formed in the semiconductor substrate 100. For example, in FIGS. 2A to 2D, embrittlement of the embrittlement layer 102 partially progresses along the periphery of the semiconductor substrate 100. Note that the embrittlement layer 102 in the irradiation region 142 irradiated with the laser beam 140 and the embrittlement layer 102 at the periphery of the irradiation region 142 may be melted by heating in some cases. The portion where the embrittlement has progressed in the embrittlement layer 102 serves as a starting point (trigger) for separating the semiconductor substrate 100 later.

The beam shape of the laser beam 140 preferably has an area. For example, the laser beam 140 is preferably formed into a rectangular shape or an elliptic shape using an optical system. This is because since the portion where the embrittlement has progressed in the embrittlement layer 102 serves as a starting point for the separation step, when the embrittlement progresses in the region having a certain amount of area, separation can be easily performed and damage such as a crack can be prevented at the time of separation. Note that in the case where the laser beam 140 has a rectangular shape or an elliptic shape, the minor axis direction of the beam shape in the cross section in a perpendicular direction to the traveling direction of the laser beam 140 is preferably a scanning direction of the laser beam 140.

Figure 8A:
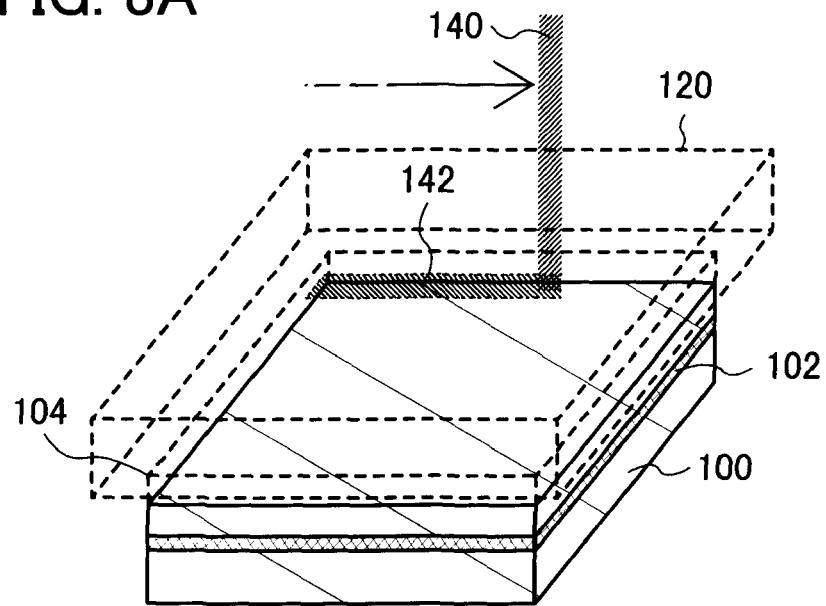
FIGS. 8A and 8B illustrate an example of laser beam irradiation.
Figure 8B:
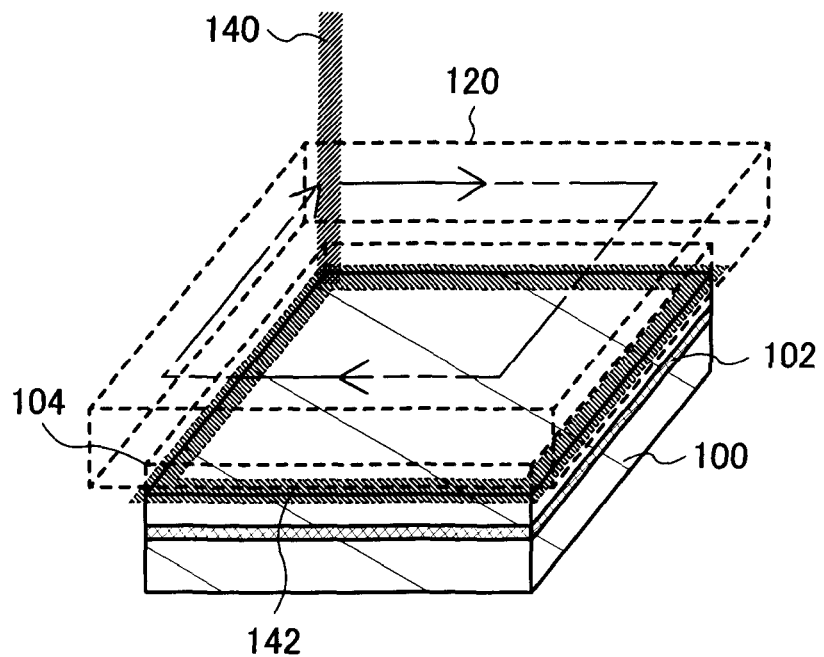

In addition, as illustrated in FIGS. 8A and 8B, the periphery of the semiconductor substrate 100 may be irradiated with the laser beam 140 and the laser beam 140 may extend just beyond the periphery. FIGS. 8A and 8B illustrate an example of irradiating the four sides with the laser beam 140 along the periphery of the semiconductor substrate 100 having a rectangular shape is illustrated; however, it is acceptable as long as at least one side of the semiconductor substrate 100 is irradiated. When the periphery of the semiconductor substrate 100 is irradiated with the laser beam 140 and the laser beam 140 extend just beyond the periphery, embrittlement progresses in a portion of the embrittlement layer located at an edge portion of the semiconductor substrate 100. The portion where the embrittlement has progressed in the embrittlement layer 102 serves as a starting point for separating the semiconductor substrate 100. When the starting point is located at the edge portion, separation can easily progress in one direction and the semiconductor substrate 100 can easily be separated.

Next, the semiconductor substrate 100 is separated at the embrittlement layer 102 by a physical method. The semiconductor substrate 100 is bonded to the supporting substrate 120 with the insulating layer 104 interposed therebetween, and when a portion of the semiconductor substrate 100 is separated at the embrittlement layer 102, a semiconductor layer 130 is left over the supporting substrate 120 (see FIG. 1D).

Note that the physical method in this embodiment mode is a method that is acknowledged by not chemistry but physics; specifically, the physical method refers to a dynamical or mechanical method having a process based on the rule of dynamics, and for example refers to peeling with a human hand or with a tool.

Embrittlement progresses partially in the embrittlement layer 102 by irradiation with the laser beam 140. When physical force is applied to the semiconductor substrate 100, the semiconductor substrate 100 can be separated at the embrittlement layer 102 starting from a portion where the embrittlement has progressed in the embrittlement layer 102. The time required for separation in this embodiment mode can be several seconds to several minutes approximately. The semiconductor substrate 100 is bonded to the supporting substrate 120 with the insulating layer 104 interposed therebetween, and the semiconductor layer 130 having the same crystallinity as the semiconductor substrate 100 is left over the supporting substrate 120. For example, when a single-crystalline silicon substrate is used as the semiconductor substrate 100 and a glass substrate is used as the supporting substrate 120, a single-crystalline silicon layer can be formed over the glass substrate with an insulating layer interposed therebetween.

For example, one of the semiconductor substrate 100 and the supporting substrate 120 which are bonded to each other is fixed by a technique such as a vacuum chuck or a mechanical chuck. Then, the other thereof is separated off by application of physical force; accordingly, the portion where the embrittlement has progressed in the embrittlement layer 102 (the embrittlement layer in the region irradiated with the laser beam 140, or the embrittlement layer at the periphery of the region irradiated with the laser beam 140) serves as a starting point (trigger) and the semiconductor substrate 100 can be separated at the embrittlement layer 102. Alternatively, both of the semiconductor substrate 100 and the supporting substrate 120 bonded to each other may be fixed and pulled in opposite directions so as to be separated from each other.

After irradiation with the laser beam 140 and before separation of the semiconductor substrate 100 by a physical method, heat treatment at a temperature lower than a strain point of the supporting substrate 120 may be performed. By this heat treatment, embrittlement progresses in a region of the embrittlement layer 102 other than the region irradiated with the laser beam 140, and separation of the semiconductor substrate 100 can be easily performed. Note that in this case, the heat treatment plays a supporting role to the separation of the semiconductor substrate 100 by the physical method.

The semiconductor layer 130 transferred to the supporting substrate 120 has a surface (separation surface) whose planarity is deteriorated by the ion irradiation step and the separation step and where projections and depressions are formed. Further, the embrittlement layer 102 is left on the surface (separation surface) of the semiconductor layer 130 in some cases. If the surface of the semiconductor layer 130 has projections and depressions, it becomes difficult to form a thin gate insulating layer with excellent withstand voltage in formation of a semiconductor device with use of the obtained SOI substrate. Therefore, it is preferable to perform planarization treatment on the semiconductor layer 130 (see FIG. 1E).

For example, as the planarization treatment, chemical mechanical polishing (CMP), polishing that utilizes liquid jet, or the like is preferably performed on the semiconductor layer 130. Alternatively, the semiconductor layer 130 may be planarized by being irradiated with a laser beam. Further alternatively, the semiconductor layer 130 may be planarized by a combination of CMP treatment and irradiation with a laser beam or heat treatment. Note that not only planarization of the semiconductor layer but also recovery of crystal defects, damages, and the like can be realized by irradiation of the semiconductor layer with a laser beam or heat treatment performed on the semiconductor layer. Further, laser beam irradiation or heat treatment after the CMP treatment allows a layer at the surface which is damaged by the CMP treatment to be repaired. Furthermore, CMP treatment or the like may be performed for the purpose of thinning the obtained semiconductor layer. The laser beam irradiation of the semiconductor layer is preferably performed in a nitrogen atmosphere containing oxygen at a concentration of 10 ppm or less. This is because the surface of the semiconductor layer is in danger of being roughened when laser beam irradiation is performed in an oxygen atmosphere.

In the above-described manner, an SOI substrate in which the semiconductor layer 130 is firmly bonded to the supporting substrate 120 with the insulating layer 104 interposed therebetween can be obtained. The SOI substrate of this embodiment mode can be manufactured in improved throughput since separation is performed by a physical method and therefore heat treatment at high temperature for long time is not needed in the separation step. Moreover, since the starting point (trigger) for separation is formed in advance by laser beam irradiation, separation can be performed easily. Therefore, manufacturing time can be shortened, and productivity can be increased. Furthermore, since the structure is such that irradiation with a laser beam is performed from the supporting substrate direction, damage to the semiconductor layer 130 can be reduced.

Although an example in which the supporting substrate 120 has a larger area than the semiconductor substrate 100 is described in this embodiment mode with reference to the drawings, the present invention is not particularly limited. The supporting substrate 120 may have an area approximately equal to the area of the semiconductor substrate 100. Further, the supporting substrate 120 may have a different shape from the semiconductor substrate 100.

Figure 1D:
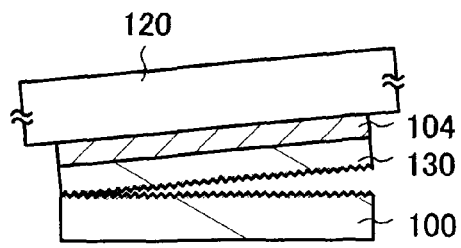
Figure 1E:
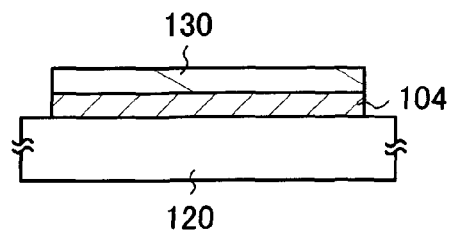

In addition, the semiconductor substrate 100 from which the semiconductor layer 130 has been separated can be reused. That is, the semiconductor substrate 100 separated as illustrated in FIG. 1D can be reused as the semiconductor substrate illustrated in FIG. 1A. If the semiconductor substrate 100 is reused, it is preferable to planarize a surface at which the semiconductor layer 130 is separated (a surface where separation has been conducted). Planarization treatment here may be performed in a similar manner to the above planarization of the semiconductor layer 130; CMP treatment, polishing treatment that utilizes liquid jet, laser beam irradiation, heat treatment, or the like may be performed as appropriate. In addition, planarization or repair of crystal defects may be performed with a combination of plural kinds of treatment. When the semiconductor substrate which serves as a base is reused in manufacturing the SOI substrate, drastic cost reduction can be realized. It is needless to mention that the semiconductor substrate 100 from which the semiconductor layer 130 has been separated can be used for a purpose other than that of manufacturing an SOI substrate.

Note that the manufacturing method of an SOI substrate according to this embodiment mode is characterized in that after embrittlement partially progresses in the embrittlement layer by selectively irradiating the semiconductor substrate including the embrittlement layer with a laser beam, the semiconductor substrate is separated along the embrittlement layer starting from the region where the embrittlement has progressed. The structure of the SOI substrate is not particularly limited.

Figure 3A:
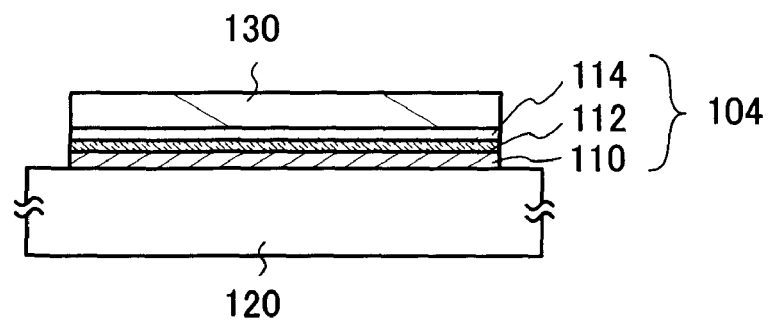
FIGS. 3A to 3C illustrate structural examples of an SOI substrate.

Hereinafter, structural examples of an SOI substrate according to this embodiment mode will be described with reference to FIGS. 3A to 3C and FIGS. 4A to 4C. FIG. 3A illustrates an example in which a silicon oxide layer 114, a nitrogen-containing insulating layer 112, and a bonding layer 110 are formed from a semiconductor layer 130 side between the semiconductor layer 130 and a supporting substrate 120. Note that the stacked structure including the silicon oxide layer 114, the nitrogen-containing insulating layer 112, and the bonding layer 110 corresponds to the insulating layer 104 illustrated in FIGS. 1A to 1E.

As the silicon oxide layer 114, an insulating layer containing at least oxygen and silicon as its composition, such as a silicon oxide layer or a silicon oxynitride layer, is formed. As the nitrogen-containing insulating layer 112, an insulating layer containing at least nitrogen as its composition, such as a silicon nitride layer, a silicon nitride oxide layer, or an aluminum nitride layer, is formed. As the bonding layer 110, an insulating layer which has smoothness and can have a hydrophilic surface is formed, and specifically, a silicon oxide layer formed by a CVD method using organic silane as a source gas, a layer having a siloxane bond, or the like is formed. The nitrogen-containing insulating layer 112 has an effect of preventing metal impurities from diffusing into the semiconductor layer 130 side. The silicon oxide layer 114 can form a favorable interface with the semiconductor layer 130.

Although the thicknesses of the silicon oxide layer 114, the nitrogen-containing insulating layer 112, and the bonding layer 110 may be determined as appropriate by a practitioner, the thickness of the silicon oxide layer 114 is preferably 10 nm to 500 nm, the thickness of the nitrogen-containing insulating layer 112 is preferably 10 nm to 500 nm, and the thickness of the bonding layer 110 is preferably about 0.2 nm to 500 nm (in the case of forming the bonding layer 110 by a CVD method, about 10 nm to 500 nm).

In the case where an SOI substrate having the structure illustrated in FIG. 3A is manufactured, it is preferable that after forming the stacked structure of the silicon oxide layer 114 and the nitrogen-containing insulating layer 112 on a semiconductor substrate, the semiconductor substrate be irradiated with ions from the side where the stacked structure is formed to form an embrittlement layer. When irradiation with ions is performed from the side where the silicon oxide layer 114 and the nitrogen-containing insulating layer 112 are formed, surface roughness of the semiconductor substrate can be prevented. After formation of the bonding layer 110 over the nitrogen-containing insulating layer 112, the semiconductor substrate and the supporting substrate 120 are bonded to each other with the bonding layer 110 interposed therebetween. Laser beam irradiation is selectively performed from the supporting substrate 120 side, so that embrittlement progresses in the embrittlement layer in the irradiated region. In this case, a laser beam which is transmitted through the supporting substrate 120, the silicon oxide layer 114, the nitrogen-containing insulating layer 112, and the bonding layer 110 and is absorbed by the semiconductor substrate is used. The laser beam emitted from the supporting substrate 120 side reaches at least the embrittlement layer. Then, the semiconductor substrate is separated at the embrittlement layer by a physical method. Accordingly, the semiconductor layer 130 is left over the supporting substrate 120 with the bonding layer 110, the nitrogen-containing insulating layer 112, and the silicon oxide layer 114 interposed therebetween. Since embrittlement partially progresses in the embrittlement layer by selective irradiation with a laser beam before separating the semiconductor substrate, when physical force is applied, separation can be easily performed starting from the region where the embrittlement has progressed. By using a physical method for separation, the separation can be performed in a short time, so that a manufacturing time is shortened, thereby increasing throughput. Note that the silicon oxide layer 114 and the nitrogen-containing insulating layer 112 may be formed after formation of the embrittlement layer in the semiconductor substrate. Alternatively, after formation of the silicon oxide layer 114, the nitrogen-containing insulating layer 112, and the bonding layer 110 over the semiconductor substrate, the embrittlement layer may be formed.

Figure 3B:
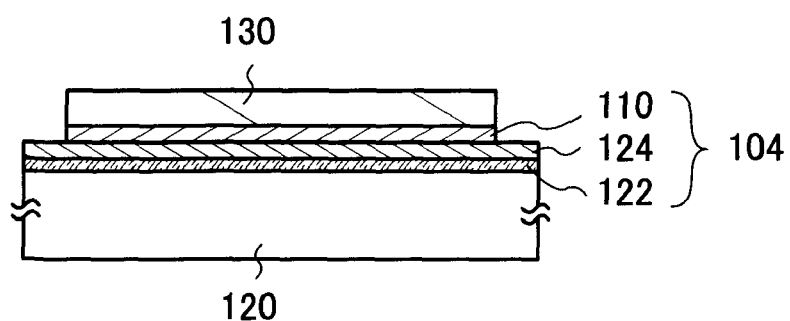

FIG. 3B illustrates an example of forming a bonding layer 124 and a nitrogen-containing insulating layer 122 on the supporting substrate 120 side. The bonding layer 110, the bonding layer 124, and the nitrogen-containing insulating layer 122 are formed from the semiconductor layer 130 side between the semiconductor layer 130 and the supporting substrate 120, and this stacked structure corresponds to the insulating layer 104 illustrated in FIGS. 1A to 1E.

As the nitrogen-containing insulating layer 122, similarly to the nitrogen-containing insulating layer 112 illustrated in FIG. 3A, an insulating layer containing at least nitrogen as its composition, such as a silicon nitride layer, a silicon nitride oxide layer, or an aluminum nitride layer, is formed. When the nitrogen-containing insulating layer 122 is formed, metal impurities can be prevented from diffusing into the semiconductor layer 130 from the supporting substrate 120.

As the bonding layer 124, similarly to the bonding layer 110, an insulating layer which has smoothness and can have a hydrophilic surface is formed, and for example, a silicon oxide layer formed by a CVD method using organic silane as a source gas is formed. When the bonding layer 124 is provided on the supporting substrate 120 side and bonding is performed between the bonding layer 124 and the bonding layer 110, bonding strength between the semiconductor layer 130 and the supporting substrate 120 can be increased.

Although the thicknesses of the nitrogen-containing insulating layer 122 and the bonding layer 124 may be determined as appropriate by a practitioner, the thickness of the nitrogen-containing insulating layer 122 is preferably 10 nm to 500 nm, and the thickness of the bonding layer 124 is preferably about 0.2 nm to 500 nm (in the case of forming the bonding layer 124 by a CVD method, about 10 nm to 500 nm).

In the case where an SOI substrate having the structure illustrated in FIG. 3B is manufactured, after forming an embrittlement layer by irradiating a semiconductor substrate with ions, the bonding layer 110 is formed over the semiconductor substrate. In addition, the nitrogen-containing insulating layer 122 and the bonding layer 124 are stacked over the supporting substrate 120. After the bonding layer 124 formed over the supporting substrate 120 and the bonding layer 110 formed over the semiconductor substrate are bonded to each other, laser beam irradiation is selectively performed from the supporting substrate 120 side, thereby making embrittlement of the embrittlement layer progress partially. Then, the semiconductor substrate is separated along the embrittlement layer by a physical method. Thus, the SOI substrate in which the semiconductor layer 130 is firmly bonded to the supporting substrate 120 is obtained. Note that it is preferable that after the separation of the semiconductor substrate, the surface (separation surface) of the obtained semiconductor layer 130 be planarized. In this embodiment mode, since embrittlement partially progresses in the embrittlement layer by laser beam irradiation before separating the semiconductor substrate by the physical method, the region where the embrittlement has progressed serves as a starting point (trigger) and separation can be easily performed. Note that ion irradiation for forming the embrittlement layer may be performed on the bonding layer 110.

Figure 3C:
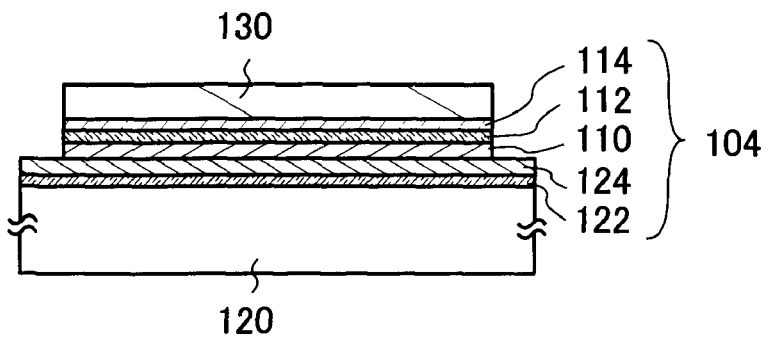

FIG. 3C illustrates an example in which the silicon oxide layer 114, the nitrogen-containing insulating layer 112, and the bonding layer 110 are formed on the semiconductor layer 130 side and the nitrogen-containing insulating layer 122 and the bonding layer 124 are formed on the supporting substrate 120 side. The silicon oxide layer 114, the nitrogen-containing insulating layer 112, the bonding layer 110, the bonding layer 124, and the nitrogen-containing insulating layer 122 are formed from the semiconductor layer 130 side between the semiconductor layer 130 and the supporting substrate 120, and this stacked structure corresponds to the insulating layer 104 illustrated in FIGS. 1A to 1E.

In the case where an SOI substrate having the structure illustrated in FIG. 3C is manufactured, the silicon oxide layer 114 and the nitrogen-containing insulating layer 112 are formed over a semiconductor substrate; ion irradiation is performed from a side of the semiconductor substrate, where the silicon oxide layer 114 and the nitrogen-containing insulating layer 112 are formed, thereby forming an embrittlement layer; and the bonding layer 110 is formed. In addition, the nitrogen-containing insulating layer 122 and the bonding layer 124 are formed over the supporting substrate 120. After the bonding layer 124 formed over the supporting substrate 120 and the bonding layer 110 formed over the semiconductor substrate are bonded to each other, laser beam irradiation is selectively performed from the supporting substrate 120 side, thereby making embrittlement of the embrittlement layer progress partially. Then, the semiconductor substrate is separated along the embrittlement layer by a physical method. Thus, the SOI substrate in which the semiconductor layer 130 is firmly bonded to the supporting substrate 120 is obtained. Note that it is preferable that after the separation of the semiconductor substrate, the surface (separation surface) of the obtained semiconductor layer 130 be planarized. In this embodiment mode, since embrittlement partially progresses in the embrittlement layer by laser beam irradiation before separating the semiconductor substrate by a physical method, the region where the embrittlement has progressed serves as a starting point (trigger) and separation can be easily performed. Note that ion irradiation for forming the embrittlement layer may be performed from the side where the bonding layer 110 is formed. After forming the embrittlement layer, the silicon oxide layer 114 and the nitrogen-containing insulating layer 112 may be formed.

Using a thermal oxidation method, a thermal oxide film may be formed on a surface of the semiconductor substrate. The thermal oxide film formed by a thermal oxidation method can function as a bonding layer.

Figure 4A:
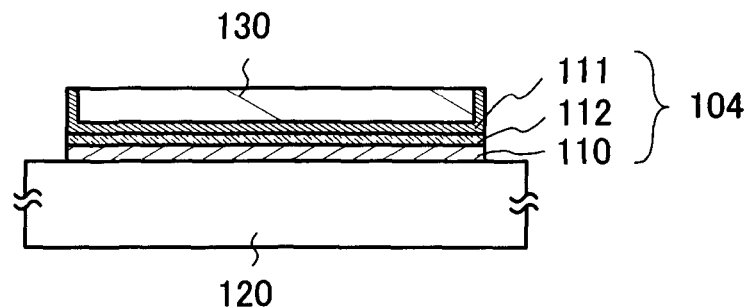
FIGS. 4A to 4C illustrate structural examples of an SOI substrate.

FIG. 4A illustrates an example in which a thermal oxide film 111 is formed by thermal oxidizing the semiconductor substrate; and the nitrogen-containing insulating layer 112 which is in contact with the thermal oxide film 111, and the bonding layer 110 are stacked. In other words, the thermal oxide film 111, the nitrogen-containing insulating layer 112, and the bonding layer 110 are formed from the semiconductor layer 130 side between the semiconductor layer 130, which is obtained by separation of the semiconductor substrate, and the supporting substrate 120. Note that by thermal oxidation of the semiconductor substrate, the thermal oxide film 111 is formed on side surfaces of the semiconductor layer 130 as well.

Figure 4B:
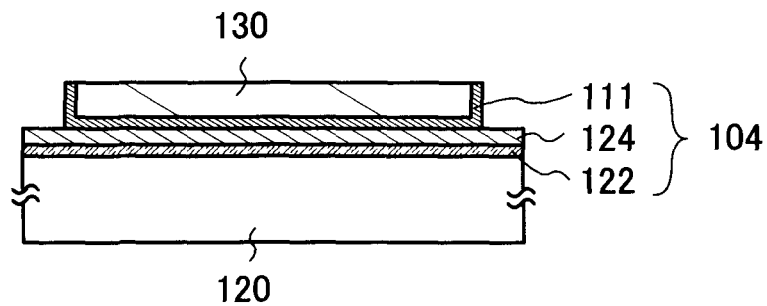

FIG. 4B illustrates an example in which the thermal oxide film 111 is formed by thermal oxidation of the semiconductor substrate, the nitrogen-containing insulating layer 122 and the bonding layer 124 are formed on the supporting substrate 120 side, and the thermal oxide film 111 and the bonding layer 124 are bonded to each other. In other words, the thermal oxide film 111, the bonding layer 124, and the nitrogen-containing insulating layer 122 are formed from the semiconductor layer 130 side between the semiconductor layer 130, which is obtained by separation of the semiconductor substrate, and the supporting substrate 120. In FIG. 4B, the thermal oxide film 111 functions as a bonding layer. Note that by thermal oxidation of the semiconductor substrate, the thermal oxide film 111 is formed on side surfaces of the semiconductor layer 130 as well.

Figure 4C:
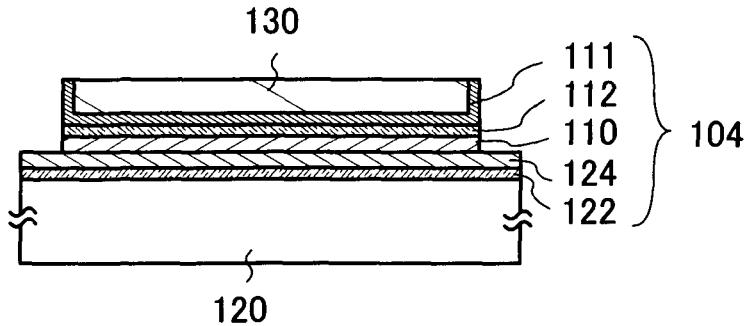

FIG. 4C illustrates an example in which the nitrogen-containing insulating layer 112 and the bonding layer 110 are formed over the semiconductor substrate with the thermal oxide film 111, which is formed by thermal oxidizing the semiconductor substrate, interposed therebetween; the nitrogen-containing insulating layer 122 and the bonding layer 124 are formed on the supporting substrate 120 side; and the bonding layer 110 and the bonding layer 124 are bonded to each other. In other words, the thermal oxide film 111, the nitrogen-containing insulating layer 112, the bonding layer 110, the bonding layer 124, and the nitrogen-containing insulating layer 122 are formed from the semiconductor layer 130 side between the semiconductor layer 130, which is obtained by separation of the semiconductor substrate, and the supporting substrate 120. Note that by thermal oxidation of the semiconductor substrate, the thermal oxide film 111 is formed on side surfaces of the semiconductor layer 130 as well.

Here, an example of a manufacturing method of the SOI substrate illustrated in FIG. 4A is described with reference to FIGS. 5A to 5F.

The semiconductor substrate 100 is prepared. The cleaned semiconductor substrate 100 is oxidized thermally, whereby the thermal oxide film 111 is formed (see FIG. 5A). As thermal oxidation, dry oxidation may be performed, and the thermal oxidation may be performed in an oxidizing atmosphere containing HCl or the like in addition to oxygen. When a silicon substrate is used as the semiconductor substrate 100, a silicon oxide layer is formed as the thermal oxide film 111.

Next, the embrittlement layer 102 is formed in a region at a predetermined depth of the semiconductor substrate 100. In addition, the nitrogen-containing insulating layer 112 and the bonding layer 110 are formed over the semiconductor substrate 100 with the thermal oxide film 111 interposed therebetween (see FIG. 5B).

The embrittlement layer 102 may be formed before formation of the nitrogen-containing insulating layer 112 or before formation of the nitrogen-containing insulating layer 112 and the bonding layer 110. In other words, the embrittlement layer 102 may be formed by ion irradiation from the thermal oxide film 111 side of the semiconductor substrate 100, or the embrittlement layer 102 may be formed by ion irradiation from the side of the semiconductor substrate 100, on which the thermal oxide film 111 and the nitrogen-containing insulating layer 112 are formed. Alternatively, the embrittlement layer 102 may be formed by ion irradiation from the side of the semiconductor substrate 100, on which the thermal oxide film 111, the nitrogen-containing insulating layer 112, and the bonding layer 110 are formed.

Next, the supporting substrate 120 and the semiconductor substrate 100 are bonded to each other. Here, the semiconductor substrate 100 and the supporting substrate 120 are bonded to each other with the nitrogen-containing insulating layer 112 and the bonding layer 110 interposed therebetween. The nitrogen-containing insulating layer 112 and the bonding layer 110 are formed over the semiconductor substrate 100 with the thermal oxide film 111 on the surface of the semiconductor substrate 100 interposed therebetween (see FIG. 5C).

Figure 5A:
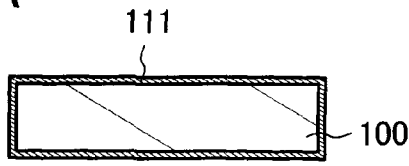
FIGS. 5A to 5F illustrate an example of a manufacturing method of an SOI substrate.
Figure 5B:
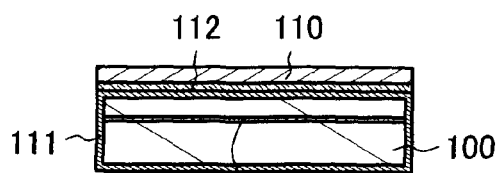
Figure 5C:
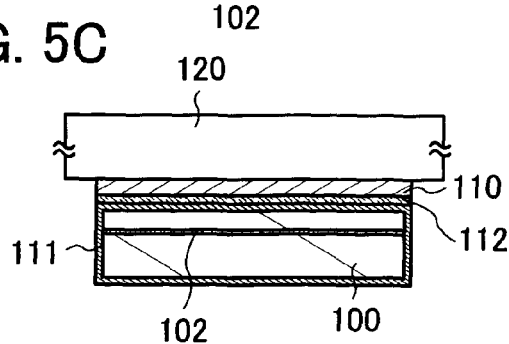
Figure 5D:
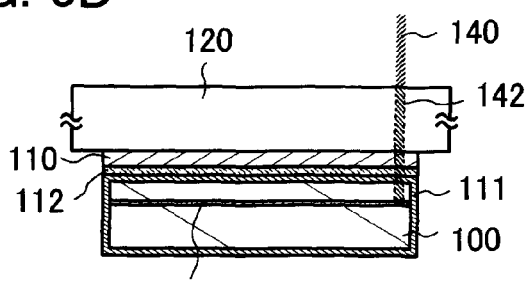
Figure 5E:
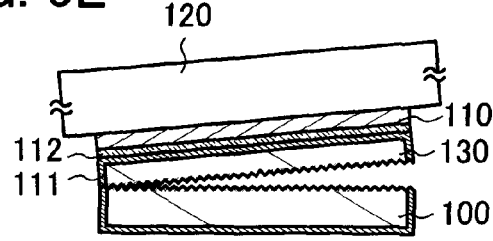
Figure 5F:
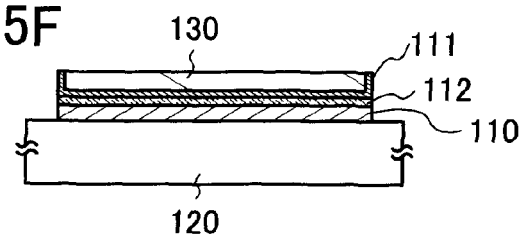

Next, the semiconductor substrate 100 is selectively irradiated with the laser beam 140 from the supporting substrate 120 side (see FIG. 5D). The embrittlement layer 102 in the irradiation region 142 with the laser beam 140 and the embrittlement layer 102 at the periphery of the irradiation region 142 are locally heated. Accordingly, the temperature is increased and hydrogen pressure in voids is increased; therefore, embrittlement progresses.

As the laser beam 140, a laser beam having such a wavelength as to be absorbed by the semiconductor substrate 100 and the embrittlement layer 102 formed in the semiconductor substrate 100, is employed. Irradiation with the laser beam 140 is performed so that the laser beam 140 reaches at least the embrittlement layer 102. The laser beam 140 preferably has a wavelength in the range of from a visible region to an ultraviolet region, and more preferably in the ultraviolet region. The embrittlement layer 102 in the irradiation region 142 is heated by absorption of the laser beam 140; therefore, embrittlement progresses. Note that the embrittlement layer 102 in the irradiation region 142 is, in some cases, melted by heating at the time of irradiation with the laser beam 140.

Then, the semiconductor substrate 100 is separated at the embrittlement layer 102 by a physical method. The semiconductor substrate 100 is bonded to the supporting substrate 120 with the bonding layer 110, which is formed over the thermal oxide film 111 and the nitrogen-containing insulating layer 112, interposed therebetween. Accordingly, as a result of the separation of the semiconductor substrate 100, the semiconductor layer 130 is left over the supporting substrate 120 (see FIG. 5D).

Embrittlement progresses partially in the embrittlement layer 102 by selective irradiation with the laser beam 140. When physical force is applied to the semiconductor substrate 100, the semiconductor substrate 100 can easily be separated starting from a portion where the embrittlement has progressed in the embrittlement layer 102. At this time, the semiconductor substrate 100 is separated along the embrittlement layer 102. Further, the time required for separation can be several seconds to several minutes approximately. The semiconductor substrate 100 is bonded to the supporting substrate 120 with the bonding layer 110 or the like interposed therebetween, and the semiconductor layer 130 having the same crystallinity as the semiconductor substrate 100 is left over the supporting substrate 120.

The physical method used for separating the semiconductor substrate 100 is not particularly limited, but for example, one of the semiconductor substrate 100 and the supporting substrate 120 which are bonded to each other can be fixed, and the other thereof can be separated off by application of physical force. The portion where the embrittlement has progressed (the region irradiated with the laser beam 140) in the embrittlement layer 102 serves as a starting point for separation; accordingly, the semiconductor substrate 100 can easily be separated along the embrittlement layer 102. A technique such as a vacuum chuck or a mechanical chuck may be used for fixation. Alternatively, separation can be carried out by a human hand.

After irradiation with the laser beam 140 and before separation of the semiconductor substrate 100 by a physical method, heat treatment at a temperature lower than a strain point of the supporting substrate 120 may be performed. By this heat treatment, embrittlement progresses in a region of the embrittlement layer 102 other than the region irradiated with the laser beam 140, and separation of the semiconductor substrate 100 can be easily performed. Note that in this case, the heat treatment plays a supporting role to the separation of the semiconductor substrate 100 by the physical method.

The semiconductor layer 130 transferred to the supporting substrate 120 has a surface (separation surface) whose planarity is deteriorated by the ion irradiation step and the separation step and where projections and depressions are formed. Further, the embrittlement layer 102 is left on the surface (separation surface) of the semiconductor layer 130 in some cases. If the surface of the semiconductor layer 130 has projections and depressions, it becomes difficult to form a thin gate insulating layer with excellent withstand voltage in formation of a semiconductor device with use of the obtained SOI substrate. Therefore, it is preferable to perform planarization treatment on the semiconductor layer 130 (see FIG. 5E).

In the above-described manner, the SOI substrate, in which the semiconductor layer 130 is firmly bonded to the supporting substrate 120 with the bonding layer 110, the nitrogen-containing insulating layer 112, and the thermal oxide film 111 interposed therebetween, can be manufactured.

In the manufacturing method of the SOI substrate according to this embodiment mode, the semiconductor substrate in which the embrittlement layer is formed and the supporting substrate are bonded to each other with the insulating layer interposed therebetween, and the semiconductor substrate is selectively irradiated with a laser beam so that embrittlement of the embrittlement layer is made to progress partially. Then, the semiconductor substrate is separated by a physical method. Since the region, where the embrittlement has progressed by laser beam irradiation, in the embrittlement layer serves as a starting point for separating the semiconductor substrate, separation can be easily performed. In addition, when the semiconductor substrate is separated by a physical method, manufacturing time of the SOI substrate can be shortened. Therefore, throughput in manufacturing SOI substrates is improved, which increases productivity.

Note that this embodiment mode can be implemented by being combined with any of other embodiment modes in this specification as appropriate.

Embodiment Mode 2

Although the example in which irradiation with a laser beam is performed from the supporting substrate direction is described in the above embodiment mode, an example of directly irradiating a semiconductor substrate with a laser beam will be described in Embodiment Mode 2 with reference to FIGS. 6A and 6B.

Figure 6A:
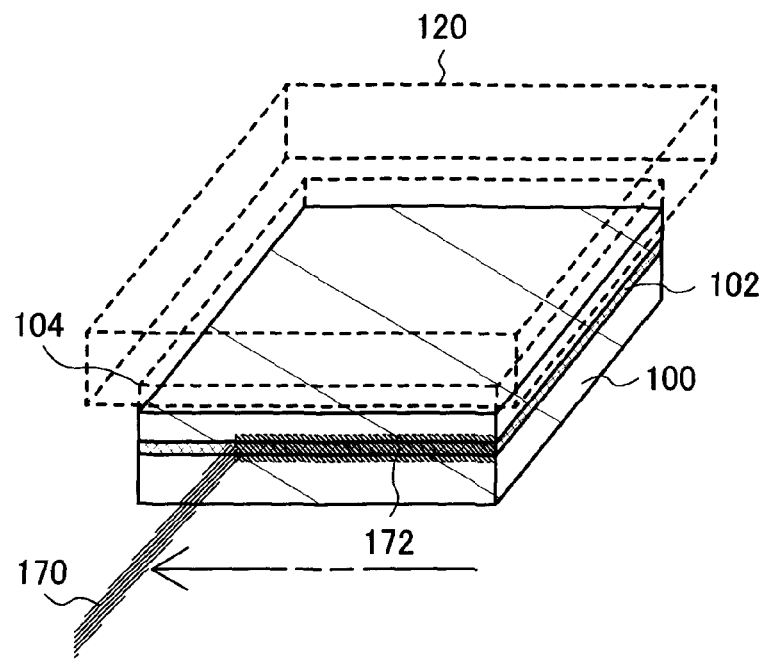
FIGS. 6A and 6B illustrate an example of laser beam irradiation.
Figure 6B:
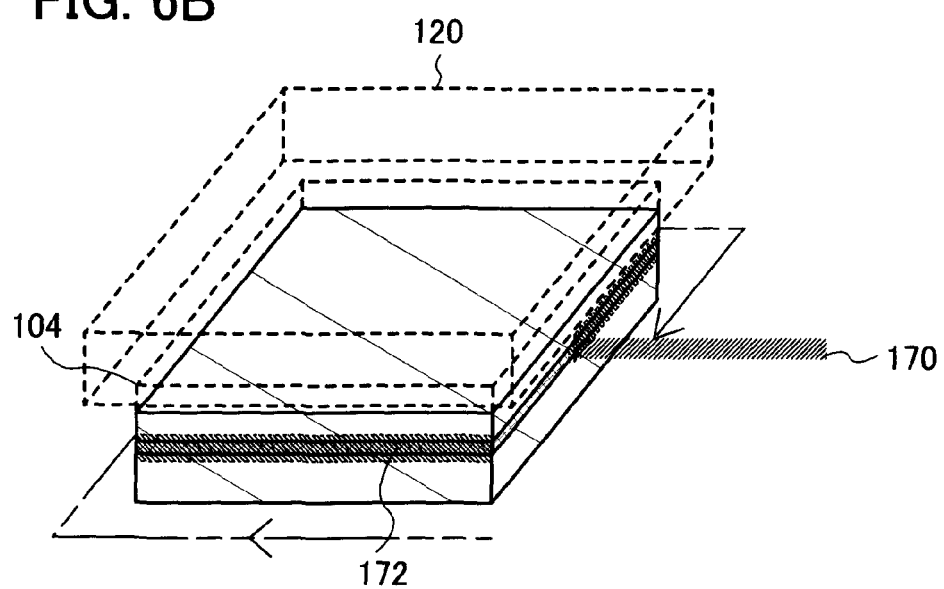

FIGS. 6A and 6B are schematic perspective views illustrating a semiconductor substrate 100 and a supporting substrate 120 which are bonded to each other with an insulating layer 104 interposed therebetween. An embrittlement layer 102 is formed in a region at a predetermined depth of the semiconductor substrate 100. With regard to the semiconductor substrate 100, the embrittlement layer 102, the supporting substrate 120, and the insulating layer 104, refer to description of those in Embodiment Mode 1. Further, in FIGS. 6A and 6B, the supporting substrate 120 and the insulating layer 104 are illustrated by dotted lines.

In this embodiment mode, side surfaces of the semiconductor substrate 100 are selectively irradiated with a laser beam 170. In addition, the irradiation is performed so that the laser beam 170 reaches the embrittlement layer 102. In the case where the embrittlement layer 102 is exposed on the side surfaces of the semiconductor substrate 100, the exposed embrittlement layer 102 may be directly irradiated with the laser beam 170.

The laser beam 170 has such a wavelength as to be absorbed by the semiconductor substrate 100. Specifically, the wavelength of the laser beam 170 is preferably in the range of from a visible region to an ultraviolet region (800 nm or lower), and more preferably in the ultraviolet region (400 nm or lower). As a laser beam used here, for example, a laser beam emitted from an XeCl excimer laser (oscillation wavelength: 308 nm), a second harmonic or a third harmonic of a YAG laser (oscillation wavelength: 1064 nm) which is a solid-state laser, a second harmonic or a third harmonic of a $YVO_4$ laser, a second harmonic or a third harmonic of a YLF laser, a laser beam emitted from an $Ar^+$ laser (oscillation wavelength: 364 nm), and the like can be given. Note that the laser used in this embodiment mode is not particularly limited as long as a laser beam with a desired oscillation wavelength (preferably in the range of from a visible region to an ultraviolet region, more preferably in the ultraviolet region) can be obtained from the laser. Further, either a continuous wave laser or a pulsed laser may be used.

The embrittlement layer 102 in an irradiation region 172, which is irradiated with the laser beam 170, absorbs the laser beam 170 to be heated, whereby embrittlement progresses. In other words, embrittlement progresses in the embrittlement layer 102 formed in the semiconductor substrate 100, along the irradiation region 172. For example, embrittlement of the embrittlement layer 102 exposed on the side surfaces of the semiconductor substrate 100 progresses in FIG. 6B. Note that the embrittlement layer 102 in the irradiation region 172 is, in some cases, melted by heating due to irradiation with the laser beam 170. A region where the embrittlement has progressed in the embrittlement layer 102 serves as a starting point (trigger) for separating the semiconductor substrate 100.

Then, the semiconductor substrate 100 is separated at the embrittlement layer 102 by a physical method, and a separation surface is planarized as needed; thus, an SOI substrate in which a semiconductor layer is fixed over the supporting substrate can be obtained. Since embrittlement of the embrittlement layer has partially progressed in advance due to laser beam irradiation, the semiconductor substrate 100 can be easily separated. Accordingly, an SOI substrate can be manufactured in high throughput; therefore, productivity is increased.

Since the side surfaces of the semiconductor substrate 100 are selectively irradiated with the laser beam 170 in this embodiment mode, the laser beam 170 preferably has a linear beam shape. For example, the length of the minor axis of the beam shape in a cross section in a perpendicular direction to a traveling direction of the laser beam 170 can be less than or equal to 1 μm, or less than or equal to 100 nm. Note that a major axis direction of the beam shape in the cross section in the perpendicular direction to the traveling direction of the laser beam 170 is preferably the same direction as a scanning direction of the laser beam 170. By doing so, damage to another layer can be reduced. In particular, the structure by which damage can be prevented is effective for the case where the semiconductor substrate is reused after the separation.

Although the structure in which laser beam irradiation is performed from the supporting substrate 120 side and the laser beam is transmitted through the supporting substrate 120 is employed in Embodiment Mode 1, the semiconductor substrate 100 is directly irradiated with a laser beam in this embodiment; accordingly, a substrate other than the light-transmitting substrate can be used as the supporting substrate 120. In other words, a substrate having an insulating surface or a substrate having an insulating property can be used as the supporting substrate 120, and for example, a metal substrate having a surface coated with an insulating layer can also be used.

Further, one feature of the manufacturing method of an SOI substrate according to this embodiment mode is that laser beam irradiation is performed before separation of the semiconductor substrate so that embrittlement of the embrittlement layer progresses partially in advance. The structure of the SOI substrate is not particularly limited, and for example, an SOI substrate having another structure described in this specification can be formed.

Note that this embodiment mode can be implemented by being combined with any of the other embodiment modes in this specification as appropriate.

Embodiment Mode 3

In Embodiment Mode 3, a manufacturing method of an SOI substrate, which is different from those in the above embodiment modes will be described.

Figure 7A:
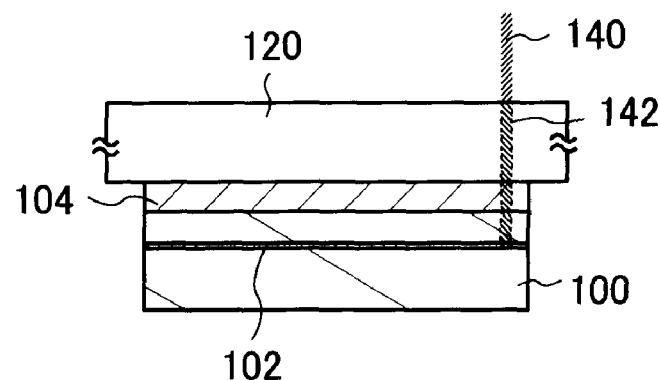
FIGS. 7A to 7C illustrate an example of a manufacturing method of an SOI substrate.

A semiconductor substrate 100 which includes an embrittlement layer 102 in a region at a predetermined depth and on a surface of which an insulating layer 104 is formed, and a supporting substrate 120 are prepared. Then, the semiconductor substrate 100 and the supporting substrate 120 are bonded to each other with the insulating layer 104 interposed therebetween. Next, selective irradiation with a laser beam 140 is performed from the supporting substrate 120 side to make embrittlement of an embrittlement layer 102 progress partially (see FIG. 7A).

In this embodiment mode, the formation order of the embrittlement layer 102 and the insulating layer 104 is not limited. After formation of the embrittlement layer 102 by irradiating the semiconductor substrate 100 with ions, the insulating layer 104 may be formed. Alternatively, after formation of the insulating layer 104 over the semiconductor substrate 100, the embrittlement layer 102 may be formed by irradiation with ions from the side on which the insulating layer 104 is formed. Further, in the case where the insulating layer 104 is formed to have a stacked structure, the semiconductor substrate 100 may be irradiated with ions during the stacking of the insulating layers, to form the embrittlement layer 102. Note that as an uppermost layer in the insulating layer 104, a bonding layer which has smoothness and can have a hydrophilic surface, such as a silicon oxide layer formed by a CVD method using organic silane as a source gas or a layer having a siloxane bond, is formed.

Further, using a thermal oxidation method, a thermal oxide film can also be formed on a surface of the semiconductor substrate 100. Furthermore, a stacked structure of a nitrogen-containing insulating layer and a bonding layer can be provided on the supporting substrate 120 side. When a bonding layer is provided on the supporting substrate 120 side, bonding strength between the supporting substrate and the semiconductor substrate can be increased.

Although an example where irradiation with the laser beam 140 is performed from the supporting substrate 120 side is described here, irradiation may be performed from the side surface side of the semiconductor substrate 100 as described in Embodiment Mode 2.

The beam shape of the laser beam 140, with which irradiation is performed from the supporting substrate 120 side, preferably has an area. For example, the laser beam 140 is preferably formed into a rectangular shape or an elliptic shape using an optical system. This is because since embrittlement progresses in the region irradiated with the laser beam 140 of the embrittlement layer 102, when the embrittlement progresses in the region having a certain amount of area, change in volume can be easily induced by later heat treatment.

Figure 7B:
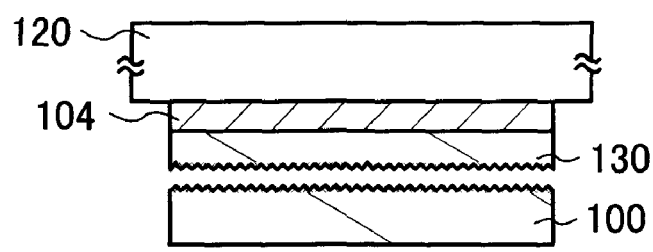

Next, heat treatment is performed to separate the semiconductor substrate 100 at the embrittlement layer 102. The semiconductor substrate 100 is bonded to the supporting substrate 120 with the insulating layer 104 interposed therebetween, and when a portion of the semiconductor substrate 100 is separated at the embrittlement layer 102, a semiconductor layer 130 is left over the supporting substrate 120 (see FIG. 7B).

Embrittlement progresses partially in the embrittlement layer 102 by irradiation with the laser beam 140, and heat treatment induces change in volume of microvoids which are formed in the embrittlement layer 102. When embrittlement of the embrittlement layer is made to progress partially by laser beam irradiation as described in this embodiment mode, the region where the embrittlement has progressed serves as a trigger and change in volume of the embrittlement layer 102 easily occurs, whereby the separation can be easily performed. Accordingly, the temperature of heat treatment can be lower and the processing time can be shorter, compared to those in the case where laser beam irradiation is not performed.

In the above-described manner, an SOI substrate in which the semiconductor layer 130 is firmly bonded to the supporting substrate 120 can be obtained.

Figure 7C:
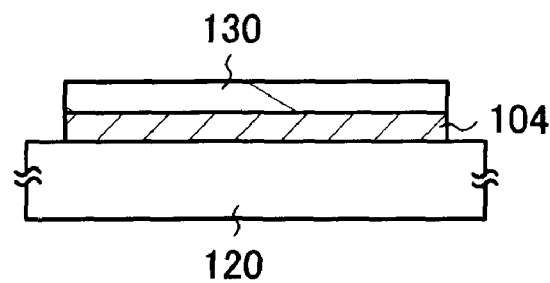

The semiconductor layer 130 transferred to the supporting substrate 120 has a surface (separation surface) whose planarity is deteriorated by the ion irradiation step and the separation step and where projections and depressions are formed. Further, the embrittlement layer 102 is, in some cases, left on the surface (separation surface) of the semiconductor layer 130. If the surface of the semiconductor layer 130 has projections and depressions, it becomes difficult to form a thin gate insulating layer with excellent withstand voltage in formation of a semiconductor device with use of the obtained SOI substrate. Therefore, it is preferable to perform planarization treatment on the semiconductor layer 130 (see FIG. 7C).

In the manufacturing method of the SOI substrate according to this embodiment mode, the semiconductor substrate in which the embrittlement layer is formed and the supporting substrate are bonded to each other with the insulating layer interposed therebetween, and the semiconductor substrate is selectively irradiated with a laser beam so that embrittlement of the embrittlement layer is made to progress partially. Then, heat treatment is performed to separate the semiconductor substrate. When heat treatment is performed for separation of the semiconductor substrate, the region, which is irradiated with a laser beam, in the embrittlement layer serves as a trigger and change in volume can be easily induced. Accordingly, the separation step can be realized, which is performed at lower temperature in shorter time than those of the separation step where separation is performed with only heat treatment without performing laser beam irradiation; accordingly, manufacturing time can be shortened. Therefore, throughput in manufacturing SOI substrates can be improved. Note that the structure of the SOI substrate is not particularly limited, and an SOI substrate having another structure described in this specification may be formed.

Note that this embodiment mode can be implemented by being combined with any of the other embodiment modes in this specification as appropriate.

Embodiment Mode 4

In Embodiment Mode 4, an example of manufacturing a semiconductor device using the SOI substrate described in the above embodiment modes will be described with reference to FIGS. 13A to 13D and FIGS. 14A and 14B.

Figure 13A:
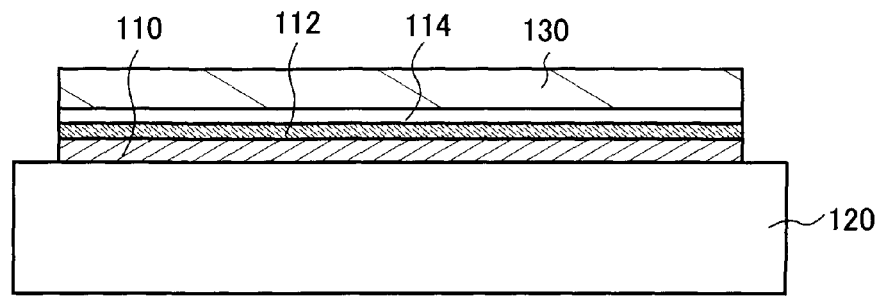
FIGS. 13A to 13D illustrate an example of a manufacturing method of a semiconductor device.

An SOI substrate is prepared (see FIG. 13A). In this embodiment mode, the SOI substrate illustrated in FIG. 3A, in which the semiconductor layer 130 is firmly bonded to the supporting substrate 120 with the bonding layer 110, the nitrogen-containing insulating layer 112, and the silicon oxide layer 114 stacked in this order interposed therebetween, is employed as an example. Note that the structure of the SOI substrate employed is not particularly limited, and an SOI substrate having another structure described in this specification can be employed.

As the supporting substrate 120, a substrate having an insulating surface or a substrate having an insulating property and a light-transmitting property with respect to ultraviolet light or visible light is employed. For example, a variety of glass substrates used for electronic industry (also called an "alkali-free glass substrate") such as an aluminosilicate glass substrate, an aluminoborosilicate glass substrate, or a barium borosilicate glass substrate; a quartz substrate; a crystallized glass substrate, a sapphire substrate; or the like can be used.

As the bonding layer 110, a layer which has smoothness and can have a hydrophilic surface is formed, and for example, a silicon oxide layer or a layer having a siloxane bond is formed. The nitrogen-containing insulating layer 112 serves as a blocking layer, and for example, a silicon nitride layer or a silicon nitride oxide layer may be formed. The nitrogen-containing insulating layer 112 can block diffusion of metal impurities from the supporting substrate 120 to the semiconductor layer 130 side. As the silicon oxide layer 114, a silicon oxide layer or a silicon oxynitride layer is formed. When the silicon oxide layer 114 is located between the semiconductor layer 130 and the nitrogen-containing insulating layer 112, deterioration of interface characteristics due to formation of trap levels can be prevented. In addition, when the bonding layer 110 is located between the nitrogen-containing insulating layer 112 and the supporting substrate 120, the bonding layer 110 reduces internal stress of the nitrogen-containing insulating layer 112; accordingly, distortion due to stress by different materials can be reduced.

The thicknesses of the bonding layer 110, the nitrogen-containing insulating layer 112, and the silicon oxide layer 114 may be determined as appropriate by a practitioner. For example, the thickness of the bonding layer 110 can be 0.2 nm to 500 nm (in the case of forming the bonding layer 110 by a CVD method, 10 nm to 500 nm), the thickness of the nitrogen-containing insulating layer 112 can be 10 nm to 500 nm, and the thickness of the silicon oxide layer 114 can be 10 nm to 500 nm. As an example, a silicon oxide layer with a thickness of 50 nm can be formed as the bonding layer 110, a silicon nitride oxide layer with a thickness of 50 nm can be formed as the nitrogen-containing insulating layer 112, and a silicon oxynitride layer with a thickness of 100 nm can be formed as the silicon oxide layer 114.

The thickness of the semiconductor layer 130 is 5 nm to 300 nm, preferably 10 nm to 200 nm, and more preferably 10 nm to 60 nm. The thickness of the semiconductor layer 130 can be set as appropriate by controlling the depth at which the embrittlement layer 102 described in above embodiment mode is formed. Further, the semiconductor layer 130 of the SOI substrate may be thinned by etching or the like to have a desired thickness. The semiconductor layer 130 can be thinned by dry etching with use of a chlorine-based gas such as $Cl_2$, $BCl_3$, or $SiC_4$; a fluorine-based gas such as $CF_4$, $NF_3$, or $SF_6$; an HBr gas; or the like. It is also possible to partly change the semiconductor layer 130 in quality by oxidation treatment, nitridation treatment, or the like and etch the quality-changed portion selectively. Alternatively, the semiconductor layer 130 can be thinned utilizing polishing such as CMP treatment or liquid jet polishing.

To the semiconductor layer 130, a p-type impurity element such as boron, aluminum, or gallium or an n-type impurity element such as phosphorus or arsenic is preferably added in accordance with a formation region of an n-channel field-effect transistor. Similarly, an n-type impurity element such as phosphorus or arsenic or a p-type impurity element such as boron, aluminum, or gallium is preferably added in accordance with a formation region of a p-channel field-effect transistor. For example, a p-type impurity element is added to a formation region of an n-channel field-effect transistor and an n-type impurity element is added to a formation region of a p-channel field-effect transistor, whereby so-called well regions are formed. The dose of impurity ions may be approximately greater than or equal to $1\times10^{12}$ ions/$cm^2$ and less than or equal to $1\times10^{14}$ ions/$cm^2$. Furthermore, in the case of controlling the threshold voltage of the field-effect transistor, a p-type impurity element or an n-type impurity element may be added into the well region.

Figure 13B:
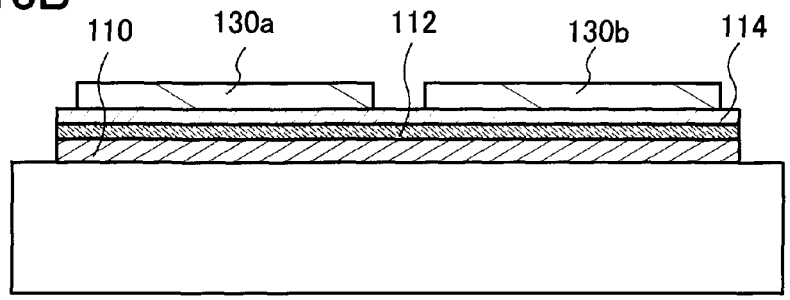
Figure 13C:
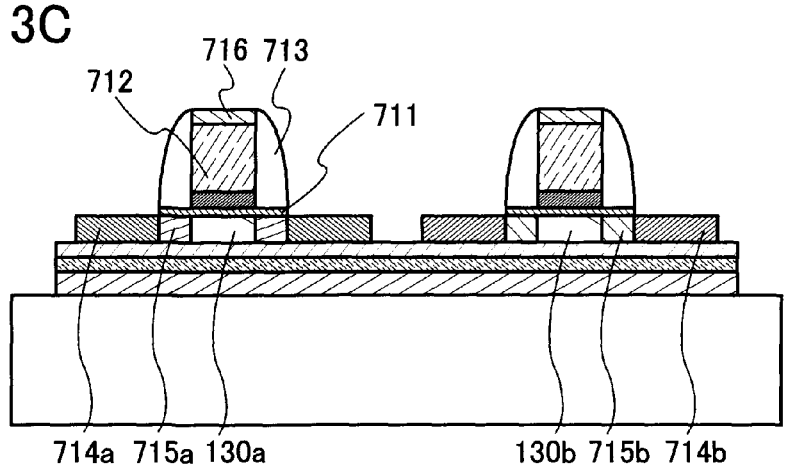

Next, the semiconductor layer 130 is selectively etched to form a semiconductor layer 130a and a semiconductor layer 130b which are separated into island shapes in accordance with arrangement of semiconductor elements (see FIG. 13B).

Note that, although the example in which element isolation is performed by etching of the semiconductor layer 130 into island shapes is described in this embodiment mode, the present invention is not particularly limited thereto. For example, element isolation may be performed by embedding an insulating layer between semiconductor films in accordance with arrangement of the semiconductor elements.

Next, a gate insulating layer 711, a gate electrode 712, and sidewall insulating layers 713 are formed over each of the semiconductor layers 130a and 130b. The sidewall insulating layers 713 are formed on side surfaces of the gate electrode 712. Then, first impurity regions 714a and second impurity regions 715a are formed in the semiconductor layer 130a, and first impurity regions 714b and second impurity regions 715b are formed in the semiconductor layer 130b. An insulating layer 716 is formed over the gate electrode 712. The insulating layer 716 is formed using a silicon nitride film, and is used as a hard mask for etching in formation of the gate electrode 712 (see FIG. 13C).

Figure 13D:
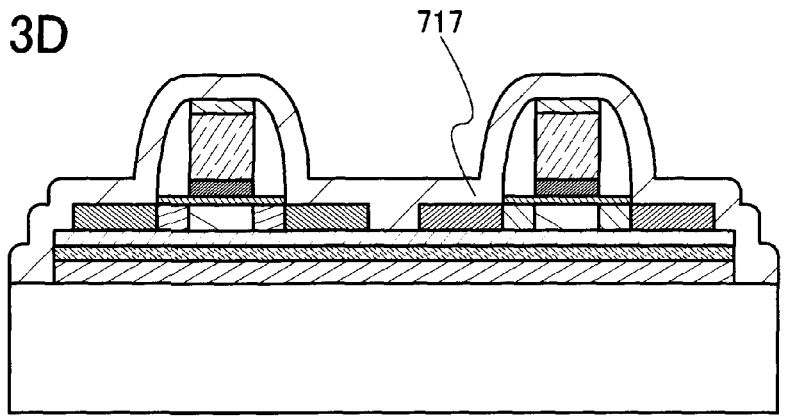
Figure 14A:
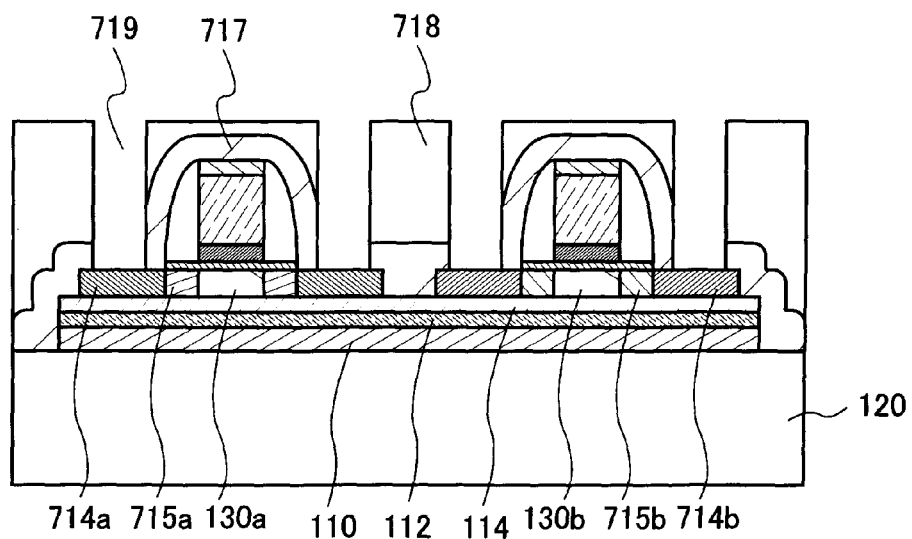
FIGS. 14A and 14B illustrate an example of a manufacturing method of a semiconductor device.
Figure 14B:
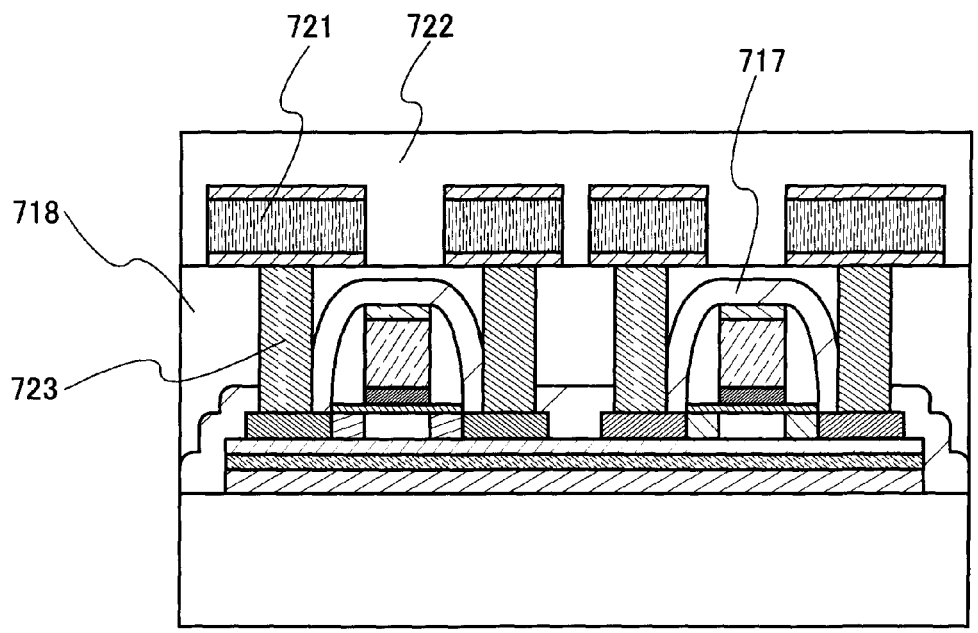

Next, a protective layer 717 is formed so as to cover the gate electrodes 712 and the like provided for the SOI substrate (see FIG. 13D). Further, the nitrogen-containing insulating layer 112 has an effect of preventing metal impurities from being diffused from the supporting substrate 120 side, while the protective layer 717 has an effect of preventing contamination with metal impurities from an upper layer side. In this embodiment mode, the lower layer side and the upper layer side of the semiconductor layer 130 which has excellent crystallinity are coated with an insulating layer which has a high blocking effect of metal impurities having high mobility, such as sodium. Thus, electric characteristics of the semiconductor elements manufactured using the semiconductor layer 130 can be improved.

An interlayer insulating layer 718 is formed over the protective layer 717. As the interlayer insulating layer 718, a boron phosphorus silicon glass (BPSG) layer may be formed or an organic resin typified by polyimide may be formed by coating. Then, contact holes 719 are formed in the interlayer insulating layer 718.

Next, a step of forming wirings is described. Contact plugs 723 are formed in the contact holes 719. As the contact plugs 723, tungsten silicide is formed by a CVD method using a $WF_6$ gas and a $SiH_4$ gas to fill the contact holes 719. Alternatively, tungsten may be formed by hydrogen reduction of $WF_6$ and embedded in the contact holes 719. After that, wirings 721 are formed in accordance with the contact plugs 723. The wirings 721 are formed using aluminum or an aluminum alloy, and an upper layer and a lower layer thereof are formed using a metal film of molybdenum, chromium, titanium, or the like as barrier metal. Furthermore, an interlayer insulating layer 722 is formed thereover (see FIG. 14B). The wirings may be provided as appropriate, and a multilayer wiring may be formed by further forming a wiring layer thereover. In that case, a damascene process may be employed.

In the above-described manner, field-effect transistors can be manufactured using an SOI substrate in which the semiconductor layers are firmly bonded to the supporting substrate. In the present invention, manufacturing time of an SOI substrate can be shortened; therefore, throughput is improved. Thus, by using an SOI substrate of the present invention, a field-effect transistor can be manufactured with high productivity. Furthermore, application of the present invention makes it possible to form the semiconductor layer 130 using a single-crystalline semiconductor, and thus higher performance of the semiconductor device can be achieved.

Note that this embodiment mode can be implemented by being combined with any of the other embodiment modes in this specification as appropriate.

Embodiment Mode 5

In Embodiment Mode 5, an example of manufacturing a semiconductor device with the used of an SOI substrate of the present invention will be described with reference to FIGS. 9A to 9E, FIGS. 10A to 10C, and FIGS. 11A and 11B, and FIGS. 12A and 12B. Here, an example of manufacturing an electroluminescent (EL) display device will be described.

Figure 9A:
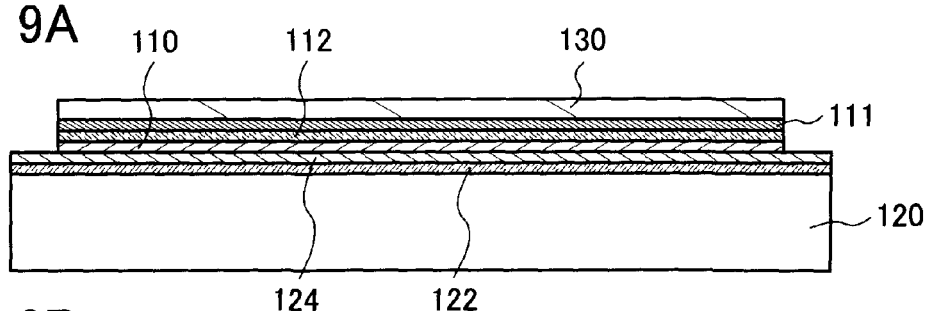
FIGS. 9A to 9E illustrate an example of a manufacturing method of an electroluminescent display device.

An SOI substrate is prepared (see FIG. 9A). In this embodiment mode, the SOI substrate illustrated in FIG. 4C, in which the semiconductor layer 130 is firmly bonded to the supporting substrate 120 with the nitrogen-containing insulating layer 122, the bonding layer 124, the bonding layer 110, the nitrogen-containing insulating layer 112, and the thermal oxide film 111 stacked in this order interposed therebetween, is employed as an example. Note that the structure of the SOI substrate employed is not particularly limited, and an SOI substrate having another structure described in this specification can be employed.

As the supporting substrate 120, a substrate having an insulating surface or a substrate having an insulating property and a light-transmitting property with respect to ultraviolet light or visible light is employed. For example, a variety of glass substrates used for electronic industry (also called an "alkali-free glass substrate") such as an aluminosilicate glass substrate, an aluminoborosilicate glass substrate, or a barium borosilicate glass substrate; a quartz substrate; a crystallized glass substrate, a sapphire substrate; or the like can be used.

A layer which has smoothness and can form a hydrophilic surface is formed as the bonding layer 110 and the bonding layer 124. For example, a silicon oxide film or a film which has a siloxane bond is formed. Note that formation of the bonding layer 124 needs to be performed in consideration of the heat resistance of the supporting substrate 120. When a glass substrate is used as the supporting substrate 120, the bonding layer 124 is formed at a temperature of less than or equal to 650° C. For example, the bonding layer 124 can be formed by a CVD method with use of organic silane such as TEOS as a source gas. As the nitrogen-containing insulating layer 122 provided between the supporting substrate 120 and the bonding layer 124, a film which has an effect of blocking metal impurities, such as a silicon nitride layer, a silicon nitride oxide layer, or an aluminum nitride layer is formed. Note that, in the case where the bonding layer 124 and the nitrogen-containing insulating layer 122 are formed over the supporting substrate 120, the nitrogen-containing insulating layer 122 is formed as a bottom layer (on the supporting substrate 120 side) and the bonding layer 124 is formed as an upper layer (the semiconductor layer 130 side), whereby internal stress of the nitrogen-containing insulating layer 122 can be reduced. The nitrogen-containing insulating layer 112 may be formed using a silicon nitride layer or a silicon nitride oxide layer. Since the thermal oxide film 111 is formed by thermal oxidation of a semiconductor substrate, it is also formed on side surfaces of the semiconductor layer 130.

The thicknesses of the nitrogen-containing insulating layer 122, the bonding layer 124, the bonding layer 110, the nitrogen-containing insulating layer 112, and the thermal oxide film 111 may be determined as appropriate by a practitioner. The thickness of the thermal oxide film 111 can be controlled by processing time, heating temperature, and the like at the time of thermal oxidation.

The thickness of the semiconductor layer 130 is 5 nm to 300 nm, preferably 10 nm to 200 nm, and more preferably 10 nm to 60 nm. The thickness of the semiconductor layer 130 can be set as appropriate by controlling the depth at which the embrittlement layer 102 described in above embodiment mode is formed. Further, the semiconductor layer 130 of the SOI substrate may be thinned by etching or the like to have a desired thickness. The semiconductor layer 130 can be thinned by dry etching with use of a chlorine-based gas such as $Cl_2$, $BCl_3$, or $SiCl_4$; a fluorine-based gas such as $CF_4$, $NF_3$, or $SF_6$; an HBr gas; or the like. It is also possible to partly change the semiconductor layer 130 in quality by oxidation treatment, nitridation treatment, or the like and etch the quality-changed portion selectively. Alternatively, the semiconductor layer 130 can be thinned utilizing polishing such as CMP treatment or liquid jet polishing.

To the semiconductor layer 130, a p-type impurity element such as boron, aluminum, or gallium or an n-type impurity element such as phosphorus or arsenic is preferably added in accordance with a formation region of an n-channel field-effect transistor. Similarly, an n-type impurity element such as phosphorus or arsenic or a p-type impurity element such as boron, aluminum, or gallium is preferably added in accordance with a formation region of a p-channel field-effect transistor. For example, a p-type impurity element is added to a formation region of an n-channel field-effect transistor and an n-type impurity element is added to a formation region of a p-channel field-effect transistor, whereby so-called well regions are formed. The dose of impurity ions may be approximately greater than or equal to $1\times10^{12}$ ions/cm$^2$ and less than or equal to $1\times10^{14}$ ions/cm$^2$. Furthermore, in the case of controlling the threshold voltage of the field-effect transistor, a p-type impurity element or an n-type impurity element may be added into the well region.

Figure 9B:
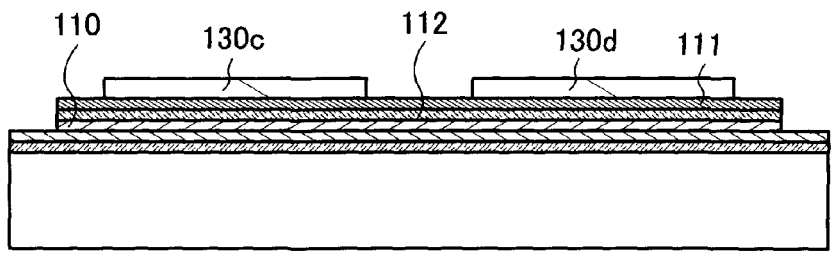

Next, the semiconductor layer 130 is selectively etched to form a semiconductor layer 130c and a semiconductor layer 130d which are separated into island shapes in accordance with arrangement of semiconductor elements (see FIG. 9B).

Figure 9C:
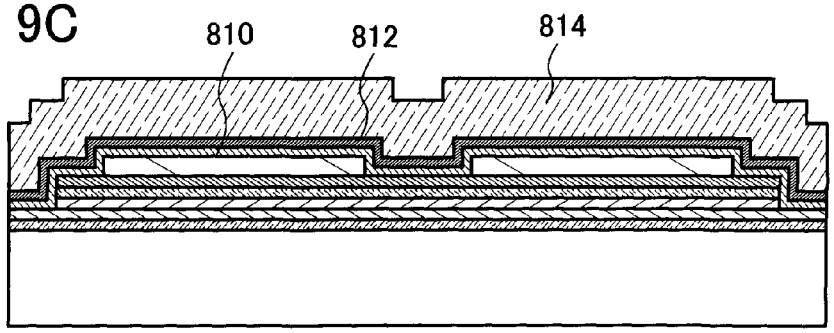

Then, a gate insulating layer 810, and a first conductive layer 812 and a second conductive layer 814 for forming gate electrodes are sequentially formed over the semiconductor layer 130c and the semiconductor layer 130d (see FIG. 9C).

The gate insulating layer 810 is formed as a single-layer film or a stacked-layer film using an insulating layer such as a silicon oxide layer, a silicon oxynitride layer, a silicon nitride layer, or a silicon nitride oxide layer by a CVD method, a sputtering method, an atomic layer epitaxy method, or the like.

Further, the gate insulating layer 810 may be formed in such a manner that plasma treatment is performed on the semiconductor layers 130c and 130d to oxidize or nitride surfaces thereof. Plasma treatment in this case also includes plasma treatment with plasma excited using microwaves (a typical frequency is 2.45 GHz). For example, treatment with plasma that is excited by microwaves and has an electron density of $1\times10^{11}$/cm$^3$ to $1\times10^{13}$/cm$^3$ inclusive and an electron temperature of 0.5 eV to 1.5 eV inclusive is also included. Oxidation treatment or nitridation treatment of the surface of the semiconductor layer with such plasma treatment makes it possible to form a thin and dense film. In addition, since the surface of the semiconductor layer is directly oxidized, a film which has good interface characteristics can be obtained. Note that the gate insulating layer 810 may be formed in such a manner that plasma treatment using a microwave is performed on a film formed by a CVD method, a sputtering method, or an atomic layer epitaxy method.

Since the gate insulating layer 810 forms the interface with the semiconductor layers, the gate insulating layer 810 is preferably formed so that a silicon oxide layer or a silicon oxynitride layer is located at the interface. This is because, if a film in which the amount of nitrogen is higher than that of oxygen such as a silicon nitride layer or a silicon nitride oxide layer is formed, problems of interface characteristics such as generation of trap levels might be caused.

The conductive layer which forms the gate electrode is formed as a single-layer film or a stacked-layer film using an element selected from tantalum, tantalum nitride, tungsten, titanium, molybdenum, aluminum, copper, chromium, or niobium, an alloy material or a compound material containing the element as its main component, or a semiconductor material typified by polycrystalline silicon doped with an impurity element such as phosphorus, by a CVD method or a sputtering method. When the conductive layer is formed as a stacked-layer film, it can be formed using different conductive materials or can be formed using the same conductive material. In this embodiment mode, an example in which the first conductive layer 812 and the second conductive layer 814 form the gate electrode, is described.

If the conductive layer for forming the gate electrode has a two-layer structure of the first conductive layer 812 and the second conductive layer 814, stacked layers of a tantalum nitride layer and a tungsten layer, a tungsten nitride layer and a tungsten layer, or a molybdenum nitride layer and a molybdenum layer can be formed, for example. Note that a stacked film of a tantalum nitride layer and a tungsten layer is preferable because etching rates of both layers are easily differentiated from each other and high selectivity can be obtained. Note that, in the two-layer films which are exemplified, the first mentioned layer is preferably formed over the gate insulating layer 810. In this embodiment mode, the first conductive layer 812 is formed with a thickness of 20 nm to 100 nm inclusive. The second conductive layer 814 is formed with a thickness of 100 nm to 400 nm inclusive. The gate electrode can also have a stacked structure of three or more layers; in that case, it is preferable to employ a stacked structure of a molybdenum layer, an aluminum layer, and a molybdenum layer.

Next, a resist mask 820c and a resist mask 820d are selectively formed over the second conductive layer 814. Then, first etching treatment and second etching treatment are performed using the resist masks 820c and 820d.

Figure 9D:
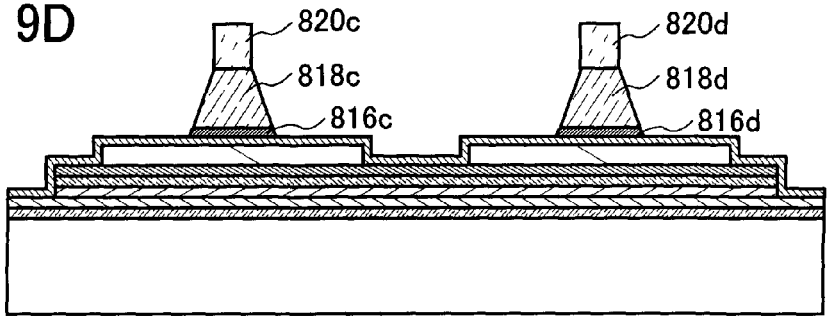

First, the first conductive layer 812 and the second conductive layer 814 are selectively etched by the first etching treatment to form a first conductive layer 816c and a second conductive layer 818c over the semiconductor layer 130c, and to form a first conductive layer 816d and a second conductive layer 818d over the semiconductor layer 130d (see FIG. 9D).

Figure 9E:
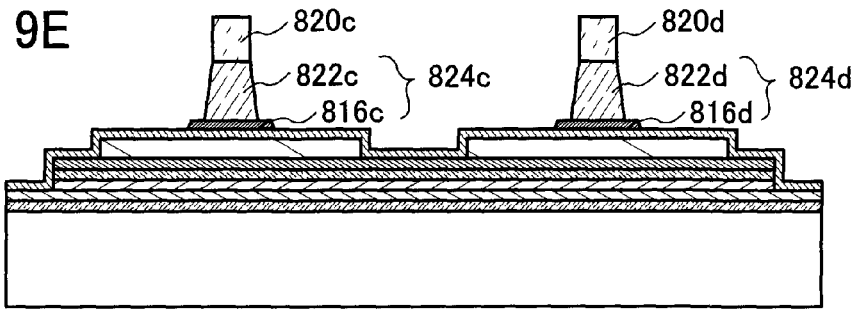
Figure 10A:
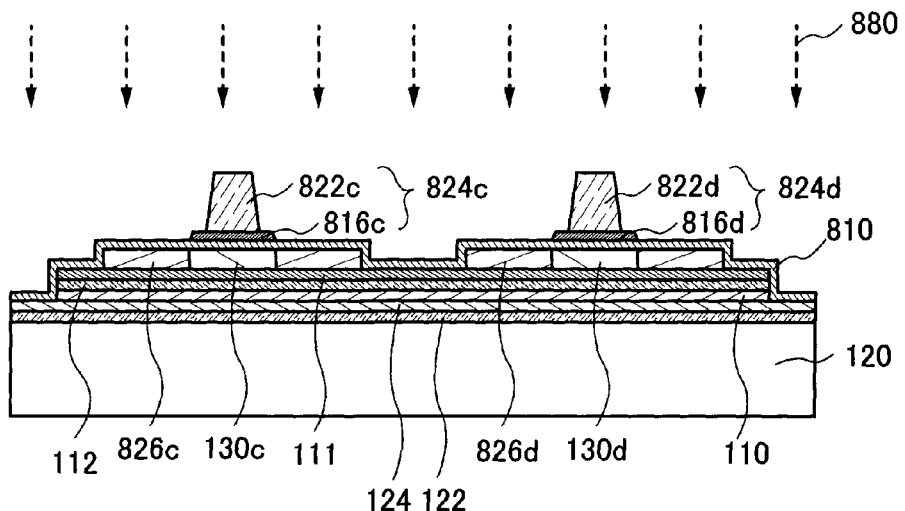
FIGS. 10A to 10C illustrate an example of a manufacturing method of an electroluminescent display device.
Figure 10B:
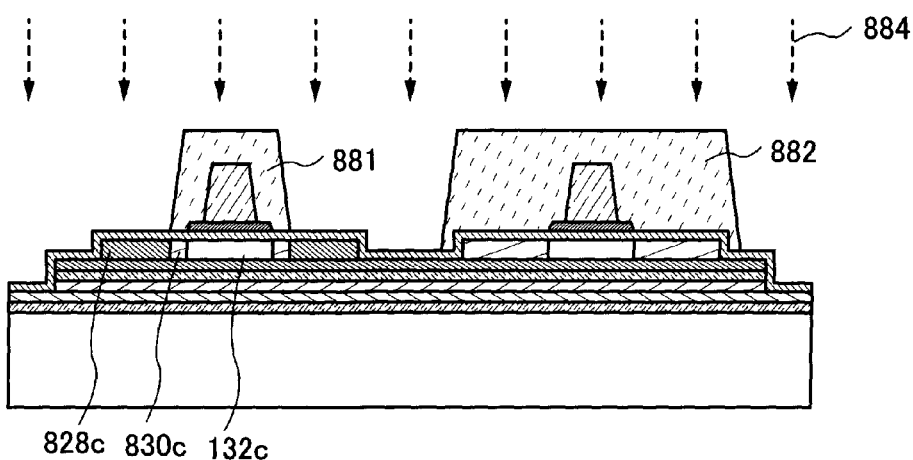
Figure 10C:
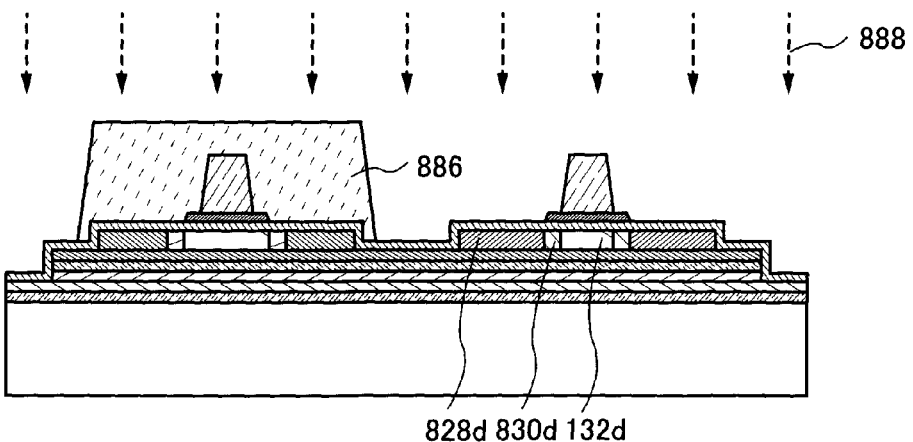

Next, edge portions of the second conductive layer 818c and the second conductive layer 818d are selectively etched by the second etching treatment to form a second conductive layer 822c and a second conductive layer 822d (see FIG. 9E). The second conductive layers 822c and 822d are formed so as to have smaller widths (lengths parallel to a direction in which carriers flow through channel formation regions (a direction in which a source region and a drain region are connected)) than those of the first conductive layers 816c and 816d. In this manner, a gate electrode 824c formed of the first conductive layer 816c and the second conductive layer 822c, and a gate electrode 824d formed of the first conductive layer 816d and the second conductive layer 822d can be obtained.

The etching method applied to the first etching treatment and the second etching treatment may be determined as appropriate. When the etching rate is desired to be improved, it is preferable to use a dry etching apparatus using a high-density plasma source by an electron cyclotron resonance (ECR) method, an inductively coupled plasma (ICP) method, or the like. With appropriate control of the etching condition of the first etching treatment and the second etching treatment, side surfaces of the first conductive layers 816c and 816d and the second conductive layers 822c and 822d can each have a desired tapered shape. After forming the gate electrodes 824c and 824d with desired shapes, the resist masks 820c and 820d may be removed.

Next, an impurity element 880 is added into the semiconductor layers 130c and 130d using the gate electrodes 824c and 824d as masks. In the semiconductor layer 130c, a pair of first impurity regions 826c are formed in a self-aligned manner using the first conductive layer 816c and the second conductive layer 822c as masks. In the semiconductor layer 130d, a pair of first impurity regions 826d are formed in a self-aligned manner using the first conductive layer 816d and the second conductive layer 822d as masks (see FIG. 10A).

As the impurity element 880, a p-type impurity element such as boron, aluminum, or gallium, or an n-type impurity element such as phosphorus or arsenic is added. Here, phosphorus, which is an n-type impurity element, is added so as to be contained at a concentration of about $1\times10^{17}$ atoms/cm$^3$ to $5\times10^{18}$ atoms/cm$^3$ inclusive.

Then, a resist mask 882 is formed selectively so as to cover the semiconductor layer 130d. Further, a resist mask 881 is formed so as to cover the semiconductor layer 130c partly. Then, an impurity element 884 is added with use of the resist mask 882 and the resist mask 881 as masks to form a pair of second impurity regions 828c, a pair of third impurity regions 830c, and a channel formation region 132c in the semiconductor layer 130c (see FIG. 10B).

As the impurity element 884, a p-type impurity element such as boron, aluminum, or gallium, or an n-type impurity element such as phosphorus or arsenic is added. Here, phosphorus, which is an n-type impurity element, is added so as to be contained at a concentration of about $5\times10^{19}$ atoms/cm$^3$ to $5\times10^{20}$ atoms/cm$^3$ inclusive.

In the semiconductor layer 130c, the second impurity regions 828c are formed in regions which overlap with neither the first conductive layer 816c nor the second conductive layer 822c. The channel formation region 132c is formed in a region which overlaps with the first conductive layer 816c. The third impurity regions 830c are formed in regions which are located between the channel formation region 132c and the second impurity regions 828c and overlap with neither the first conductive layer 816c nor the second conductive layer 822c. Further, the third impurity regions 830c are located in regions which overlap with neither the first conductive layer 816c nor the second conductive layer 822c but overlap with the resist mask 881. The second impurity regions 828c function as a source region and a drain region. The third impurity regions 830c function as LDD regions. In this embodiment mode, the second impurity regions 828c have higher impurity concentrations than the third impurity regions 830c.

An LDD region means a region to which an impurity element is added at a low concentration and which is formed between a channel formation region and a source or drain region that is formed by adding the impurity element at a high concentration. Forming an LDD region has an effect of alleviating an electric field near a drain region, thereby preventing deterioration due to hot carrier injection. Further, a structure in which an LDD region overlaps with a gate electrode with a gate insulating layer interposed therebetween (also called a "gate-drain overlapped LDD (GOLD) structure") may also be employed in order to prevent deterioration of an on-current value due to hot carrier.

Next, the resist masks 881 and 882 are removed, and then a resist mask 886 is formed so as to cover the semiconductor layer 130c. An impurity element 888 is added using the resist mask 886, the first conductive layer 816d, and the second conductive layer 822d as masks, whereby a pair of second impurity regions 828d, a pair of third impurity regions 830d, and a channel formation region 132d are formed in the semiconductor layer 130d (see FIG. 10C).

As the impurity element 888, a p-type impurity element such as boron, aluminum, or gallium, or an n-type impurity element such as phosphorus or arsenic is added. Here, boron that is a p-type impurity element is added so as to be contained at a concentration of about $1\times10^{20}$ atoms/cm$^3$ to $5\times10^{21}$ atoms/cm$^3$ inclusive.

In the semiconductor layer 130d, the second impurity regions 828d are formed in regions which overlap with neither the first conductive layer 816d nor the second conductive layer 822d. The third impurity regions 830d are formed in regions which overlap with the first conductive layer 816d and do not overlap with the second conductive layer 822d, by penetration of the impurity element 888 through the first conductive layer 816d. The second impurity regions 828d function as a source region and a drain region. The third impurity regions 830d function as LDD regions. In this embodiment mode, the second impurity regions 828d have higher impurity concentrations than the third impurity regions 830d.

Next, an interlayer insulating layer is formed. The interlayer insulating layer can be formed as a single-layer film or a stacked-layer film; in this embodiment mode, the interlayer insulating layer has a two-layer structure of an insulating layer 832 and an insulating layer 834 (see FIG. 11A).

As the interlayer insulating layer, a silicon oxide layer, a silicon oxynitride layer, a silicon nitride layer, a silicon nitride oxide layer, or the like can be formed by a CVD method or a sputtering method. Alternatively, the interlayer insulating layer can be formed using an organic material such as polyimide, polyamide, polyvinyl phenol, benzocyclobutene, acrylic, or epoxy; a siloxane material such as a siloxane resin; an oxazole resin; or the like by an application method such as a spin coating method. It is to be noted that the siloxane material corresponds to a material that contains an Si—O—Si bond. Siloxane has a skeleton structure formed by a bond of silicon (Si) and oxygen (O). An organic group containing at least hydrogen (e.g., alkyl group or aromatic hydrocarbon) is used as a substituent. A fluoro group may be included in the organic group. The oxazole resin is, for example, photosensitive polybenzoxazole or the like. Photosensitive polybenzoxazole is a material which has a low dielectric constant (a dielectric constant of 2.9 at 1 MHz at room temperature), high heat resistance (according to results of thermogravimetry-differential thermal analysis (TG-DTA), it has a thermal decomposition temperature of 550° C. at a rate of temperature increase of 5° C./min), and a low water absorption coefficient (0.3 wt % at room temperature for 24 hours). The oxazole resin which has a lower dielectric constant (about 2.9) than polyimide or the like (about 3.2 to 3.4) can suppress generation of parasitic capacitance and can perform high-speed operation.

For example, a silicon nitride oxide layer is formed to a thickness of 100 nm as the insulating layer 832, and a silicon oxynitride layer is formed to a thickness of 900 nm as the insulating layer 834. In addition, the insulating layer 832 and the insulating layer 834 are successively formed by a plasma CVD method. The interlayer insulating layer may also have a stacked structure including three or more layers. Alternatively, a stacked structure of a silicon oxide layer, a silicon oxynitride layer, or a silicon nitride layer and an insulating layer formed using an organic material such as polyimide, polyamide, polyvinyl phenol, benzocyclobutene, acrylic, or epoxy; a siloxane material such as a siloxane resin; or an oxazole resin can be employed.

Figure 11A:
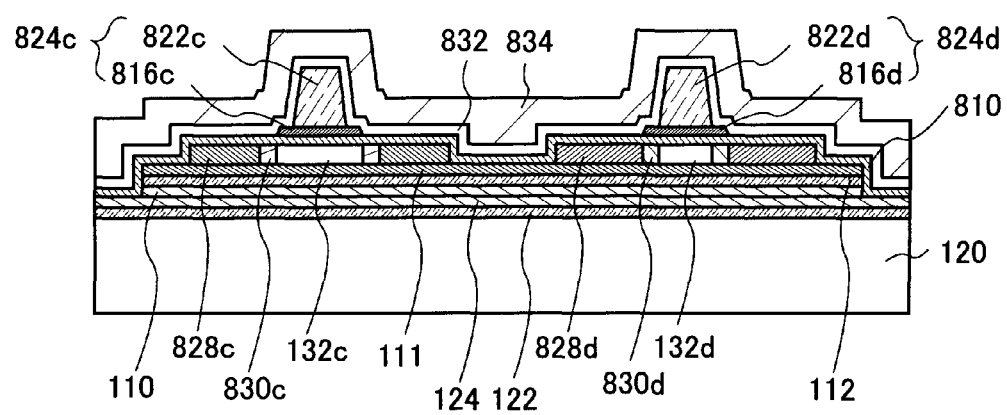
FIGS. 11A and 11B illustrate an example of a manufacturing method of an electroluminescent display device.
Figure 11B:
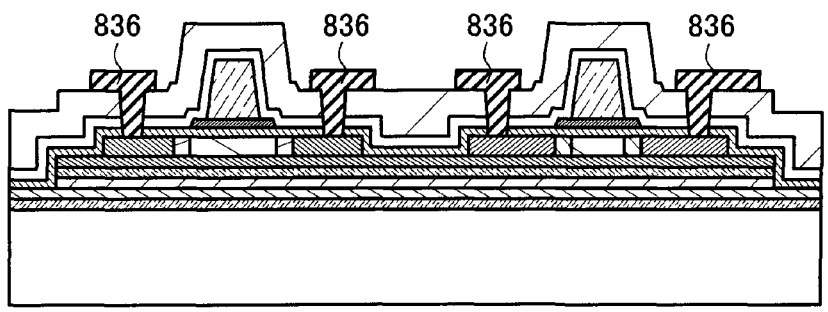

Next, contact holes are formed in the interlayer insulating layer (in this embodiment mode, the insulating layers 832 and 834), and conductive layers 836 that function as source electrodes and drain electrodes are formed in the contact holes (see FIG. 11B).

The contact holes are formed selectively in the insulating layers 832 and 834 so as to reach the second impurity regions 828c in the semiconductor layer 130c and the second impurity regions 828d in the semiconductor layer 130d.

As the conductive layers 836, a single-layer film formed of one element selected from aluminum, tungsten, titanium, tantalum, molybdenum, nickel, or neodymium, or an alloy containing a plurality of above elements; or a stacked-layer film including such layers can be used. For example, a conductive layer that is formed using an alloy that contains a plurality of the elements given above can be formed using an aluminum alloy that contains titanium, an aluminum alloy that contains neodymium, or the like. If the conductive layers 836 is a stacked-layer film, a structure can be employed in which an aluminum layer or an aluminum alloy layer as described above is sandwiched between titanium layers, for example.

Figure 12A:
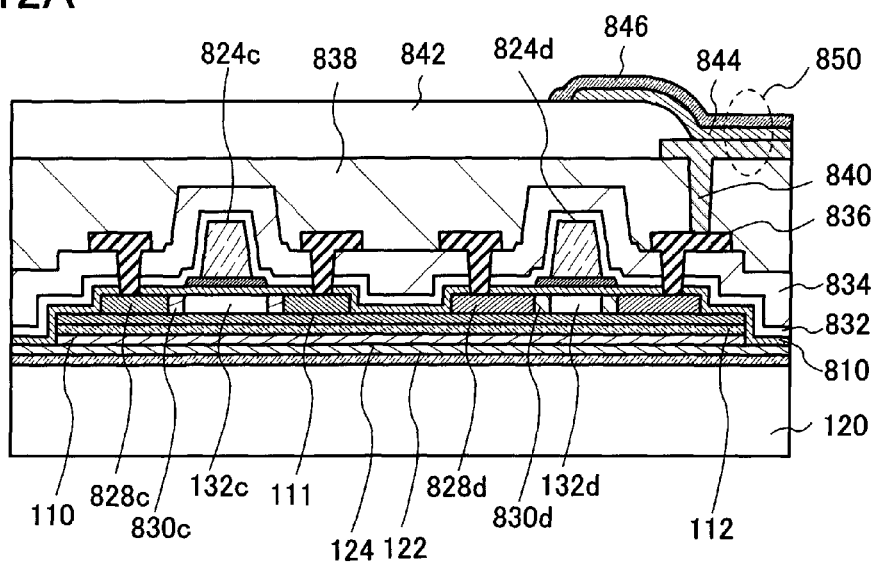
FIGS. 12A and 12B illustrate an example of a manufacturing method of an electroluminescent display device.

Next, a step of forming a light-emitting element 850 is described (see FIG. 12A). Here, an example of forming an organic light-emitting element provided with an organic compound-containing layer as a light-emitting layer is described.

First, a pixel electrode 840 is formed so as to be electrically connected to the conductive layer 836. The pixel electrode 840 is electrically connected to the second impurity region 828d formed in the semiconductor layer 130d with the conductive layer 836 interposed therebetween. After a partition layer 842 which covers an end portion of the pixel electrode 840 is formed, an organic compound-containing layer 844 and a counter electrode 846 are stacked over the pixel electrode 840.

Note that, although the example in which the pixel electrode 840 is formed over an insulating layer 838 provided over the conductive layers 836 is described here, the present invention is not particularly limited thereto. For example, a structure may also be employed in which the pixel electrode 840 is provided over the insulating layer 834. In that case, the pixel electrode 840 can also be formed using part of the conductive layer 836 which functions as a source electrode or a drain electrode.

As the insulating layer 838, a silicon oxide layer, a silicon oxynitride layer, a silicon nitride layer, or the like can be formed by a CVD method or a sputtering method. Alternatively, the insulating layer 838 can be formed using an organic material such as polyimide, polyamide, polyvinyl phenol, benzocyclobutene, acrylic, or epoxy; a siloxane material such as a siloxane resin; an oxazole resin; or the like by an application method such as a spin coating method. Note that the insulating layer 838 can be formed as a single-layer film or a stacked-layer film using the above-described material.

Either one of the pixel electrode 840 and the counter electrode 846 functions as an anode, and the other functions as a cathode. As for light emission of the light-emitting element, there are the case where light is extracted from the supporting substrate 120 side (also referred to as bottom emission), the case where light is extracted from the side opposite to the supporting substrate 120 side (also referred to as top emission), and the case where light is extracted from the supporting substrate 120 side and the side opposite thereto (also referred to as dual emission). In the case of bottom emission, it is desirable that the pixel electrode 840 be formed as a light-transmitting electrode and the counter electrode 846 be formed as a reflective electrode. In the case of top emission, on the other hand, it is desirable that the pixel electrode 840 be formed as a reflective electrode and the counter electrode 846 be formed as a light-transmitting electrode. In the case of dual emission, it is desirable that both the pixel electrode 840 and the counter electrode 846 be formed as light-transmitting electrodes.

When the pixel electrode 840 or the counter electrode 846 is formed as a reflective electrode, it can be formed using a reflective conductive material, for example, a metal element such as tantalum, tungsten, titanium, molybdenum, aluminum, chromium, or silver, or an alloy material or a compound material containing the above-described metal element.

When the pixel electrode 840 or the counter electrode 846 is formed as a light-transmitting electrode, it can be formed using a light-transmitting conductive material such as indium tin oxide (ITO), zinc oxide (ZnO), indium zinc oxide (IZO), or zinc oxide doped with gallium (GZO). In addition, an electrode which transmits visible light can be obtained by formation of a film of a reflective conductive material to a thickness of several to several tens of nanometers.

A light-transmitting electrode can be formed using a conductive composition containing a conductive high molecule (also referred to as a conductive polymer). A thin film of an electrode formed using a conductive composition desirably has a sheet resistance of less than or equal to 10000 ohms per square and a light transmittance of greater than or equal to 70% at a wavelength of 550 nm. Further, the resistance of the conductive high molecule included in the conductive composition is preferably less than or equal to 0.1 Ω·cm.

As a conductive high molecule, a so-called π electron conjugated high molecule can be used. For example, polyaniline or a derivative thereof, polypyrrole or a derivative thereof, polythiophene or a derivative thereof, and a copolymer of two or more kinds of those materials can be given.

As specific examples of a conjugated conductive high molecule, the following can be given: polypyrrole; poly(3-methylpyrrole); poly(3-butylpyrrole); poly(3-octylpyrrole); poly(3-decylpyrrole); poly(3,4-dimethylpyrrole); poly(3,4-dibutylpyrrole); poly(3-hydroxypyrrole); poly(3-methyl-4-hydroxypyrrole); poly(3-methoxypyrrole); poly(3-ethoxypyrrole); poly(3-octoxypyrrole); poly(3-carboxylpyrrole); poly(3-methyl-4-carboxylpyrrole); poly(N-methylpyrrole); polythiophene; poly(3-methylthiophene); poly(3-butylthiophene); poly(3-octylthiophene); poly(3-decylthiophene); poly(3-dodecylthiophene); poly(3-methoxythiophene); poly(3-ethoxythiophene); poly(3-octoxythiophene); poly(3-carboxylthiophene); poly(3-methyl-4-carboxylthiophene); poly(3,4-ethylenedioxythiophene); polyaniline; poly(2-methylaniline); poly(2-octylaniline); poly(2-isobutylaniline); poly(3-isobutylaniline); poly(2-aniline sulfonic acid); poly(3-aniline sulfonic acid); and the like.

Any of the above-described conductive high molecules may be used alone as a conductive composition to form a light-transmitting electrode. Alternatively, an organic resin can be added to any of the above-described conductive high molecules in order to adjust film characteristics such as film quality or intensity of a light-transmitting electrode formed of a conductive composition.

As an organic resin, a thermosetting resin, a thermoplastic resin, a photocurable resin, or the like which is compatible with, or can be mixed and dispersed into a conductive high molecule can be used. As examples of such a resin, the following can be given: a polyester-based resin such as polyethylene terephthalate, polybutylene terephthalate, or polyethylene naphthalate; a polyimide-based resin such as polyimide or polyamide imide; a polyamide resin such as polyamide 6, polyamide 66, polyamide 12, or polyamide 11; a fluorine resin such as poly(vinylidene fluoride), polyvinyl fluoride, polytetrafluoroethylene, ethylene tetrafluoroethylene copolymer, or polychlorotrifluoroethylene; a vinyl resin such as polyvinyl alcohol, polyvinyl ether, polyvinyl butyral, polyvinyl acetate, or polyvinyl chloride; an epoxy resin; a xylene resin; an aramid resin; a polyurethane-based resin; a polyurea-based resin; a melamine resin; a phenol-based resin; polyether; an acrylic-based resin, or a copolymer of any of those resins.

Further, a conductive composition may be doped with an acceptor dopant or a donor dopant so that oxidation-reduction potential of a conjugated electron in a conjugated conductive high molecule may be changed in order to adjust conductivity of the conductive composition.

As the acceptor dopant, a halogen compound, Lewis acid, proton acid, an organic cyano compound, an organometallic compound, or the like can be used. As examples of the halogen compound, chlorine, bromine, iodine, iodine chloride, iodine bromide, iodine fluoride, and the like can be given. As examples of the Lewis acid, phosphorus pentafluoride, arsenic pentafluoride, antimony pentafluoride, boron trifluoride, boron trichloride, boron tribromide, and the like can be given. As examples of the proton acid, inorganic acid such as hydrochloric acid, sulfuric acid, nitric acid, phosphoric acid, fluoroboric acid, hydrofluoric acid, and perchloric acid and organic acid such as organic carboxylic acid and organic sulfonic acid can be given. As the organic carboxylic acid and the organic sulfonic acid, a carboxylic acid compound and a sulfonic acid compound can be used. As an organic cyano compound, a compound having two or more cyano groups in a conjugated bonding, for example, tetracyanoethylene, tetracyanoethylene oxide, tetracyanobenzene, tetracyanoquinodimethane, tetracyanoazanaphthalene, and the like are given.

As a donor dopant, an alkali metal, an alkaline earth metal, a quaternary amine compound, or the like can be used.

Alternatively, a conductive composition may be dissolved in water or an organic solvent (e.g., an alcohol-based solvent, a ketone-based solvent, an ester-based solvent, a hydrocarbon-based solvent, an aromatic-based solvent) and a wet process may be used, whereby a thin film which serves as a light-transmitting electrode can be formed.

The solvent which dissolves a conductive composition is not particularly limited. A solvent which dissolves the above conductive high molecules or high molecular resin compounds such as an organic resin may be used. For example, a conductive composition may be dissolved in any one or a mixture of water, methanol, ethanol, propylene carbonate, N-methylpyrrolidone, dimethylformamide, dimethylacetamide, cyclohexanone, acetone, methyl ethyl ketone, methyl isobutyl ketone, toluene, or the like.

After a conductive composition is dissolved in a solvent as described above, a film thereof is formed over the insulating layer 838 by a wet process such as an application method, a coating method, a droplet discharge method (also referred to as an inkjet method), or a printing method, whereby the pixel electrode 840 can be obtained. The solvent may be dried with heat treatment or under reduced pressure. In a case where the organic resin is a thermosetting resin, heat treatment may be performed. In a case where the organic resin is a photocurable resin, light irradiation treatment may be performed.

The partition layer 842 can be formed in such a manner that an insulating layer is formed over the entire surface of the substrate by a CVD method, a sputtering method, an application method, or the like and then the insulating layer is selectively etched. Alternatively, the partition layer 842 can be formed selectively by a droplet discharge method, a printing method, or the like. Further alternatively, an insulating layer is formed using a positive photosensitive resin over the entire surface, and then the insulating layer is exposed to light and developed, whereby the insulating layer 842 can have a desired shape.

As the organic compound-containing layer 844, at least a light-emitting layer is formed, and a hole injecting layer, a hole transporting layer, an electron transporting layer, or an electron injecting layer may be formed as appropriate in addition to the light-emitting layer. The organic compound-containing layer can be formed by an application method such as an ink jet method or an evaporation method.

In the above-described manner, the light-emitting element 850 in which the organic compound-containing layer 844 including at least the light-emitting layer is interposed between the pixel electrode 840 and the counter electrode 846 can be obtained.

Figure 12B:
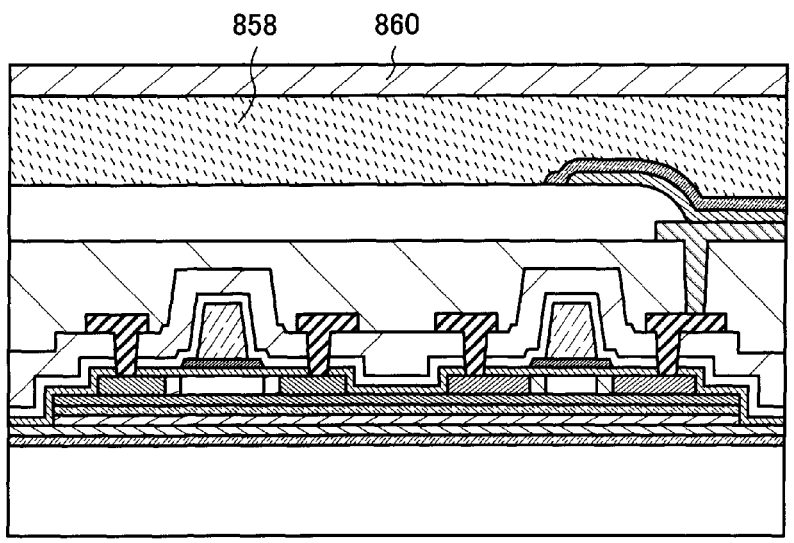

Next, a counter substrate 860 is provided so as to face the supporting substrate 120 (see FIG. 12B). A filler 858 may be provided between the counter substrate 860 and the counter electrode 846, or a space between the counter substrate 860 and the counter electrode 846 may be filled with an inert gas. Note that a protective layer may also be formed so as to cover the counter electrode 846.

Through the above-described process, the EL display device of this embodiment mode is completed.

In manufacturing an SOI substrate, if a single-crystalline semiconductor substrate is used as a semiconductor substrate which serves as a base of the semiconductor layer 130, the semiconductor layer 130 can be a single-crystalline semiconductor. Therefore, a channel formation region can be formed of a single-crystalline semiconductor, and thus variation in transistor characteristics between pixels can be reduced compared with the case of a display device using a polycrystalline semiconductor for a channel formation region. Thus, display unevenness of a light-emitting device can be suppressed.

In the present invention, manufacturing time of an SOI substrate can be shortened, thereby improving throughput. Thus, using an SOI substrate of the present invention, a display device can be manufactured with high productivity.

Note that there is no particular limitation on the structure of the transistors included in the display device of this embodiment mode. For example, a transistor which has the structure described in Embodiment Mode 4 can also be employed.

Note that this embodiment mode can be implemented by being combined with any of the other embodiment modes in this specification as appropriate.

Embodiment Mode 6

An SOI substrate in which a plurality of semiconductor layers are bonded to a large-sized glass substrate can be manufactured utilizing a manufacturing method of an SOI substrate according to the present invention.

FIGS. 17A to 17D and FIGS. 18A to 18D illustrate examples in which a large-sized glass substrate called a mother glass for manufacturing a display panel is used as a supporting substrate 120 and a plurality of semiconductor layers 130 are firmly bonded to the large-sized glass substrate. A plurality of display panels are taken out from the mother glass (supporting substrate 120), and formation regions of display panels 522 are illustrated by dotted lines. Note that FIGS. 17A and 17C and FIGS. 18A and 18C are top schematic views. FIGS. 17B and 17D and FIGS. 18B and 18D are schematic views of cross sections taken along chain lines X-Y of FIGS. 17A and 17C and FIGS. 18A and 18C, respectively.

FIGS. 17A1 to 17B2 illustrate an example in which a plurality of semiconductor substrates 100 are bonded to one mother glass (supporting substrate 120) and the semiconductor substrates 100 are separated to form a plurality of semiconductor layers 130.

The plurality of semiconductor substrates 100 are prepared. As the semiconductor substrates 100, commercially available semiconductor substrates may be used or substrates processed to have desired size and shape (here, to have a panel size of the display panel) may be used. In each of the semiconductor substrates 100, an embrittlement layer 102 is formed in a region at a predetermined depth, and an insulating layer 104 is formed on a surface of the semiconductor substrate 100. In addition, a mother glass is prepared as the supporting substrate 120.

Then, the plurality of semiconductor substrates 100 are bonded to the supporting substrate 120. The insulating layer 104 is formed on each of the plurality of semiconductor substrates 100, and the plurality of semiconductor substrates 100 and the supporting substrate 120 are bonded to each other with the insulating layers 104 interposed therebetween. Then, selective irradiation with a laser beam is performed from the supporting substrate 120 side, so that embrittlement of the embrittlement layers 102 in irradiation regions 142 is made to progress (see FIGS. 17A and 17C). The laser beam is transmitted through the supporting substrate 120 and the insulating layers 104 and has such a wavelength as to be absorbed by the semiconductor substrates 100.

Next, the semiconductor substrates 100 are separated at the embrittlement layers 102 by a physical method. The semiconductor substrates 100 are bonded to the supporting substrate 120 with the insulating layers 104 interposed therebetween. As a result of separation of portions of the semiconductor substrates 100 at the embrittlement layers 102, semiconductor layers 130 having almost the same crystallinity as the semiconductor substrates 100 are left over the supporting substrate 120. The embrittlement layer 102 is formed in each of the plurality of semiconductor substrates 100, and each of the semiconductor substrates 100 is separated at its embrittlement layer 102; accordingly, an SOI substrate in which the plurality of semiconductor layers 130 are firmly bonded to the supporting substrate 120 is obtained (see FIGS. 17C and 17D).

FIGS. 18A to 18D illustrate an example in which a plurality of semiconductor layers 130 are formed from one semiconductor substrate 100, over the supporting substrate 120.

First, the semiconductor substrate 100 is prepared, and an insulating layer 104 is formed on a surface of the semiconductor substrate 100. Then, grooves are formed by selectively etching the semiconductor substrate 100. In this specification, processing in which grooves are formed by selective etching of the semiconductor substrate 100 is referred to as "groove processing."

By groove processing, projections and depressions are formed on the semiconductor substrate 100. The depressions are regions where the grooves are formed, and the projections are regions which are left without being etched. The projections of the semiconductor substrate 100 later form the semiconductor layers 130 which are transferred to the supporting substrate 120. Therefore, it is preferable to form the projections in accordance with the formation regions of the display panels 522. In other words, groove processing is preferably performed on the semiconductor substrate 100 in consideration of the formation regions of the display panels 522.

The depth of groove processing to the semiconductor substrate 100 (etching depth) is determined in consideration of the thickness of the semiconductor layers transferred to the supporting substrate 120. The thickness of the semiconductor layers transferred to the supporting substrate 120 can be adjusted by control of the thickness at which the embrittlement layers 120 are formed. In this embodiment mode, the depth of groove processing to the semiconductor substrates 100 is preferably larger than the depth at which the embrittlement layers 102 are formed. By doing so, only projections of the semiconductor substrate 100 can be transferred easily when transferring the semiconductor layers to the supporting substrate 120.

The semiconductor substrate 100 is irradiated with ions from the surface side where groove processing is performed, so that an embrittlement layer 102 is formed in a region at a predetermined depth of the semiconductor substrate 100. Since the semiconductor substrate 100 is subjected to groove processing in advance, the embrittlement layer 102 is formed at different depths between the projections and depressions. Note that the projections and depressions of the semiconductor substrate 100 have almost the same depth of the embrittlement layer 102 from the surface of the semiconductor substrate 100.

Next, the supporting substrate 120 and the semiconductor substrate 100 are bonded to each other. The supporting substrate 120 and the semiconductor substrate 100 are bonded with the insulating layer 104 interposed therebetween. The semiconductor substrate 100 is subjected to groove processing, so that the projections are bonded to the supporting substrate 120 with the insulating layer 104 interposed therebetween. Then, selective irradiation with a laser beam is performed from the supporting substrate 120 side to make embrittlement of the embrittlement layer 102 in the irradiation regions 142 progress (see FIGS. 18A and 18B). The laser beam, which is transmitted through the supporting substrate 120 and the insulating layer 104 and has such a wavelength as to be absorbed by the semiconductor substrate 100, is used.

Next, the semiconductor substrate 100 is separated at the embrittlement layer 102 by a physical method. The projections of the semiconductor substrate 100 are bonded to the supporting substrate 120 with the insulating layer 104 interposed therebetween. Accordingly, only the projections of the semiconductor substrate 100 can be left over the supporting substrate 120 as the semiconductor layers 130. Thus, an SOI substrate in which the plurality of semiconductor layers 130 are firmly bonded to the supporting substrate 120 can be obtained (see FIGS. 18C and 18D).

In the case where groove processing is performed on the semiconductor substrate 100 as illustrated in FIGS. 18A to 18D, a plurality of semiconductor layers can be obtained from one-time separation step. Therefore, manufacturing time can be shortened, and high productivity can be achieved.

After forming an embrittlement layer in the semiconductor substrate 100, groove processing may be performed. In addition, after groove processing is performed, an insulating layer functioning as a bonding layer may be formed. In such a case, a structure in which the insulating layer is formed on side surfaces of semiconductor layers transferred to the supporting substrate 120 can be obtained.

The semiconductor layers 130 obtained in FIGS. 17A to 17D and FIGS. 18A to 18D can form display panels. A scanning line driver circuit region 523, a signal line driver circuit region 524, and a pixel formation region 525 are formed in each of the formation regions of the display panels 522, and the semiconductor layers 130 are bonded to the supporting substrate 120 so as to include these regions.

In separation of the semiconductor substrate 100, embrittlement of the embrittlement layer 102 partially progresses by laser beam irradiation before separation using a physical method. When physical force is applied to the semiconductor substrate 100, a portion, where the embrittlement has progressed, in the embrittlement layer 102 serves as a starting point (trigger) and the semiconductor substrate 100 can easily be separated. Further, separation can be performed in a short time. Therefore, manufacturing time can be shortened; therefore, throughput can be improved. Furthermore, when the semiconductor layers 130 are bonded in accordance with the formation regions of the display panels 522, the number of panels obtained is increased and productivity can be drastically increased.

Note that the manufacturing method of an SOI substrate according to this embodiment mode is characterized in that before a semiconductor substrate which serves as a base of a semiconductor layer firmly bonded to a supporting substrate is separated, the semiconductor substrate is selectively irradiated with a laser beam to make embrittlement of an embrittlement layer partially progress. Accordingly, the structure of an SOI substrate manufactured is not particularly limited.

Note that this embodiment mode can be implemented by being combined with any of the other embodiment modes in this specification as appropriate.

Embodiment Mode 7

In Embodiment Mode 7, examples of a semiconductor device to which an SOI substrate of the present invention is applied will be described.

Figure 15:
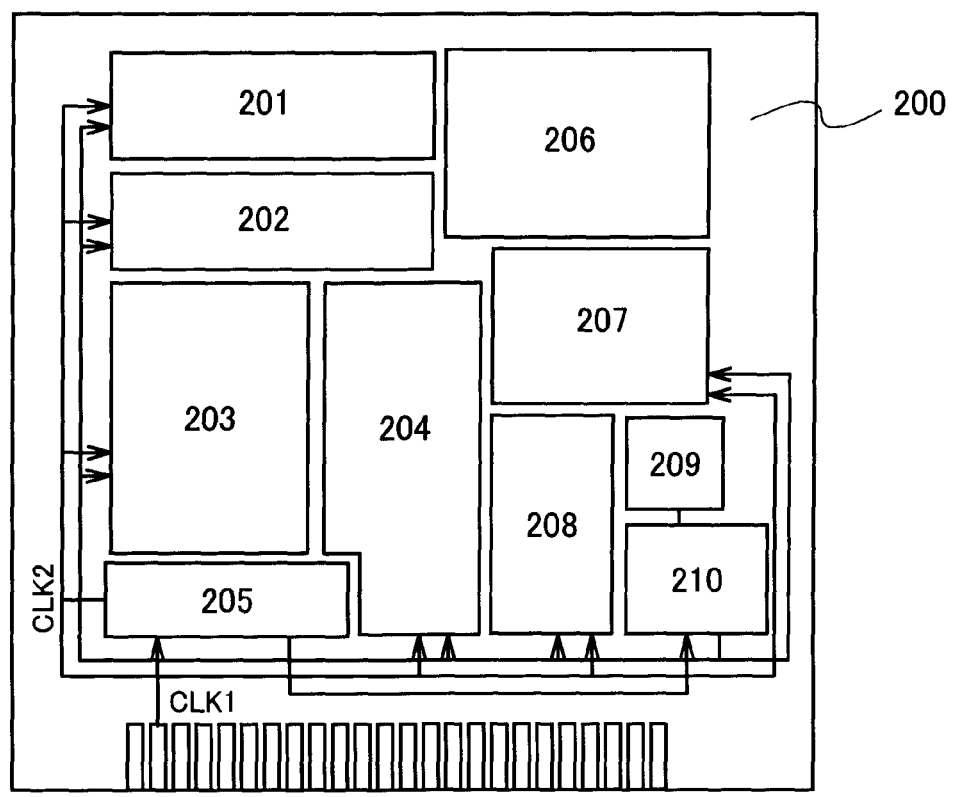
FIG. 15 is a block diagram illustrating a structure of a microprocessor obtained using an SOI substrate.

FIG. 15 illustrates an example of a microprocessor 200 as an example of a semiconductor device. The microprocessor 200 is manufactured using the SOI substrate of the above embodiment modes. This microprocessor 200 has an arithmetic logic unit (ALU) 201, an ALU controller 202, an instruction decoder 203, an interrupt controller 204, a timing controller 205, a register 206, a register controller 207, a bus interface (Bus I/F) 208, a read-only memory 209, and a ROM interface (ROM I/F) 210.

An instruction input to the microprocessor 200 through the bus interface 208 is input to the instruction decoder 203, decoded therein, and then input to the ALU controller 202, the interrupt controller 204, the register controller 207, and the timing controller 205. The ALU controller 202, the interrupt controller 204, the register controller 207, and the timing controller 205 conduct various controls based on the decoded instruction. Specifically, the ALU controller 202 generates signals for controlling the operation of the ALU 201. While the microprocessor 200 is executing a program, the interrupt controller 204 processes an interrupt request from an external input/output device or a peripheral circuit based on its priority or a mask state. The register controller 207 generates an address of the register 206, and reads and writes data from and to the register 206 in accordance with the state of the microprocessor 200. The timing controller 205 generates signals for controlling timing of operation of the ALU 201, the ALU controller 202, the instruction decoder 203, the interrupt controller 204, and the register controller 207. For example, the timing controller 205 is provided with an internal clock generator for generating an internal clock signal CLK2 based on a reference clock signal CLK1, and supplies the internal clock signal CLK2 to the various above-mentioned circuits. Obviously, the microprocessor 200 illustrated in FIG. 15 is only an example in which the configuration is simplified, and an actual microprocessor may have various configurations depending on the uses.

The SOI substrate according to the above embodiment modes can be applied to such a microprocessor 200. In manufacturing the SOI substrate according to the present invention, throughput is improved. When the SOI substrate is used, semiconductor devices such as microprocessors can be manufactured with high productivity. In addition, in the case where a single-crystalline semiconductor substrate is used in manufacturing an SOI substrate, a single-crystalline semiconductor layer can be obtained, and an integrated circuit can be formed using the single-crystalline semiconductor layer. High performance, high speed processing, and the like can be realized.

Figure 16:
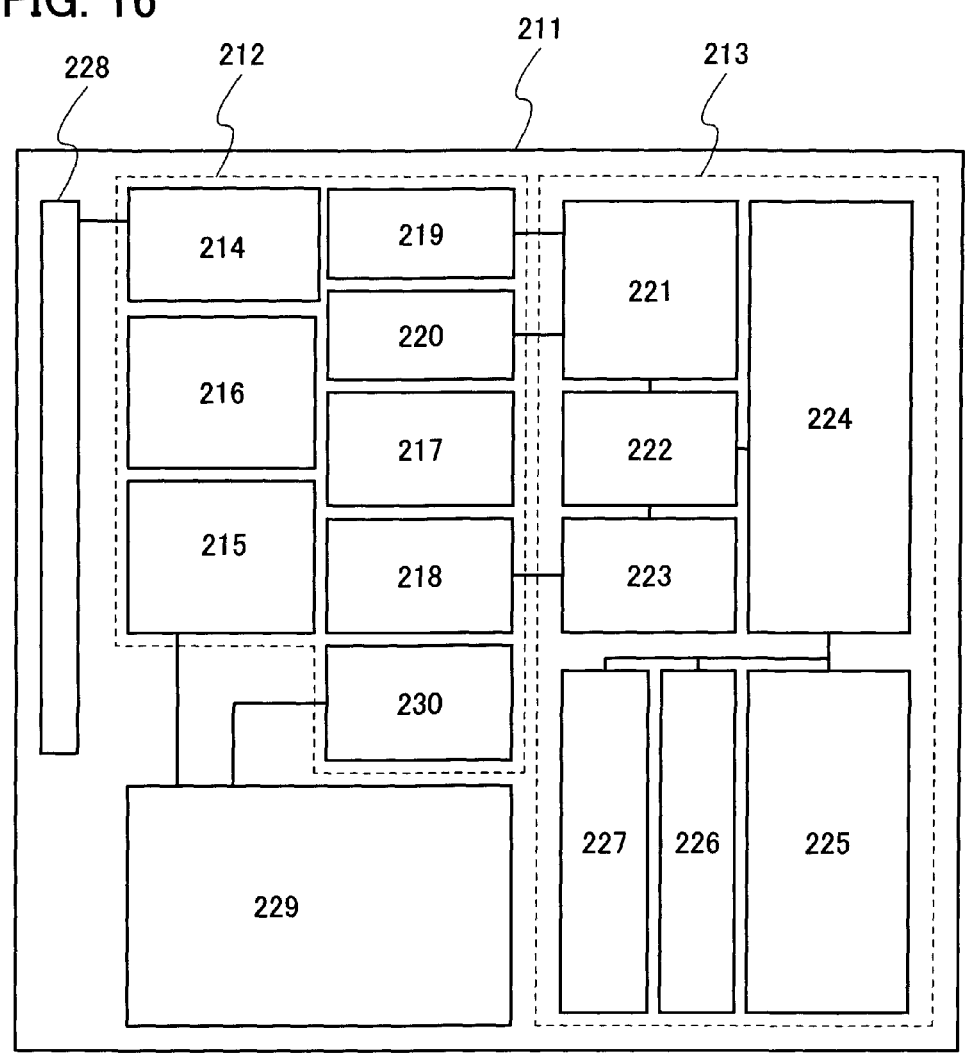
FIG. 16 is a block diagram illustrating a structure of an RFCPU obtained using an SOI substrate.
Figure 18A:
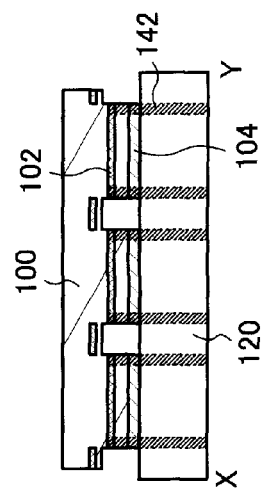
FIGS. 18A to 18D illustrate an example of bonding semiconductor layers to a mother glass for manufacturing a display panel.
Figure 18B:
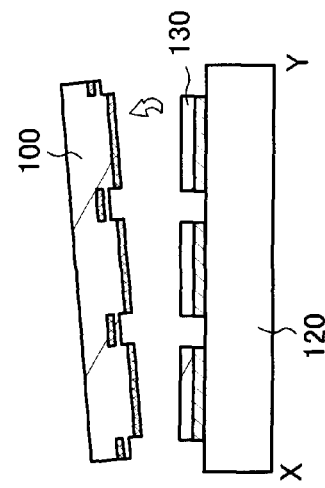
Figure 18C:
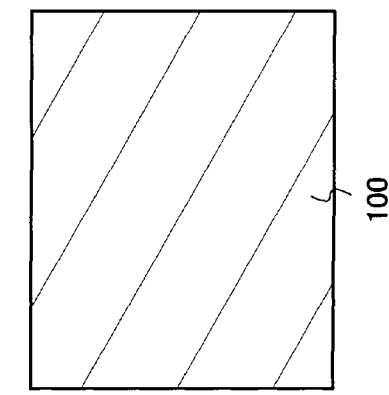
Figure 18D:
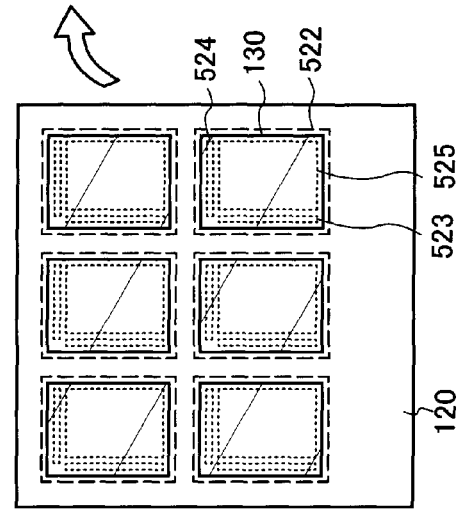

Next, an example of a semiconductor device having an arithmetic function that can transmit and receive data without contact is described with reference to FIG. 16. FIG. 16 illustrates an example of a computer that operates to transmit and receive signals to and from an external device by wireless communication (such a computer is hereinafter referred to as an "RFCPU"). An RFCPU 211 has an analog circuit portion 212 and a digital circuit portion 213. The analog circuit portion 212 has a resonance circuit 214 with a resonance capacitor, a rectifier circuit 215, a constant voltage circuit 216, a reset circuit 217, an oscillator circuit 218, a demodulator circuit 219, and a modulator circuit 220. The digital circuit portion 213 includes an RF interface 221, a control register 222, a clock controller 223, an interface 224, a central processing unit 225, a random-access memory 226, and a read-only memory 227.

An operation of the RFCPU 211 having such a configuration is roughly as follows. The resonance circuit 214 generates an induced electromotive force based on a signal received by an antenna 228. The induced electromotive force is stored in a capacitor portion 229 through the rectifier circuit 215. This capacitor portion 229 is preferably formed using a capacitor such as a ceramic capacitor or an electric double layer capacitor. The capacitor portion 229 does not need to be integrated with the RFCPU 211 and it is acceptable as long as the capacitor portion 229 is mounted as a different component on a substrate having an insulating surface which is included in the RFCPU 211.

The reset circuit 217 generates a signal that resets the digital circuit portion 213 to be initialized. For example, a signal that rises after an increase in power supply voltage is generated as the reset signal. The oscillator circuit 218 changes the frequency and duty ratio of a clock signal in response to a control signal generated by the constant voltage circuit 216. The demodulation circuit 219 having a low pass filter, for example, binarizes amplitude fluctuation of reception signals of an amplitude shift keying (ASK) system. The modulator circuit 220 varies the amplitude of an amplitude-modulated (ASK) transmission signal and transmits the signal. The modulator circuit 220 changes the amplitude of a communication signal by changing a resonance point of the resonance circuit 214. The clock controller 223 generates a control signal for changing the frequency and duty ratio of a clock signal in accordance with the power supply voltage or a consumption current of the central processing unit 225. The power supply voltage is managed by a power management circuit 230.

A signal input from the antenna 228 to the RFCPU 211 is demodulated by the demodulation circuit 219 and then decomposed into a control command, data, and the like by the RF interface 221. The control command is stored in the control register 222. The control command includes reading of data stored in the read-only memory 227, writing of data to the random-access memory 226, an arithmetic instruction to the central processing unit 225, and the like. The central processing unit 225 accesses the read-only memory 227, the random-access memory 226, and the control register 222 via the interface 224. The interface 224 has a function of generating an access signal for any of the read-only memory 227, the random-access memory 226, and the control register 222 based on an address the central processing unit 225 requests.

As an arithmetic method of the central processing unit 225, a method may be employed in which the read-only memory 227 stores an operating system (OS) and a program is read and executed at the time of starting operation. Alternatively, a method can be employed in which a circuit dedicated to arithmetic is formed and an arithmetic process is conducted using hardware. In a method in which both hardware and software are used, part of processing is conducted by a dedicated arithmetic circuit and the other part of the arithmetic processing is conducted by the central processing unit 225 using a program.

The SOI substrate according to the above embodiment modes can be applied to such an RFCPU 211. In manufacturing the SOI substrate according to the present invention, throughput is improved. When the SOI substrate is used, semiconductor devices such as RFCPUs can be manufactured with high productivity. In addition, in the case where a single-crystalline semiconductor substrate is used in manufacturing an SOI substrate, a single-crystalline semiconductor layer can be obtained, and an integrated circuit can be formed using the single-crystalline semiconductor layer. Therefore, high performance, high speed processing, and the like can be realized. Note that although FIG. 16 illustrates a mode of the RFCPU, the semiconductor device of the present invention may be an IC tag as long as it has a communication function, an arithmetic processing function, and a memory function.

Figure 21A:
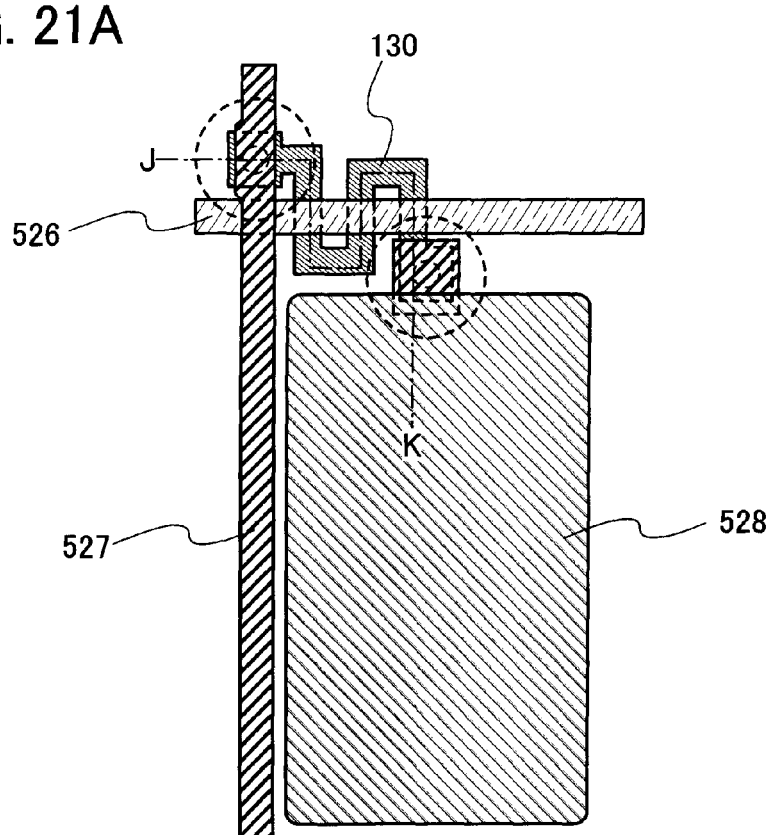
FIGS. 21A and 21B illustrate an example of a liquid crystal display device.
Figure 21B:
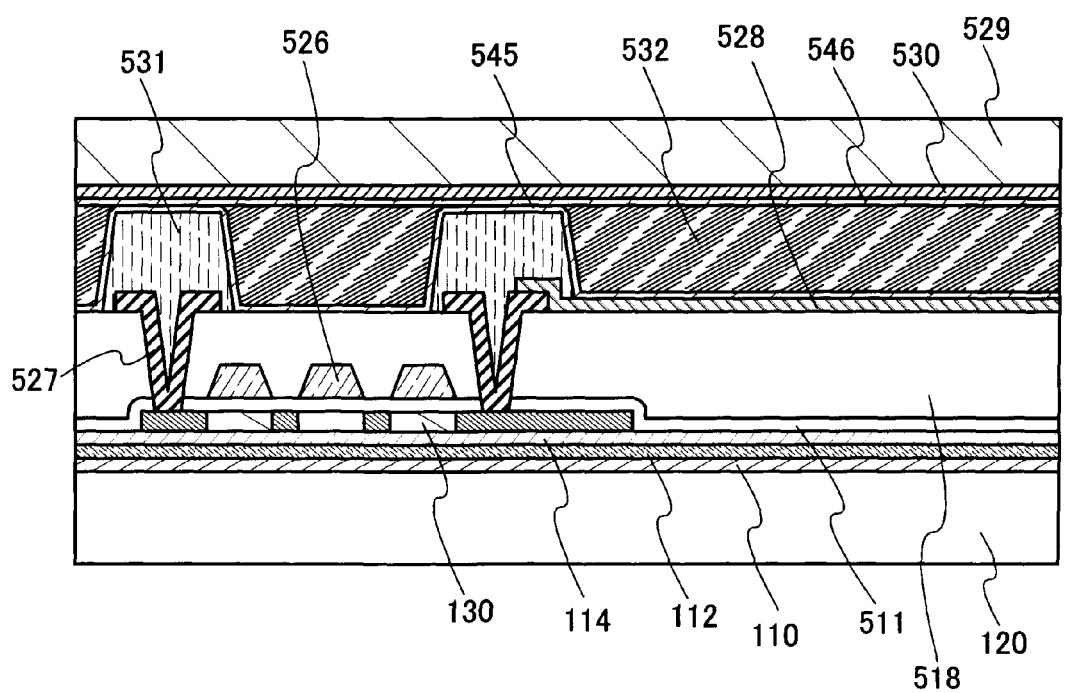

FIGS. 21A and 21B illustrate an example of a pixel of a liquid crystal display device to which the SOI substrate of this the present invention is applied and in which a transistor of a pixel portion is formed using the semiconductor layer of the SOI substrate. FIG. 21A is a plan view of a pixel, in which a scan line 526 intersects a semiconductor layer, and a signal line 527 and a pixel electrode 528 are connected to the semiconductor layer. FIG. 21B is a cross-sectional view of FIG. 21A, taken along a chain line J-K.

In FIG. 21B, there is a region with a structure in which a semiconductor layer 130 is stacked over a supporting substrate 120 with a bonding layer 110, a nitrogen-containing insulating layer 112, and a silicon oxide layer 114 stacked in this order interposed therebetween, and the pixel transistor of this embodiment mode is structured so as to include the region. In this embodiment mode, the semiconductor layer 130 is a single-crystalline semiconductor layer. That is, in manufacturing an SOI substrate of this embodiment mode, a single-crystalline semiconductor substrate is used as a semiconductor substrate which is a base of the semiconductor layer 130. Note that, although an example of using the SOI substrate having the structure illustrated in FIG. 3A is given here, the SOI substrate having another structure described in this specification can be used.

The pixel electrode 528 is provided over an interlayer insulating film 518. In the interlayer insulating layer 518, a contact hole, through which the semiconductor layer 130 and the signal line 527 are connected to each other, is formed. A columnar spacer 531 is provided over the signal line 527 so as to fill a hollow due to the contact hole formed in the interlayer insulating film 518. A counter substrate 529 is provided with a counter electrode 530. A liquid crystal layer 532 sandwiched between an orientation film 545 and an orientation film 546 is provided in a space formed by the columnar spacer 531. A polarizing plate is provided as appropriate for an outside of the supporting substrate 120 or the counter substrate 529 although not illustrated in the diagram.

The interlayer insulating layer 518 can be formed as a single-layer film or a stacked-layer film. As the interlayer insulating layer 518, it is preferable to form a planarization film, which planarizes roughness due to a structure of a transistor or the like that is formed in a lower layer, and can form a planar surface. For example, the interlayer insulating layer 518 can be formed by an application method such as a spin coating method, using an organic material such as polyimide, polyamide, polyvinylphenol, benzocyclobutene, acrylic, or epoxy, a siloxane material such as a siloxane resin, an oxazole resin, or the like. As the interlayer insulating layer 518, a BPSG layer may also be formed. Further, it is also possible to form an insulating layer such as a silicon oxide layer, a silicon nitride layer, a silicon oxynitride layer, or a silicon nitride oxide layer by a CVD method or a sputtering method. Still alternatively, an insulating layer formed using an organic material and an insulating layer formed using an inorganic material may be stacked.

In the case of a reflective liquid crystal display device, a reflective electrode may be formed as the pixel electrode 528. Specifically, the pixel electrode 528 can be formed using a reflective conductive material, for example, a metal element such as tantalum, tungsten, titanium, molybdenum, aluminum, chromium, or silver, or an alloy material or a compound material containing the metal element. Note that, in the case where a reflective film is formed separately from the pixel electrode 528, or in the case of a transmissive liquid crystal display device, the pixel electrode 528 may be formed as a light-transmitting electrode and formed using a light-transmitting conductive material. As a conductive material which transmits light, indium tin oxide (ITO), zinc oxide (ZnO), indium zinc oxide (IZO), zinc oxide to which gallium is added (GZO), or the like can be used.

The pixel electrode 528 can be formed using a conductive composition containing a conductive high molecule (also referred to as a conductive polymer). A thin film of the pixel electrode formed using a conductive composition desirably has a sheet resistance of less than or equal to 10000 ohms per square and a light transmittance of less than or equal to 70% at a wavelength of 550 nm. Further, the resistance of the conductive high molecule included in the conductive composition is preferably less than or equal to 0.1 Ω·cm. Note that a conductive high molecule is based on the description of the conductive high molecule which can be used for the pixel electrode 840 or the counter electrode 846 in Embodiment Mode 5.

The columnar spacer 531 can be obtained by forming an insulating layer over an entire surface of the substrate, using an organic material such as epoxy, polyimide, polyamide, polyimide amide, or acrylic, or an inorganic material such as silicon oxide, silicon nitride, silicon oxynitride, or silicon nitride oxide, and then etching the insulating layer into a desired shape.

A material for the orientation film 545 and the orientation film 546 may be selected in accordance with an operation mode of a liquid crystal which is to be used, and a film which can align liquid crystals in a certain direction is formed. For example, a film is formed using polyimide, polyamide, or the like and undergoes orientation treatment, so that the film can function as the orientation film. Rubbing, irradiation with light such as ultraviolet rays, or the like may be performed for the orientation treatment. Although there is no particular limitation on a formation method of the orientation film 545 and the orientation film 546, various printing methods or a droplet discharge method enables selective formation of the orientation film 545 and the orientation film 546.

The liquid crystal layer 532 is formed using a desired liquid crystal material. For example, the liquid crystal layer 532 can be formed by dripping the liquid crystal material into a frame-shaped seal pattern formed with a sealant. The liquid crystal material may be dripped by a dispenser method or a droplet discharging method. It is preferable that the liquid crystal material be degassed under reduced pressure either in advance or after dripping is completed. Further, it is preferable that the liquid crystal material be dripped in an inert atmosphere so that impurities or the like are not mixed into the liquid crystal material. Furthermore, in order that a bubble or the like may not be formed in the liquid crystal layer 532, it is preferable that an atmosphere be set under a reduced pressure after forming the liquid crystal layer 532 by dripping the liquid crystal material and until attaching the supporting substrate 120 and the counter substrate 529 to each other. It is also possible to form the liquid crystal layer 532 by attaching the supporting substrate 120 and the counter substrate 529 to each other and then injecting the liquid crystal material into the inside of the frame-shaped pattern of the sealant utilizing a capillary phenomenon. In this case, a portion that is to be an opening through which the liquid crystal material is injected is formed in advance. It is preferable that the liquid crystal material be injected under a reduced pressure.

For the counter substrate 529, a variety of glass substrates such as an aluminosilicate glass substrate, an aluminoborosilicate glass substrate, or a barium borosilicate glass substrate; a quartz substrate; a crystallized glass substrate; a sapphire substrate; or the like can be used. The counter electrode 530 and the alignment film 546 may be provided for the counter substrate 529 before the counter substrate 529 is bonded to the supporting substrate 120. Further, a color filter, a black matrix, or the like may be provided for the counter substrate 529.

Figure 19A:
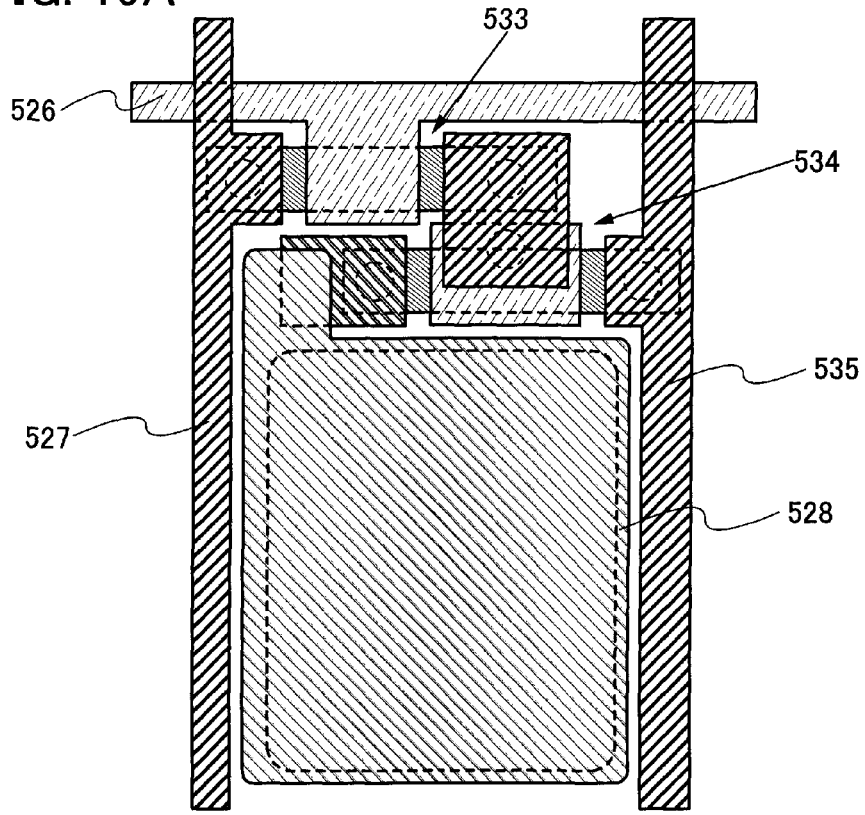
FIGS. 19A and 19B illustrate an example of an electroluminescent display device.
Figure 19B:
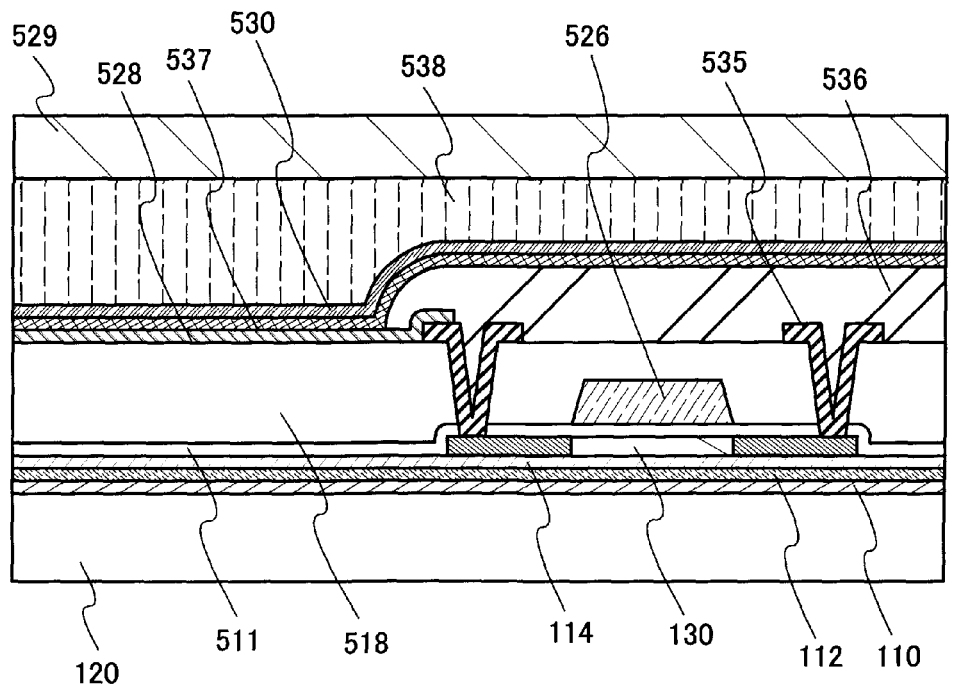

FIG. 19A illustrates an example of an electroluminescent (EL) display device to which the SOI substrate of the present invention is applied and in which a transistor of a pixel portion is formed using the semiconductor layer of the SOI substrate. Note that a structure of the transistor of the EL display device differs from that of the display device described in Embodiment Mode 5. FIG. 19A is a plane view of a pixel which includes a selection transistor 533 connected to a signal line 527 and a display control transistor 534 connected to a current supply line 535. This display device has a structure in which a light-emitting element including an organic compound-containing layer as a light-emitting layer is provided for each pixel. A pixel electrode 528 is connected to the display control transistor 534. FIG. 19B is a cross-sectional view illustrating a main portion of such a pixel.

In FIG. 19B, there is a region with a structure in which a semiconductor layer 130 and the gate insulating layer 511 are stacked over a supporting substrate 120 with a bonding layer 110, a nitrogen-containing insulating layer 112, and a silicon oxide layer 114 stacked in this order interposed therebetween, and the display control transistor is structured so as to include such a region. In this embodiment mode, the semiconductor layer 130 is a single-crystalline semiconductor layer. That is, in manufacturing an SOI substrate of this embodiment mode, a single-crystalline semiconductor substrate is used as a semiconductor substrate which is a base of the semiconductor layer 130. The structures of the bonding layer 110, the nitrogen-containing insulating layer 112, the silicon oxide layer 114, the semiconductor layer 130, the interlayer insulating layer 518, and the like are similar to those of FIG. 21B. A peripheral portion of the pixel electrode 528 is surrounded by an insulating partition layer 536. An organic compound-containing layer 537 including at least a light-emitting layer is formed over the pixel electrode 528. A counter electrode 530 is formed over the organic compound-containing layer 537. The pixel portion is filled with a sealing resin 538 and is provided with a counter substrate 529 as a reinforcing plate.

A display screen of the EL display device of this embodiment mode is formed by arranging such pixels in matrix. In this case, when a channel portion of the transistor of the pixel is formed using the semiconductor film 130 which is a single-crystalline semiconductor, there are advantages in that characteristics do not vary among transistors and unevenness in emission luminance among pixels is not generated. Therefore, drive with the brightness of a light-emitting element being controlled by current is easy, and a correction circuit that corrects variation of transistor characteristics is not necessary. Thus, a load on a driver circuit can be reduced. Furthermore, a light-transmitting substrate can be selected as the supporting substrate 120; accordingly, a bottom emission type EL display device which emits light from the supporting substrate 120 side can be formed.

In this manner, the SOI substrate of the present invention can be utilized for a liquid crystal display device and an EL display device. Throughput in manufacturing the SOI substrates of the present invention is improved; therefore, liquid crystal display devices and EL display devices can be manufactured with high productivity.

In addition, when a single-crystalline semiconductor substrate is used in manufacturing an SOI substrate, a semiconductor layer formed of a single-crystalline semiconductor can be obtained. Thus, a transistor can be formed using a single-crystalline semiconductor layer. The transistor formed using a single-crystalline semiconductor layer is superior to an amorphous silicon transistor in all operation characteristics such as capacity of current drive; therefore, the transistor can be downsized. Accordingly, an aperture ratio of a pixel portion in the display panel can be improved. In addition, when an insulating layer which has a high blocking effect is provided between a mother glass and a single-crystalline semiconductor layer, a display device with high reliability can be provided. Furthermore, since a microprocessor like the one illustrated in FIG. 15 or FIG. 16 can be formed, a display device can be provided with a function as a computer. Moreover, a display which is capable of data input and output without contact can be manufactured.

A variety of electric devices can be formed using an SOI substrate according to the present invention. As examples of electronic devices, a camera such as a video camera or a digital camera, a navigation system, a sound reproducing device (a car audio, an audio component, or the like), a computer, a game machine, a portable information terminal (a mobile computer, a cellular phone, a mobile game machine, an electronic book, or the like), an image reproducing device having a recording medium (specifically, a device for reproducing a content of a recording medium such as a digital versatile disc (DVD) and having a display for displaying the reproduced image), and the like can be given.

Figure 20A:
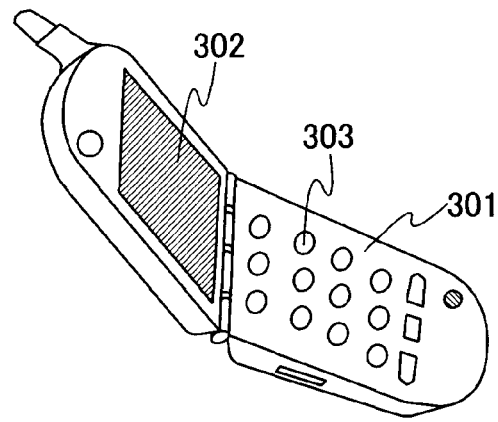
FIGS. 20A to 20C illustrate examples of an electronic device.

FIG. 20A illustrates an example of a cellular phone. A cellular phone 301 described in this embodiment mode includes a display portion 302, an operation switch 303, and the like. The liquid crystal display device described with reference to FIGS. 21A and 21B or the EL display device described with reference to FIGS. 12A and 12B or FIGS. 19A and 19B can be applied to the display portion 302. By using the display device according to this embodiment mode, cellular phones can be manufactured with high productivity. When an SOI substrate is used, a channel formation region in a transistor included in a display device can be formed of a single-crystalline semiconductor. Therefore, a display portion with high image quality can be formed. In addition, the semiconductor device of the present invention can be also applied to a microprocessor or a memory which is included in the cellular phone 301.

Figure 20B:
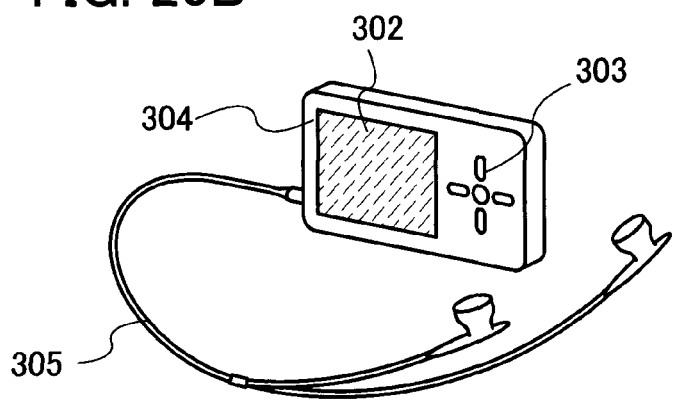

FIG. 20B illustrates a digital player 304, which is a typical example of an audio device. The digital player 304 illustrated in FIG. 20B includes a display portion 302, an operation switch 303, earphones 305, and the like. Instead of the earphones 305, headphones or wireless earphones can be used. In the digital player 304, a semiconductor device according to the present invention can be used for a memory portion which stores music information or a microprocessor which operates the digital player 304. The digital player 304 with this structure can achieve reduction in size and weight. By application of the liquid crystal display device described with reference to FIGS. 21A and 21B or the EL display device described with reference to FIGS. 12A and 12B or FIGS. 19A and 19B to the display portion 302, the display portion 302 can display an image or textual information with high definition even if it has a screen size of about 0.3 inches to 2 inches.

Figure 20C:
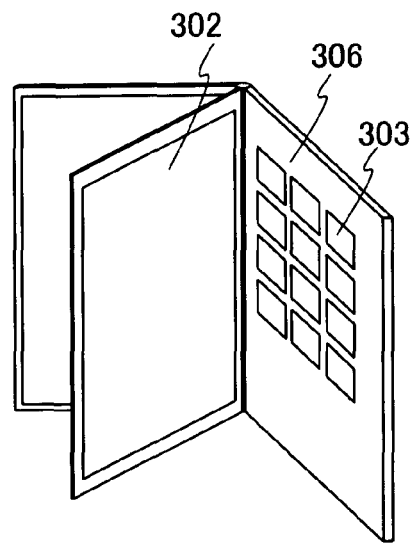

FIG. 20C illustrates an electronic book 306. This electronic book 306 includes a display portion 302 and an operation switch 303. A modem may be built in, or a structure in which information can be transmitted and received wirelessly may be employed. In the electronic book 306, a semiconductor device according to the present invention can be used for a memory portion which stores information or a microprocessor which operates the electronic book 306. In the memory portion, a NOR-type nonvolatile memory with a memory capacity of 20 gigabytes (GB) to 200 gigabytes can be used, with which images or sounds (music) can be stored and reproduced. By application of the liquid crystal display device described with reference to FIGS. 21A and 21B or the EL display device described with reference to FIGS. 12A and 12B or FIGS. 19A and 19B to the display portion 302, the display portion 302 can perform display with high image quality.

Note that this embodiment mode can be implemented by being combined with any of the other embodiment modes in this specification as appropriate.

Embodiment 1

In Embodiment 1, an ion irradiation method for forming an embrittlement layer will be described.

In the above embodiment modes, in formation of the embrittlement layer, a semiconductor substrate, typically, a single-crystalline semiconductor substrate is irradiated with ions that are derived from hydrogen (H) (hereafter referred to as "hydrogen ion species"). For example, a hydrogen gas or a gas which contains hydrogen in its composition is used as a source gas; a hydrogen plasma is generated; and a single-crystalline semiconductor substrate is irradiated with the hydrogen ion species in the hydrogen plasma.

(Ions in Hydrogen Plasma)

In such a hydrogen plasma as described above, hydrogen ion species such as $H^+$ ions, $H_2^+$ ions, and $H_3^+$ ions are present. Here are listed reaction equations for reaction processes (formation processes, destruction processes) of the hydrogen ion species.

$$e + H \rightarrow e + H^+ + e \quad (1)$$

$$e + H_2 \rightarrow e + H_2^+ + e \quad (2)$$

$$e + H_2 \rightarrow e + (H_2)^* \rightarrow e + H + H \quad (3)$$

$$e + H_2^+ \rightarrow e + (H_2^+)^* \rightarrow e + H^+ + H \quad (4)$$

$$H_2^+ + H_2 \rightarrow H_3^+ + H \quad (5)$$

$$H_2^+ + H_2 \rightarrow H^+ + H + H_2 \quad (6)$$

$$e + H_3^+ \rightarrow e + H^+ + H + H \quad (7)$$

$$e + H_3^+ \rightarrow H_2 + H \quad (8)$$

$$e + H_3^+ \rightarrow H + H + H \quad (9)$$

Figure 22:
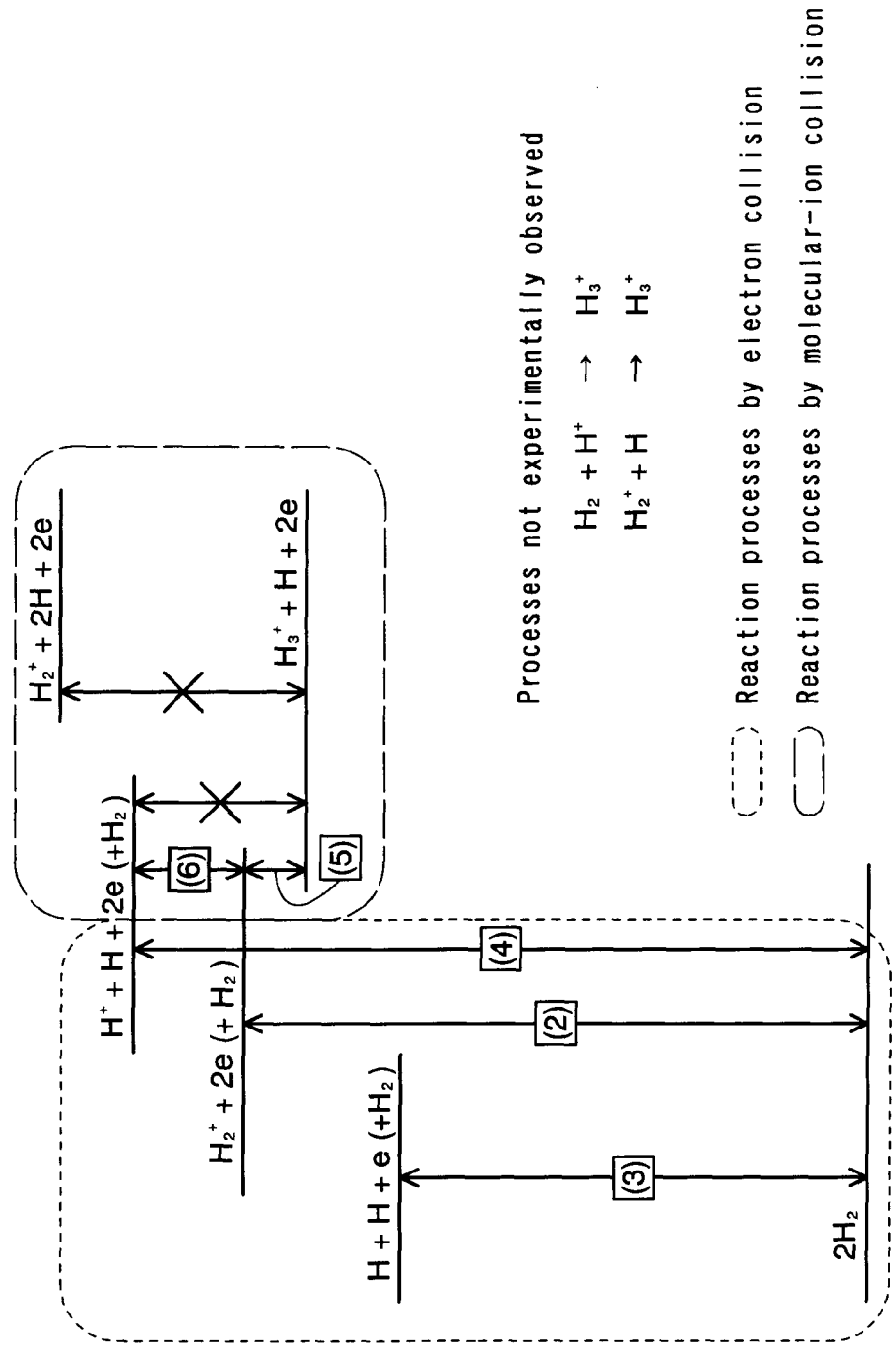
FIG. 22 is an energy diagram of hydrogen ion species.

FIG. 22 is an energy diagram which schematically illustrates some of the above reactions. Note that the energy diagram illustrated in FIG. 22 is merely a schematic diagram and does not depict the relationships of energies of the reactions exactly.

($H_3^+$ Ion Formation Process)

As shown above, $H_3^+$ ions are mainly produced through the reaction process that is represented by the reaction equation (5). On the other hand, as a reaction that competes with the reaction equation (5), there is the reaction process represented by the reaction equation (6). For the amount of $H_3^+$ ions to increase, at the least, it is necessary that the reaction of the reaction equation (5) occur more often than the reaction of the reaction equation (6) (note that, because there are also other reactions (7), (8), and (9), through which the amount of $H_3^+$ ions is decreased, the amount of $H_3^+$ ions is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ ions in a plasma is decreased.

The amount of increase in the product on the right-hand side (rightmost side) of each reaction equation given above depends on the density of a source material on the left-hand side (leftmost side) of the reaction equation, the rate coefficient of the reaction, and the like. Here, it is experimentally confirmed that, when the kinetic energy of $H_2^+$ ions is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ ions is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to the difference between a potential energy at a potential before the charged particle moves and a potential energy at a potential before the collision. That is, in a situation where a charged particle can transfer a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low.

Even in a situation where the mean free path is short, the kinetic energy of a charged particle is high if the charged particle can gain a high amount of kinetic energy while traveling through the path. That is, it can be said that, even in the situation where the mean free path is short, the kinetic energy of a charged particle is high if the potential difference is large.

This is applied to $H_2^+$ ions. Assuming that an electric field is present as in a plasma generation chamber, the kinetic energy of $H_2^+$ ions is high in a situation where the pressure inside the chamber is low and the kinetic energy of $H_2^+$ ions is low in a situation where the pressure inside the chamber is high. That is, because the reaction of the reaction equation (6) is the main reaction in the situation where the pressure inside the chamber is low, the amount of $H_3^+$ ions tends to be decreased, and because the reaction of the reaction equation (5) is the main reaction in the situation where the pressure inside the chamber is high, the amount of $H_3^+$ tends to be increased. In addition, in a situation where an electric field in a plasma generation region is high, that is, in a situation where the potential difference between given two points is large, the kinetic energy of $H_2^+$ ions is high, and in the opposite situation, the kinetic energy of $H_2^+$ ions is low. That is, because the reaction of the reaction equation (6) is the main reaction in the situation where the electric field is high, the amount of $H_3^+$ ions tends to be decreased, and because the reaction of the reaction equation (5) is the main reaction in a situation where the electric field is low, the amount of $H_3^+$ ions tends to be increased.

(Differences Depending on Ion Source)

Figure 23:
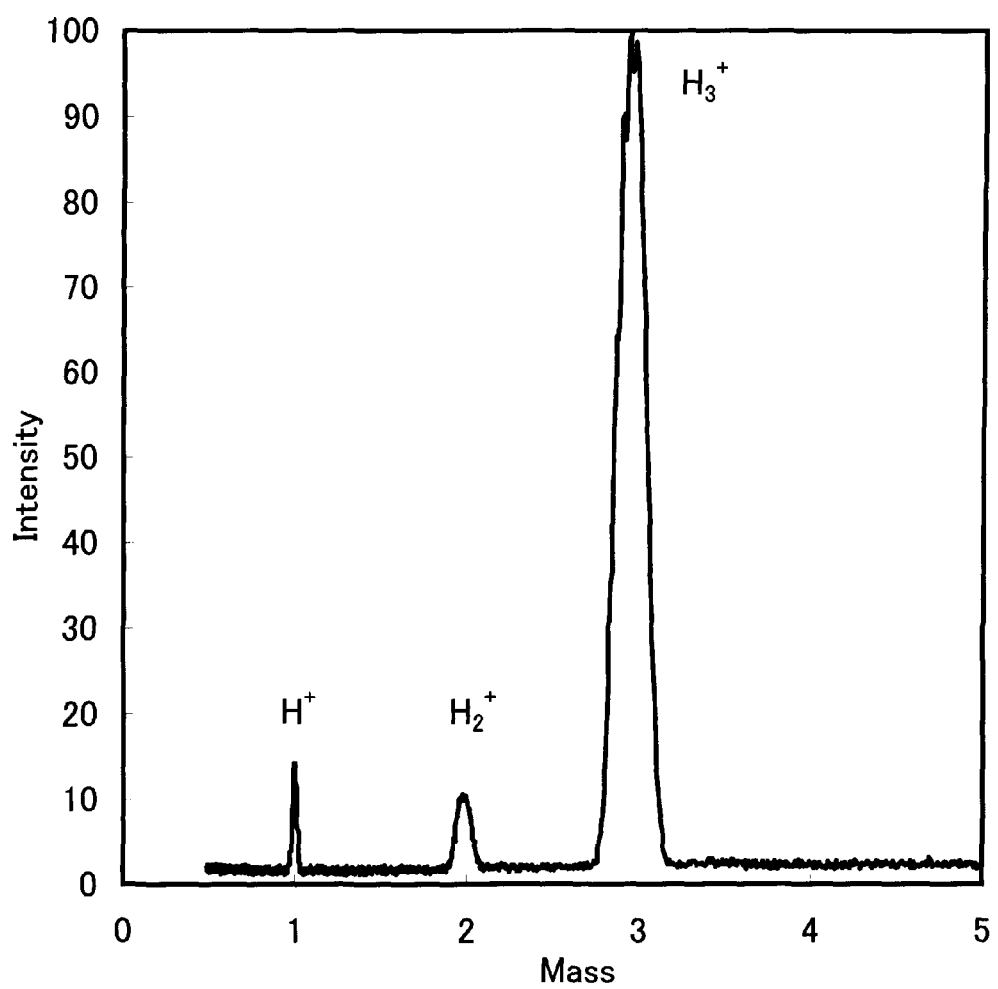
FIG. 23 is a diagram illustrating the results of ion mass spectrometry.

Here, an example, in which the proportions of hydrogen ion species (particularly, the proportion of $H_3^+$ ions) are different, is described. FIG. 23 is a graph illustrating the results of mass spectrometry of ions that are generated from a 100% hydrogen gas (with the pressure of an ion source of $4.7 \times 10^{-2}$ Pa). Note that this mass spectrometry was performed by measurement of ions that were extracted from the ion source. The horizontal axis represents ion mass. In the spectrum, the mass 1 peak, the mass 2 peak, and the mass 3 peak correspond to $H^+$ ions, $H_2^+$ ions, and $H_3^+$ ions, respectively. The vertical axis represents the intensity of the spectrum, which corresponds to the number of ions. In FIG. 23, the number of ions with different masses is expressed as a relative proportion where the number of ions with a mass of 3 is defined as 100. It can be seen from FIG. 23 that the ratio between ion species that are generated from the ion source, i.e., the ratio between $H^+$ ions, $H_2^+$ ions, and $H_3^+$ ions, is about 1:1:8. Note that ions at such a ratio can also be generated by an ion doping apparatus which has a plasma source portion (ion source) that generates a plasma, an extraction electrode that extracts an ion beam from the plasma, and the like.

Figure 24:
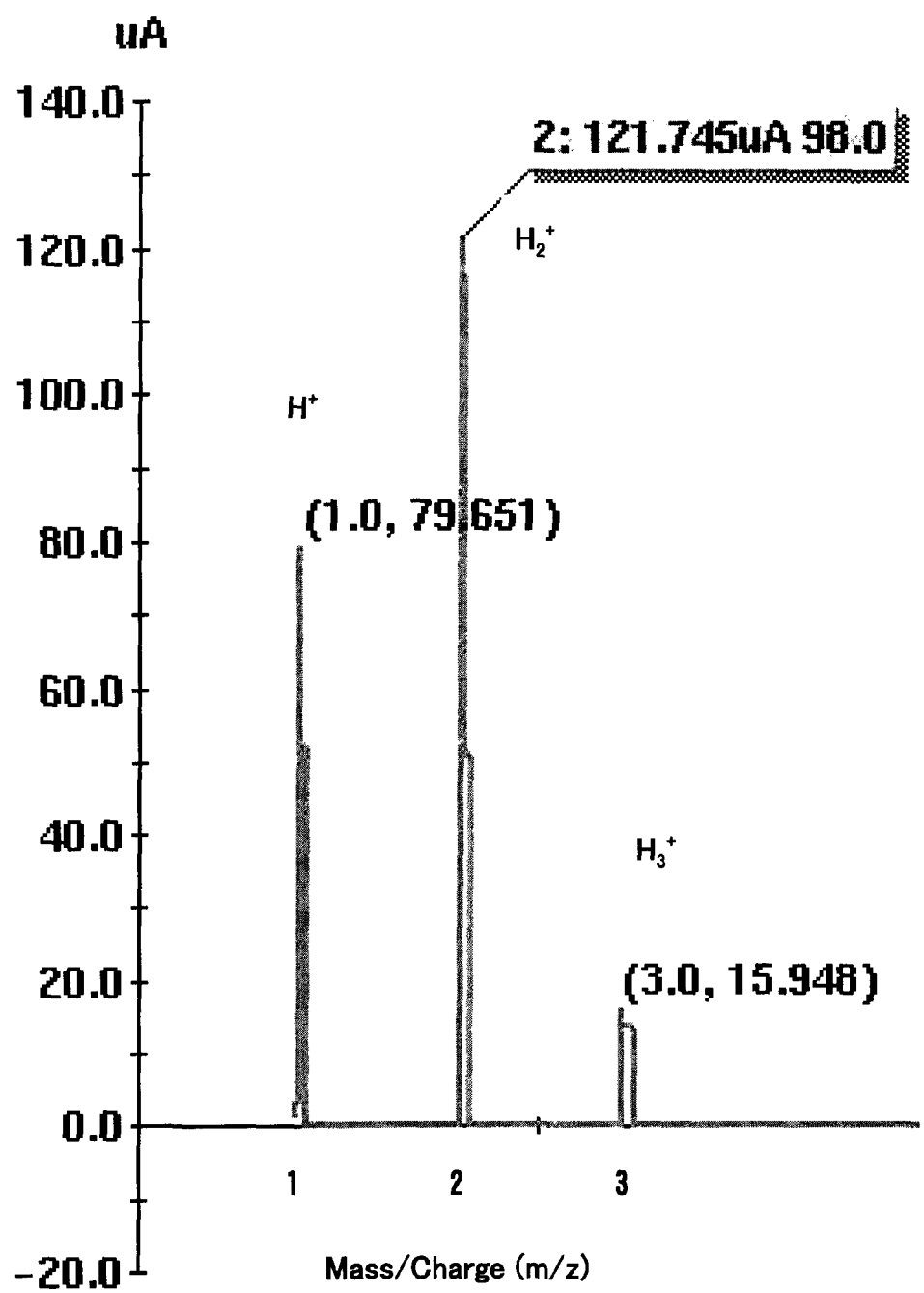
FIG. 24 is a diagram illustrating the results of ion mass spectrometry.

FIG. 24 is a graph illustrating the results of mass spectrometry of ions that are generated from $PH_3$ when an ion source different from that for the case of FIG. 23 is used and the pressure of the ion source is about $3 \times 10^{-3}$ Pa. The results of this mass spectrometry focus on the hydrogen ion species. In addition, the mass spectrometry was performed by measurement of ions that were extracted from the ion source. As in FIG. 23, the horizontal axis represents ion mass, and the mass 1 peak, the mass 2 peak, and the mass 3 peak correspond to $H^+$ ions, $H_2^+$ ions, and $H_3^+$ ions, respectively. The vertical axis represents the intensity of a spectrum corresponding to the number of ions. It can be seen from FIG. 24 that the ratio between ion species in a plasma, i.e., the ratio between $H^+$ ions, $H_2^+$ ions, and $H_3^+$ ions, is about 37:56:7. Note that, although FIG. 24 illustrates the data obtained when the source gas is $PH_3$, the ratio between the hydrogen ion species is about the same when a 100% hydrogen gas is used as a source gas, as well.

In the case of the ion source from which the data illustrated in FIG. 24 is obtained, $H_3^+$ ions, of $H^+$ ions, $H_2^+$ ions, and $H_3^+$ ions, is generated at a proportion of only about 7%. On the other hand, in the case of the ion source from which the data illustrated in FIG. 23 is obtained, the proportion of $H_3^+$ ions can be up to 50% or higher (under the aforementioned conditions, about 80%). This is thought to result from the pressure and electric field inside a chamber, which is clearly illustrated in the above consideration.

($H_3^+$ Ion Irradiation Mechanism)

When a plasma that contains a plurality of kinds of hydrogen ions as illustrated in FIG. 23 is generated and a single-crystalline semiconductor substrate is irradiated with the generated plurality of kinds of ions without any mass separation being performed, the surface of the single-crystalline semiconductor substrate is irradiated with each of $H^+$ ions, $H_2^+$ ions, and $H_3^+$ ions. In order to reproduce the mechanism, from the irradiation with ions to the formation of an ion-introduced region, the following five types of models are considered.

Model 1, where the hydrogen ion species used for irradiation is $H^+$ ions, which are still $H^+$ ions (or H) after the irradiation.

Model 2, where the hydrogen ion species used for irradiation is $H_2^+$ ions, which are still $H_2^+$ ions (or $H_2$) after the irradiation.

Model 3, where the hydrogen ion species used for irradiation is $H_2^+$ ions, which split into two H atoms (or $H^+$ ions) after the irradiation.

Model 4, where the hydrogen ion species used for irradiation is $H_3^+$ ions, which are still $H_3^+$ ions (or $H_3$) after the irradiation.

Model 5, where the hydrogen ion species used for irradiation is $H_3^+$ ions, which split into three H atoms (or $H^+$ ions) after the irradiation.

(Comparison of Simulation Results with Measured Values)

Based on the above models, the irradiation of a silicon substrate with hydrogen ion species was simulated. As simulation software, SRIM (the Stopping and Range of Ions in Matter) was used. The SRIM is simulation software for ion introduction processes by a Monte Carlo method and is an improved version of TRIM (the Transport of Ions in Matter.) Note that, for the calculation, a calculation based on Model 2 was performed with the $H_2^+$ ions replaced by $H^+$ ions that have twice the mass. In addition, a calculation based on Model 4 was performed with the $H_3^+$ ions replaced by $H^+$ ions that have three times the mass. Furthermore, a calculation based on Model 3 was performed with the $H_2^+$ ions replaced by $H^+$ ions that have half the kinetic energy, and a calculation based on Model 5, with the $H_3^+$ ions replaced by $H^+$ ions that have one-third the kinetic energy.

Note that SRIM is software intended for amorphous structures, but SRIM can be applied to cases where irradiation with the hydrogen ion species is performed with high energy at a high dose. This is because the crystal structure of a silicon substrate changes into a non-single-crystal structure due to the collision of the hydrogen ion species with Si atoms.

Figure 25:
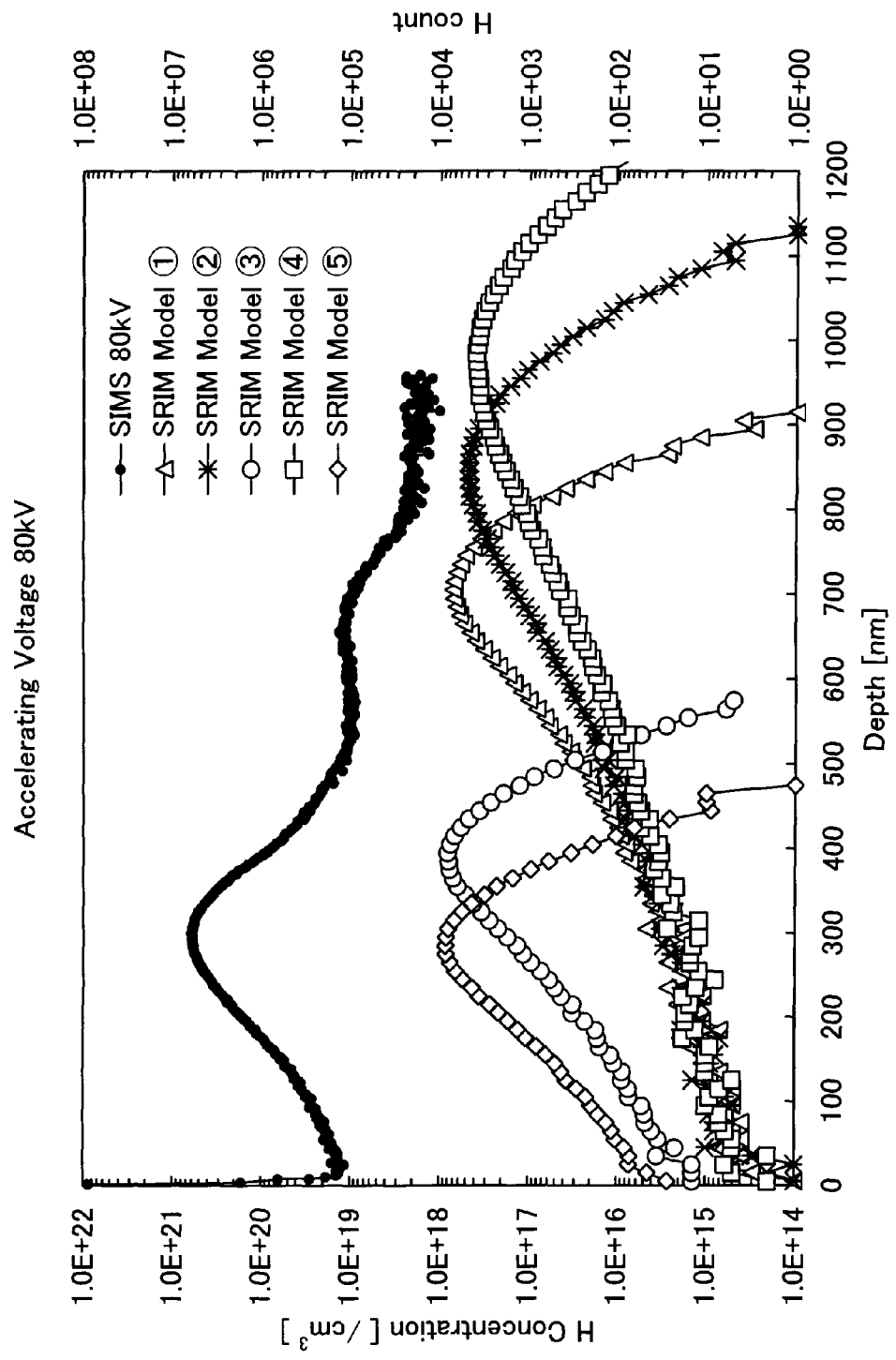
FIG. 25 is a diagram illustrating the profile (measured values and calculated values) of hydrogen in the depth direction when the accelerating voltage is 80 kV.

FIG. 25 illustrates the calculation results obtained when irradiation with the hydrogen ion species (irradiation with 100,000 atoms for H) is performed using Models 1 to 5. FIG. 25 also illustrates the hydrogen concentration (secondary ion mass spectrometry (SIMS) data) in a silicon substrate irradiated with the hydrogen ion species of FIG. 23. The results of calculations performed using Models 1 to 5 are expressed on the vertical axis (right axis) as the number of hydrogen atoms, and the SIMS data is expressed on the vertical axis (left axis) as the density of hydrogen atoms. The horizontal axis represents depth from the surface of a silicon substrate. If the SIMS data, which is measured values, is compared with the calculation results, Models 2 and 4 obviously do not match the peaks of the SIMS data and a peak corresponding to Model 3 cannot be observed in the SIMS data. This illustrates that the contribution of each of Models 2 to 4 is relatively small. Considering that the kinetic energy of ions is on the order of kiloelectron volts whereas the H—H bond energy is only about several electron volts, it is thought that the contribution of each of Models 2 and 4 is small because $H_2^+$ ions and $H_3^+$ ions mostly split into $H^+$ ions or H by colliding with Si atoms.

Figure 26:
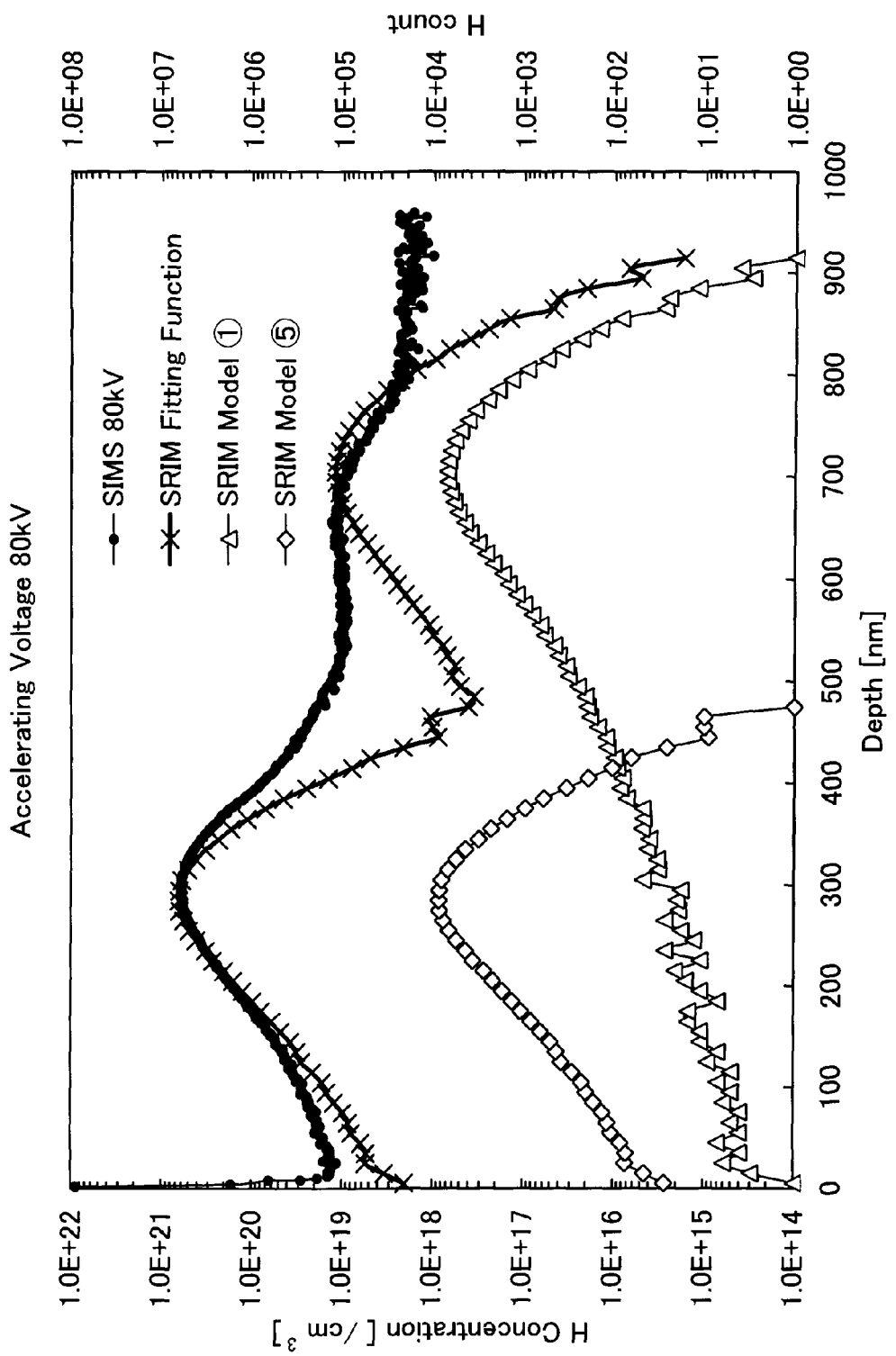
FIG. 26 is a diagram illustrating the profile (measured values, calculated values, and fitting functions) of hydrogen in the depth direction when the accelerating voltage is 80 kV.
Figure 27:
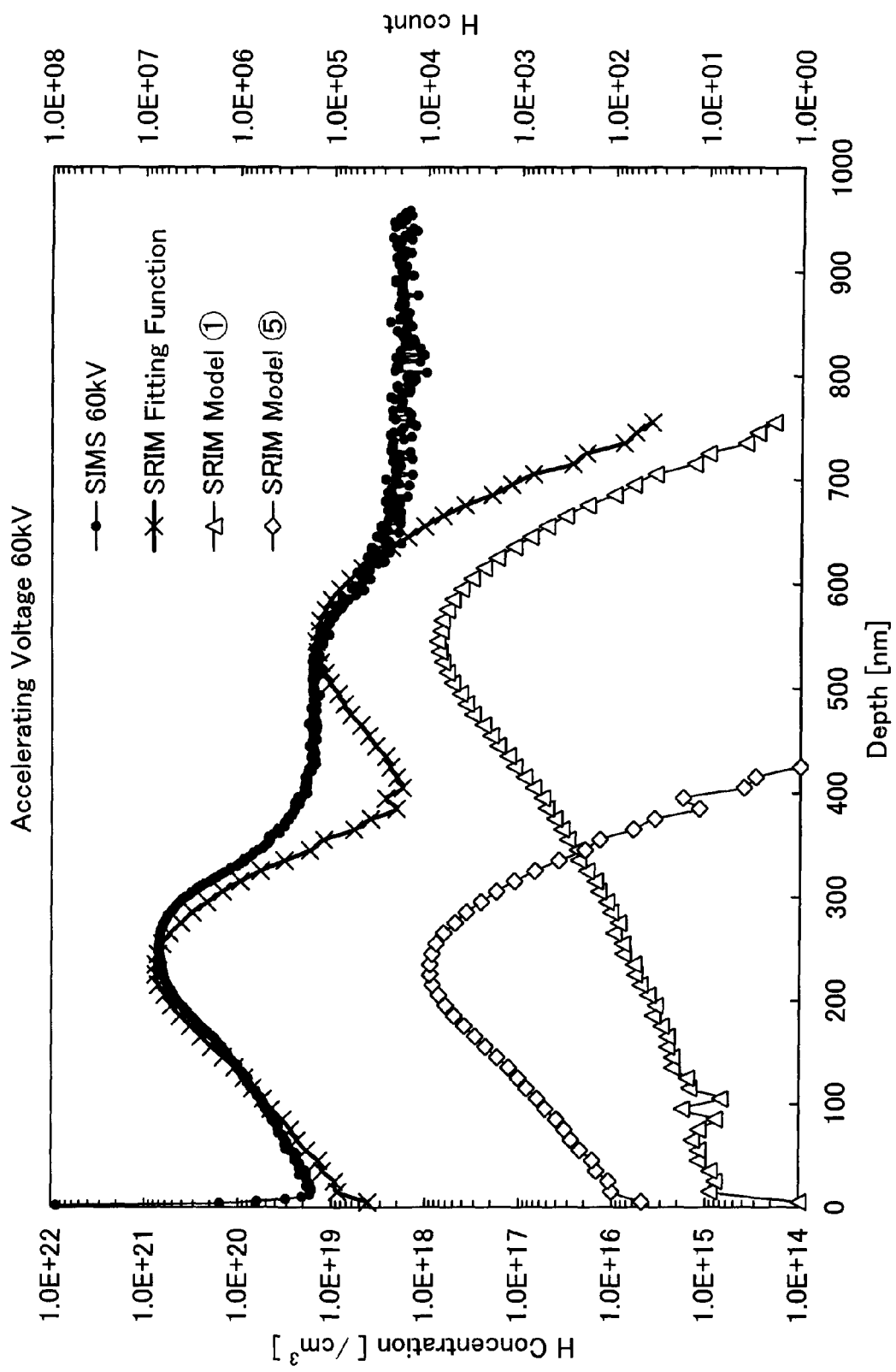
FIG. 27 is a diagram illustrating the profile (measured values, calculated values, and fitting functions) of hydrogen in the depth direction when the accelerating voltage is 60 kV.
Figure 28:
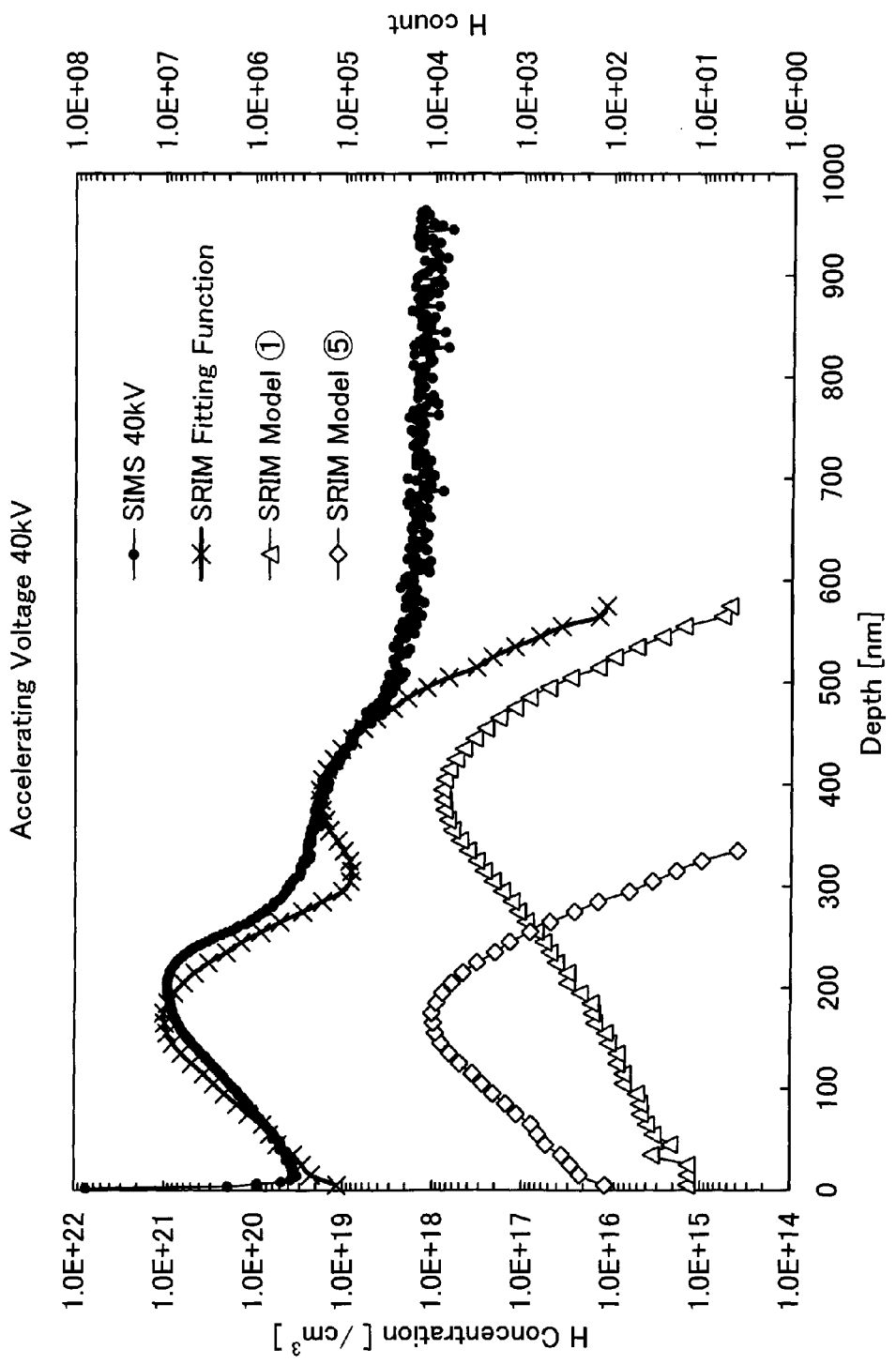
FIG. 28 is a diagram illustrating the profile (measured values, calculated values, and fitting functions) of hydrogen in the depth direction when the accelerating voltage is 40 kV.

Accordingly, Models 2 to 4 will not be considered hereinafter. FIG. 26, FIG. 27, and FIG. 28 each illustrate the calculation results obtained when irradiation with the hydrogen ion species (irradiation with 100,000 atoms for H) is performed using Models 1 and 5. FIG. 26, FIG. 27, and FIG. 28 also each illustrate the hydrogen concentration (SIMS data) in a silicon substrate irradiated with the hydrogen ion species of FIG. 23, and the simulation results fitted to the SIMS data (hereinafter referred to as a fitting function). Here, FIG. 26 illustrates the case where the accelerating voltage is 80 kV; FIG. 27, the case where the accelerating voltage is 60 kV; and FIG. 28, the case where the accelerating voltage is 40 kV. Note that the results of calculations performed using Models 1 and 5 are expressed on the vertical axis (right axis) as the number of hydrogen atoms, and the SIMS data and the fitting function are expressed on the vertical axis (left axis) as the density of hydrogen atoms. The horizontal axis represents depth from the surface of a silicon substrate.

The fitting function is obtained using the calculation formula given below, in consideration of Models 1 and 5. Note that, in the calculation formula, X and Y represent fitting parameters and V represents volume.

(Fitting Function)=$X/V$×(Data of Model 1)+$Y/V$×(Data of Model 5)

In consideration of the ratio between hydrogen ion species used for actual irradiation ($H^+$ ions:$H_2^+$ ions:$H_3^+$ ions is about 1:1:8), the contribution of $H_2^+$ ions (i.e., Model 3) should also be considered; however, Model 3 is excluded from the consideration given here for the following reasons:

Because the amount of hydrogen introduced through the irradiation process represented by Model 3 is lower than that introduced through the irradiation process of Model 5, there is no significant influence even if Model 3 is excluded from the consideration (no peak appears in the SIMS data either).

Model 3, the peak position of which is close to that of Model 5, is likely to be obscured by channeling (movement of atoms due to crystal lattice structure) that occurs in Model 5. That is, it is difficult to estimate fitting parameters for Model 3. This is because this simulation assumes amorphous silicon and the influence due to crystallinity is not considered.

FIG. 29 lists the aforementioned fitting parameters. At any of the accelerating voltages, the ratio of the amount of H introduced according to Model 1 to that introduced according to Model 5 is about 1:42 to 1:45 (the amount of H in Model 5, when the amount of H in Model 1 is defined as 1, is about 42 to 45), and the ratio of the number of hydrogen ions used for irradiation, $H^+$ ions (Model 1) to that of $H_3^+$ ions (Model 5) is about 1:14 to 1:15 (the amount of $H_3^+$ ions in Model 5, when the amount of $H^+$ in Model 1 is defined as 1, is about 14 to 15). Considering that Model 3 is not considered and the calculation assumes amorphous silicon, it can be said that values close to that of the ratio between hydrogen ion species used for actual irradiation ($H^+$ ions:$H_2^+$ ions:$H_3^+$ ions is about 1:1:8) is obtained.

(Effects of Use of $H_3^+$ Ions)

A plurality of benefits resulting from $H_3^+$ ions can be enjoyed by irradiation of a single-crystalline semiconductor substrate with hydrogen ion species with a higher proportion of $H_3^+$ ions as illustrated in FIG. 23. For example, because $H_3^+$ ions split into $H^+$ ions, H, or the like to be introduced into a substrate, ion introduction efficiency can be improved compared with the case of irradiation mainly with $H^+$ ions or $H_2^+$ ions. This leads to an improvement in SOI substrate productivity. In addition, because the kinetic energy of $H^+$ ions or H after $H_3^+$ ions split similarly tends to be low, $H_3^+$ ions are suitable for manufacture of thin semiconductor layers.

Note that it is preferable to use an ion doping apparatus that is capable of irradiation with the hydrogen ion species as illustrated in FIG. 23 in order to efficiently perform irradiation with $H_3^+$ ions. Ion doping apparatuses are inexpensive and excellent for use in large-area treatment. Therefore, by irradiation with $H_3^+$ ions by use of such an ion doping apparatus, significant effects such as an increase in area, a reduction in costs, and an improvement in productivity can be obtained. On the other hand, if first priority is given to irradiation with $H_3^+$ ions, there is no need to interpret the present invention as being limited to the use of an ion irradiation apparatus.

This application is based on Japanese Patent Application serial no. 2007-190987 filed with Japan Patent Office on Jul. 23, 2007, the entire contents of which are hereby incorporated by reference.

What is claimed is:

1. A manufacturing method of an SOI substrate comprising the steps of:
    forming an embrittlement layer in a region at a predetermined depth in a semiconductor substrate;
    forming an insulating layer on a surface of the semiconductor substrate;
    bonding the semiconductor substrate and a supporting substrate with the insulating layer interposed therebetween;
    selectively irradiating the embrittlement layer with a laser beam from a side surface of the semiconductor substrate;
    performing a heat treatment after selectively irradiating the embrittlement layer with the laser beam; and
    after the heat treatment, separating the semiconductor substrate into parts along the embrittlement layer by a physical method to form a semiconductor layer on the insulating layer over the supporting substrate,
    wherein the laser beam is emitted parallel to an interface of the insulating layer and the supporting substrate in the step of irradiating the embitterment layer.

2. The manufacturing method of an SOI substrate according to claim 1, wherein the laser beam is emitted from an XeCl excimer laser, an $Ar^+$ laser, a second harmonic or a third harmonic of a YAG laser, a second harmonic or a third harmonic of a $YVO_4$ laser, or a second harmonic or a third harmonic of a YLF laser.

3. The manufacturing method of an SOI substrate according to claim 1, wherein the embrittlement layer in a peripheral region of the semiconductor substrate is selectively irradiated.

4. The manufacturing method of an SOI substrate according to claim 1, wherein the insulating layer is a stacked structure comprising at least a silicon oxide layer, a nitrogen-containing insulating layer, and a bonding layer.

5. The manufacturing method of an SOI substrate according to claim 1, wherein the insulating layer is a stacked structure comprising at least a thermal oxide film, a nitrogen-containing insulating layer, and a bonding layer.

6. The manufacturing method of an SOI substrate according to claim 1, wherein the physical method for separating the semiconductor wafer is performed while one of the semiconductor substrate or the supporting substrate is fixed by a chuck.

7. A manufacturing method of an SOI substrate comprising the steps of:
- forming an embrittlement layer in a region at a predetermined depth in a semiconductor substrate;
- forming an insulating layer on a surface of the semiconductor substrate;
- bonding the semiconductor substrate and a supporting substrate with the insulating layer interposed therebetween;
- selectively irradiating the embrittlement layer with a laser beam;
- performing a heat treatment after selectively irradiating the embrittlement layer with the laser beam; and
- after the heat treatment, separating the semiconductor substrate into parts along the embrittlement layer by a physical method to form a semiconductor layer on the insulating layer over the supporting substrate,
- wherein the insulating layer includes at least a nitrogen-containing insulating layer, and
- wherein the laser beam is emitted parallel to an interface of the insulating layer and the supporting substrate in the step of irradiating the embitterment layer.

8. The manufacturing method of an SOI substrate according to claim 7, wherein the laser beam is emitted from an XeCl excimer laser, an $Ar^+$ laser, a second harmonic or a third harmonic of a YAG laser, a second harmonic or a third harmonic of a $YVO_4$ laser, or a second harmonic or a third harmonic of a YLF laser.

9. The manufacturing method of an SOI substrate according to claim 7, wherein the embrittlement layer in a peripheral region of the semiconductor substrate is selectively irradiated.

10. The manufacturing method of an SOI substrate according to claim 7, wherein the insulating layer is a stacked structure comprising at least a silicon oxide layer, the nitrogen-containing insulating layer, and a bonding layer.

11. The manufacturing method of an SOI substrate according to claim 7, wherein the insulating layer further comprises at least a thermal oxide film the nitrogen-containing insulating layer, and a bonding layer.

12. The manufacturing method of an SOI substrate according to claim 7, wherein the physical method for separating the semiconductor wafer is performed while one of the semiconductor substrate or the supporting substrate is fixed by a chuck.

* * * * *